United States Patent
Yamada et al.

(10) Patent No.: US 6,267,479 B1
(45) Date of Patent: Jul. 31, 2001

(54) SEMICONDUCTOR DEVICE, AND METHOD FOR MANUFACTURING THE SAME

(75) Inventors: Keiichi Yamada; Hiroshi Kawashima; Keiichi Higashitani, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/241,138

(22) Filed: Feb. 2, 1999

(30) Foreign Application Priority Data

Aug. 25, 1998 (JP) ................................................. 10-239189

(51) Int. Cl.$^7$ ........................ H01L 31/119; H01L 31/113
(52) U.S. Cl. ............................................ 357/392; 257/408
(58) Field of Search ................................ 438/231, 232; 257/204, 206, 285, 392, 408, 286, 336, 338, 369

(56) References Cited

U.S. PATENT DOCUMENTS

| | | | |
|---|---|---|---|
| 5,218,221 | 6/1993 | Okumura | 257/336 |
| 5,472,887 | * 12/1995 | Hutter et al. | 438/231 |
| 5,480,828 | * 1/1996 | Hsu et al. | 438/306 |
| 5,536,957 | 7/1996 | Okumura | 257/336 |
| 5,759,901 | * 6/1998 | Loh et al. | 438/305 |
| 5,858,827 | * 1/1999 | Ono | 438/232 |

FOREIGN PATENT DOCUMENTS

| | | |
|---|---|---|
| 4-88669 | 3/1992 | (JP) . |
| 4-263468 | 9/1992 | (JP) . |
| 6-268162 | 9/1994 | (JP) . |
| 8-204021 | 8/1996 | (JP) . |

* cited by examiner

Primary Examiner—Long Pham
Assistant Examiner—William David Coleman
(74) Attorney, Agent, or Firm—McDermott, Will & Emery

(57) ABSTRACT

There is described a semiconductor device which includes in a single chip a high withstanding voltage transistor and a low withstanding voltage transistor and which imparts each of the transistors with a relevant threshold voltage and a characteristic suitable for retarding hot carriers. Specifically, an impurity profile is imparted to a lightly-doped extension (LDDEX) region formed across a channel region of a low withstanding voltage NMOS transistor, and a different impurity profile is imparted to an LDDEX region formed across a channel region of a high withstanding voltage NMOS transistor. These impurity profiles bring the threshold voltages of the MOS transistors to individual relevant voltages and retard hot carriers in the individual MOS transistors.

5 Claims, 47 Drawing Sheets

STEP30 ~ STEP32

STEP33

STEP34

STEP35

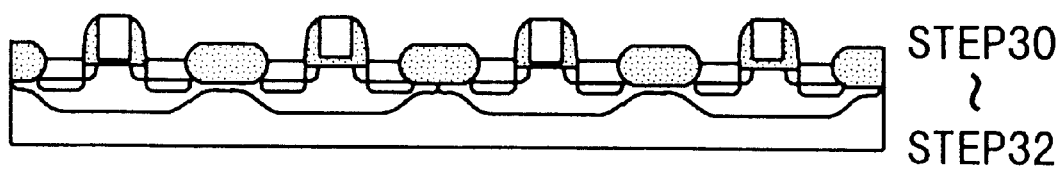
FIG.29A  STEP30 ~ STEP32
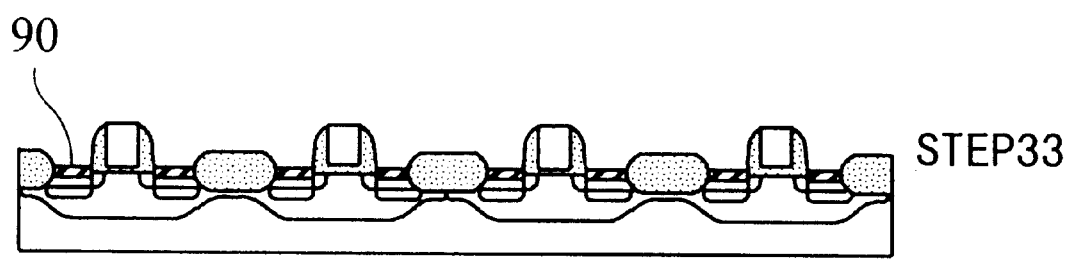
FIG.29B  STEP33
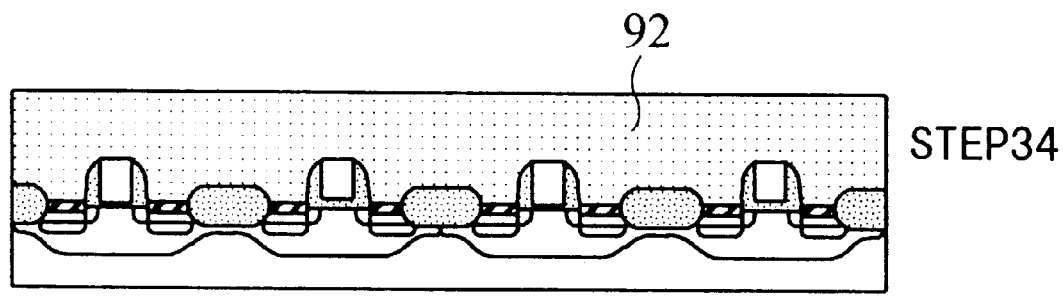
FIG.29C  STEP34
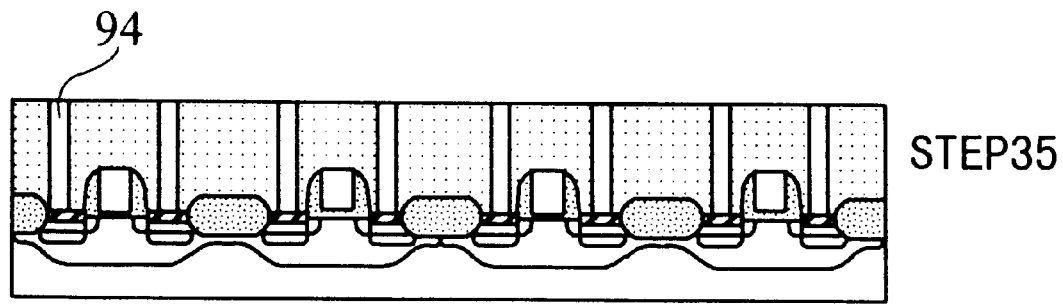
FIG.29D  STEP35

SEMICONDUCTOR DEVICE, AND METHOD FOR MANUFACTURING THE SAME

BACKGROUND OF THE INVENTION

1. Field of the Invention

The present invention relates to a semiconductor device and a method for manufacturing the same, and more particularly, to a semiconductor device having a high withstanding voltage transistor and a low withstanding voltage transistor provided in a single chip and a method for manufacturing the same.

2. Description of the Background Art

FIG. 57 is a cross-sectional view showing a former semiconductor device 10 having a high withstanding voltage transistor and a low withstanding voltage transistor provided in a single chip. The semiconductor device 10 comprises N-channel MOS (NMOS) transistors 12 and 14 and P-channel MOS (PMOS) transistors 16 and 18. The NMOS transistor 12 and the PMOS transistor 16 are low withstanding voltage transistors which are driven at a given low voltage (e.g., 1.8 volts). In contrast, the NMOS transistor 14 and the PMOS transistor 18 are high withstanding voltage transistors which are driven at a given high voltage (e.g., 3.3 volts).

The NMOS 12 and the PMOS driven at the low operating voltage (which are called "low voltage MOS transistor" hereunder) are used for a portion of circuitry which exchanges signals solely within the semiconductor device 10, such as a logic circuit. The low voltage MOS transistors 12 and 14 have thin-film gate oxide films 20 and 22 respectively. In contrast, the NMOS 14 and the PMOS 18 driven at the high operating voltage (which are called "high voltage MOS transistor" hereunder) are used for a portion of the interface between the semiconductor device 10 and an external circuit. The high voltage MOS transistors 14 and 16 have thick-film gate oxide films 24 and 26 respectively.

A p-type channel region 28 is formed below the NMOS transistor 12, and a p-type channel region 30 is formed below the NMOS transistor 14. N-type lightly doped drain extensions (LDDEX) 32 and n-type source/drain (S/D) regions 36 are formed on each side of the channel region 28, and n-type LDDEX regions 34 and n-type source/drain regions 38 are formed on each side of the channel region 30. The LDDEX regions 32 and 34 are formed so as to be lower in impurity concentration than the source/drain regions 36 and 38.

An n-type channel region 40 is formed below the PMOS transistor 16, and an n-type channel region 42 is formed below the PMOS transistor 18. P-type LDDEX regions 44 and p-type source/drain regions 48 are formed on each side of the channel region 40, and p-type LDDEX regions 46 and p-type source/drain regions 50 are formed on each side of the channel region 42. The LDDEX regions 44 and 46 are formed so as to be lower in impurity concentration than the source/drain regions 48 and 50.

In FIG. 57, reference symbol PA-A represents a depthwise impurity profile of the channel region 28 taken along line A—A; PB-B represents a depthwise impurity profile of the channel region 30 taken along line B—B; PC-C represents a depthwise impurity profile of the channel region 40 taken along line C—C; and PD-D represents a depthwise impurity profile of the channel region 42 taken along line D—D. Furthermore, in FIG. 57, reference symbol Pa represents an impurity profile of the LDDEX region 32; Pb represents an impurity profile of the LDDEX region 34; Pc represents an impurity profile of the LDDEX region 44; and Pd represents an impurity profile of the LDDEX region 46. As shown in FIG. 57, in the former semiconductor device 10, the transistors of the same conductivity type have different impurity profiles in the channel regions(i.e., PA-A PB-B and PC-C PD-D) while having identical impurity profiles in the LDDEX regions(i.e., Pa=Pb, and Pc=Pd).

In the semiconductor device 10, an appropriate threshold voltage must be assigned to the low voltage MOS transistors 12 and 16 as well as an another appropriate threshold voltage must be imparted to the high voltage MOS transistors 14 and 18. As mentioned above, in the former semiconductor device 10, the channel regions 28 and 40 of the low voltage MOS transistors 12 and 16 are given impurity profiles different from that of the channel regions 30 and 42 of the high voltage MOS transistors, whereby the threshold voltage required by each transistor is realized.

A method of manufacturing the conventional semiconductor device 10 will now be described by reference to FIGS. 58 through 63.

FIG. 58 is a cross-sectional view showing a substrate 52 of the semiconductor device 10. In FIG. 58, an isolation oxide film 53 is formed on the substrate 52 in order to separate from one another active regions in which transistors are to be formed. The four active regions shown in FIG. 58 are subjected to the following processing, so that the NMOS transistor 12, the NMOS transistor 14, the PMOS transistor 16, and the PMOS transistor 18 are formed in the order from the left side of the drawing. These active regions will be hereinafter referred to respectively as a "low voltage NMOS region 54," a "high voltage NMOS region 56," a "low voltage PMOS region 58," and a "high voltage NMOS region 60."

FIGS. 59A to 59D are cross-sectional views for describing formation of N-type semiconductor islands (N-type islands) 62 and 64 in the respective PMOS regions 58 and 60 on the substrate 52. As shown in FIGS. 59A and 59B, during the process of forming the N-type islands 62 and 64, "P" ions and "As" ions are implanted into both of the PMOS regions 58 and 60 under identical conditions. Subsequently, as shown in FIGS. 59C and 59D, "As" ions are implanted into each of the PMOS regions 58 and 60 in a phased manner under differing conditions. As a result of the foregoing processing operations, two N-type islands 62 and 64 having different impurity profiles are formed on the substrate 52.

FIGS. 60A to 60D are cross-sectional views for describing formation of P-type semiconductor islands (P-type islands) 66 and 68 in the respective NMOS regions 54 and 56 on the substrate 52. As shown in FIGS. 60A and 60B, during the process of forming the P-type islands 66 and 68, "B" ions are implanted into both of the NMOS regions 54 and 56 under identical conditions.

Subsequently, as shown in FIGS. 60C and 60D, "B" ions are implanted into each of the NMOS regions 54 and 56 in a phased manner under differing conditions. As a result of ion implantation, two P-type islands 66 and 68 having different impurity profiles are formed on the substrate 52.

FIGS. 61A to 61C are cross-sectional views for describing formation of lightly-doped drain (LDD) sections in the respective islands 62, 64, 66, and 68. As shown in FIG. 61A, during the process of forming an LDD region, thin-film oxide films 70 and 74 are formed on the surface of the low voltage NMOS regions 54 and the low voltage PMOS region 58 respectively.

Further, a thick-film oxide films 72 and 76 are formed on the surface of the high voltage NMOS region 56 and the high voltage PMOS region 60. Each of the oxide films 70 to 76 are provided with a gate electrode 78.

As shown in FIG. 61B, during the process of forming an LDD region, "As" ions are implanted into the low voltage NMOS region 54 from above the oxide film 70, as well as into the high voltage NMOS region 56 from above the oxide film 72, under identical conditions. As a result of implantation of "As" ions, a channel region 28, which has an impurity profile identical to that of the island 66, is formed below the gate electrode 78 of the NMOS region 54, and a channel region 30, which has an impurity profile identical to that of the island 68, is formed below the gate electrode 78 of the NMOS region 56. Further, LDD sections 80 and 82 having a comparatively lower impurity concentration are formed on each side of the channel region 28 and 30 respectively.

As shown in FIG. 61C, during the process of forming an LDD region, "B" ions are implanted into the low voltage PMOS region 58 from above the oxide film 74, as well as into the high voltage PMOS region 60 from above the oxide film 76, under identical conditions. As a result of implantation of "B" ions, a channel region 40, which has an impurity profile identical to that of the island 62, is formed below the gate electrode 78 of the PMOS region 58, and a channel region 42, which has an impurity profile identical to that of the island 64, is formed below the gate electrode 78 of the PMOS region 60. Further, LDD sections 84 and 86 having a comparatively lower impurity concentration are formed on each side of the channel regions 40 and 42 respectively.

FIGS. 62A to 62C are cross-sectional views for describing formation of a source/drain region 36 in the island 66, a source/drain region 38 in the island 68, a source/drain region 48 in an island 62, and a source/drain region 50 in an island 64. As shown in FIG. 62A, a sidewall 88 is formed on each of the oxide films 70, 72, 74, and 76 so as to surround the respective gate electrode 78.

Subsequently, as shown in FIG. 62B, during the process of forming an LDD region, "As" ions are implanted into the low voltage NMOS region 54 from above the oxide film 70, as well as into the high voltage NMOS region 56 from above the oxide film 72, under identical conditions. As a result of ion implantation, the LDDEX regions 32, which have the impurity profile of the LDD region 80 (see FIG. 61B), are formed below the sidewall 88 of the NMOS region 54, and the LDDEX regions 34, which have the impurity profile of the LDD region 82 (see FIG. 61B), are formed below the sidewall 88 of the NMOS region 56. Further, the source/drain regions 36, whose impurity concentration is higher than that of the LDDEX region 32, are formed outside of the LDDEX regions 32, and the source/drain regions 38, whose impurity concentration is higher than that of the LDDEX regions 34, are formed outside of the LDDEX regions 34.

As shown in FIG. 62C, during the process of forming an LDD region, "B" ions are implanted into the low voltage PMOS region 58 from above the oxide film 74, as well as into the high voltage PMOS region 60 from above the oxide film 76, under identical conditions. As a result of ion implantation, the LDDEX regions 44, which have the impurity profile of the LDD region 84 (see FIG. 61C), are formed below the sidewall 88 of the PMOS region 58, and the LDDEX regions 46, which have the impurity profile of the LDD region 86, are formed below the sidewall 88 of the PMOS regions 60. Further, the source/drain regions 48, whose impurity concentration is higher than that of the LDDEX regions 44, are formed outside of the LDDEX regions 44, and the source/drain regions 50, whose impurity concentration is higher than that of the LDDEX regions 46, are formed outside of the LDDEX regions 46.

As mentioned above, during the process of manufacturing the former semiconductor device 10, the LDDEX region 32 of the low voltage NMOS transistor 12 and the LDDEX region 34 of the high voltage NMOS transistor 14 are formed under identical conditions. Likewise, the LDDEX region 44 of the low voltage PMOS transistor 16 and the LDDEX region 34 of the high voltage PMOS transistor 18 are formed under identical conditions.

Further, the source/drain region 36 of the low voltage NMOS transistor 12 and the source/drain region 38 of the high voltage NMOS transistor 14 are manufactured under identical conditions, while the source/drain region 48 of the low voltage PMOS transistor 16 and the source/drain region 50 of the high voltage PMOS transistor 18 are manufactured under identical conditions. For these reasons, the LDDEX regions 32, 34, 44, and 46 and the source/drain regions 36, 38, 48, and 50 of the former semiconductor device 10 can be formed within comparatively simple processes.

FIGS. 63A to 63D are cross-sectional views for describing the details of another processing operation performed during the course of manufacturing the semiconductor device 10. As shown in FIG. 63A, when the source/drain regions 36, 38, 48, and 50 are formed in the manner as mentioned above, the oxide films are removed from the individual source/drain regions. Subsequently, as shown in FIG. 63B, a salicide layer 90 (which is a silicide layer made by a known self aligning manner) is formed on the surface of each of the source/drain regions 36, 38, 48, and 50. As shown in FIG. 63C, an oxide film 92 is formed on the substrate 52. Further, as shown in FIG. 63D, contact holes 94 are formed within the oxide film 92 so as to communicate with the surface of the silicide layer 90. Interior surface of each contact hole 94 is provided with contact, and a metal wiring layer is formed on the contact, whereby the semiconductor device 10 shown in FIG. 57 is manufactured.

The aforementioned method for manufacturing the semiconductor device 10 enables independent control of the impurity profile of the island 66 of the low voltage NMOS region 54 and the impurity profile of the island 68 of the high voltage NMOS region 56. The impurity profile of the island 66 is reflected in the channel region 28 of the low voltage NMOS transistor 12, and the impurity profile of the island 68 is reflected in the channel region 30 of the high voltage NMOS transistor 14. Accordingly, the former manufacturing method enables to assign relevant threshold voltages to each of the low and high voltage NMOS transistors 12 and 14, by appropriately controlling the impurity profiles of the islands. Similarly, the former manufacturing method enables to set the threshold voltages of the low and high PMOS transistors 16 and 18 to appropriate values respectively.

As a semiconductor device becomes progressively miniaturized, a channel of a MOS transistor becomes progressively shortened. If the channel of the MOS transistor is shortened, a strong electric field is apt to arise in the vicinity of a boundary area between the channel region and the source/drain region, whereby hot carriers are more likely to arise in the channel region. If the hot carriers that develop in the channel region migrate into the gate oxide film, the durability of the gate oxide film is deteriorated. To ensure sufficient durability of the gate oxide film within a miniaturized semiconductor device, an impurity profile in the vicinity of the end of the source/drain region must be accurately optimized for an individual MOS transistor.

Under the method of manufacturing the conventional semiconductor device 10, the LDD regions 80 and 82 of the low voltage MOS transistors 12 and 16 and the LDD regions 84 and 86 of the high voltage MOS transistors 14 and 18 are supplied with impurity ions under identical conditions. For this reason, it is impossible to independently control the impurity profiles of the LDDEX regions 32 and 44 of the low voltage MOS transistors 12 and 16 and that of the LDDEX regions 34 and 46 of the high voltage MOS transistors 14 and 18 by using the former manufacturing method. Consequently, the former manufacturing method cannot provide optimum impurity profiles for restraining hot carriers to both the low voltage MOS transistors 12 and 16 and the high voltage MOS transistors 14 and 18.

SUMMARY OF THE INVENTION

The present invention has been conceived to solve the previously-mentioned problems, and a general object of the present invention is to provide a novel and useful semiconductor device and method for manufacturing the same.

A more specific object of the present invention is to provide a semiconductor device in which a plurality of transistors having different withstanding voltages have desired threshold voltages and impurity profiles optimized for retarding hot carriers.

The above objects of the present invention are achieved by a semiconductor device containing in a single chip a low withstanding voltage MOS transistor and a high withstanding voltage MOS transistor. The low withstanding voltage MOS transistor may includes a first gate oxide film having a first thickness, a first channel region formed below the first gate oxide film, and a first source/drain region formed across the first channel region. The high withstanding voltage MOS transistor may includes a second gate oxide film having a second thickness which is greater than the first thickness, a second channel region formed below the second gate oxide film, and a second source/drain region formed across the second channel region. The first channel region side end of the first source/drain region has an impurity profile differing from that of the second channel region side end of the second source/drain region. The first channel region side end of the first source/drain region has a junction depth of 1 $\mu$m or less. The second channel region side end of the second source/drain region have a junction end of 1 $\mu$m or less.

Another object of the present invention is to provide a method suitable for manufacturing the semiconductor device mentioned above.

The above objects of the present invention are achieved by a method of manufacturing a semiconductor device containing in a single chip a low withstanding voltage MOS transistor and a high withstanding voltage MOS transistor. The method may includes a step of forming, on the surface of a substrate, a low withstanding voltage MOS region where the low withstanding voltage MOS transistor is to be formed and a high withstanding voltage MOS region where the high withstanding voltage MOS transistor is to be formed. The method may includes a step for forming a first gate oxide film having a first thickness in a portion of the low withstanding voltage MOS region. The method may includes a step for forming a second gate oxide film having a second thickness greater than the first thickness in a portion of the high withstanding voltage MOS region. The method also may includes a step for implanting impurities into the low withstanding voltage MOS region from above the first gate oxide film under a first set of conditions in such a way that a first channel region is formed below the first gate oxide film and that a first source/drain region is formed across the first channel region so as to form the PN junction of a depth of lpm or less. The method further may includes a step for implanting impurities into the high withstanding voltage MOS region from above the second gate oxide film under a second set of conditions in such a way that a second channel region is formed below the second gate oxide film and that a second source/drain region is formed across the second channel region so as to form the PN junction of a depth of 1 $\mu$m or less.

Other objects and further features of the present invention will be apparent from the following detailed description when read in conjunction with the accompanying drawings.

BRIEF DESCRIPTION OF THE DRAWINGS

FIGS. 29A through 29D are sectional views for describing procedures of steps 30 through 35 for manufacturing the semiconductor device shown in FIG. 21;

DESCRIPTION OF THE PREFERRED EMBODIMENTS

Figure 1:
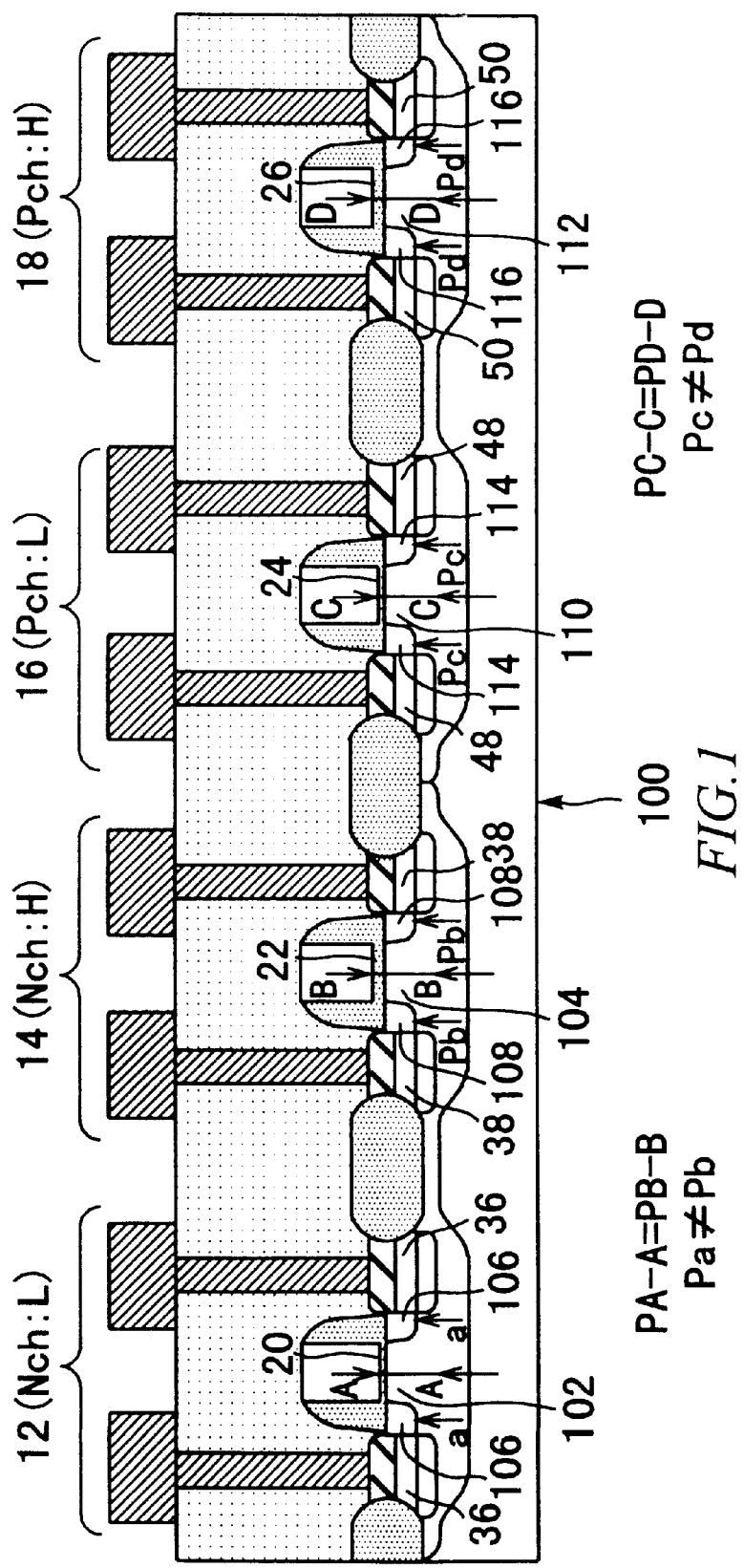
FIG. 1 is a sectional view of a semiconductor device practiced as a first embodiment of the present invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIG. 1 is a cross-sectional view showing a semiconductor device 100 according to a first embodiment of the present invention. The semiconductor device 100 according to the first embodiment comprises in a single chip an N-channel MOS transistor 12 having a low gate withstanding voltage (low voltage NMOS transistor), a P-channel MOS transistor 16 having a low gate withstanding voltage (low voltage PMOS transistor), an N-channel MOS transistor 14 having a high gate withstanding voltage (high voltage NMOS transistor), and a P-channel MOS transistor 18 having a high gate withstanding voltage (high voltage PMOS transistor).

The low voltage NMOS transistor 12 and the low voltage PMOS transistor 16 (hereinafter referred to simply as "low voltage MOS transistors 12 and 16") are used as a portion of circuitry which exchanges signals solely within the semiconductor device 100, such as a logic circuit incorporated into the semiconductor device 100. The low voltage MOS transistors 12 and 16 are driven at a given low voltage (e.g., 1.8 volts). The low voltage MOS transistors 12 and 16 have thin-film gate oxide films 20 and 24 (having a thickness of 3.0 nm) respectively. The low voltage MOS transistors 12 and 16 are required to have sufficient current drive capacity to enable high-speed operations as well as to be sufficiently able to reduce the amount of leakage current when the transistors are in an off state.

The high voltage NMOS transistor 14 and the high voltage PMOS transistor 18 (hereinafter referred to simply as "high voltage MOS transistors 14 and 18") are used illustratively as a portion of an interface between the semiconductor device 100 and an external circuit. The high voltage MOS transistors 14 and 18 are driven at a given high voltage (e.g., 3.3 volts) and hence have a high withstanding voltage. The high voltage MOS transistors 14 and 18 have thick-film gate oxide films 22 and 6 (having a thickness of 7.5 nm) respectively.

A p-type channel region 102 is formed below the gate oxide film 20 of the NMOS transistor 12 while a p-type channel region 104 is formed below the gate oxide film 22 of the NMOS transistor 14. N-type lightly doped drain extension (LDDEX) regions 106 and N-type source/drain (S/D) regions 36 are formed on each side of the channel region 102. Likewise, N-type LDDEX regions 108 and N-type source/drain regions 38 are formed on each side of the channel region 104. The LDDEX regions 106 and 108 are formed so as to be lower in impurity concentration than the source/drain regions 36 and 38.

Below the gate oxide films 24 and 26 of the PMOS transistors 16 and 18 are an n-type channel regions 110 and 112. P-type LDDEX regions 114 and P-type source/drain regions 48 are formed on each side of the channel region 110 whereas on each side of the channel region 112 are P-type LDDEX regions 116 and P-type source/drain regions 50. The LDDEX regions 114 and 116 have a lower impurity concentration than that of the source/drain regions 48 and 50.

In FIG. 1, reference symbols PA-A, PB-B, PC-C, and PD-D represents depthwise impurity profiles of the channel regions 102, 104, 110, and 112 taken along lines A—A, B—B, C—C, and D—D, respectively. Further, reference symbol Pa, Pb, Pc, and Pd shown in FIG. 1 represent impurity profiles of the LDDEX regions 106, 108, 114, and 116, respectively. As shown in FIG. 1, in the semiconductor device 100 according to the first embodiment, the transistors of the same conductivity type have identical impurity profiles in the channel regions (i.e., PA-A=PB-B and PC-C=PD-D) whereas having different impurity profiles in the LDDEX regions (i.e., Pa Pb, and Pc Pd).

In the semiconductor device 100, an appropriate threshold voltage must be assigned to the low voltage MOS transistors 12 and 16 as well as an another appropriate threshold voltage must be imparted to the high voltage MOS transistors 14 and 18. As mentioned above, in the semiconductor device 100 according to the first embodiment, the LDDEX regions 106 and 114 of the low voltage MOS transistors 12 and 16 are given different impurity profiles are given impurity profiles which are respectively different from that of the LDDEX regions 108 and 116 of the high voltage MOS transistors 14 and 18, whereby the threshold voltage required by each transistor is realized.

The NMOS transistors 12 and 14 and the PMOS transistors 16 and 18 of the first embodiment are miniaturized to such an extent that impurity profiles in the vicinity of the each end of the channel regions 102, 104, 110, and 112 must be optimized for the purpose of retardation of hot carriers. In order to ensure the stable characteristics of the thus-miniaturized MOS transistors 12, 14, 16, and 18, impurities contained in the LDDEX regions 106, 108, 114, and 116 must be prevented from spreading excessively into the channel regions 102, 104, 110, and 112.

So long as the depth of the PN junction in each of the LDDEX regions 106, 108, 114, and 116 is set to a value of 1 μm or less, there can be effectively prevented the spreading of impurities contained in the LDDEX regions 106, 108, 114, and 116 to the channel regions 102, 104, 110, and 112. In the first embodiment, the depth of the PN junction in each of the LDDEX regions 106, 108, 114, and 116 is set to a value of 1 μm or less.

The semiconductor device 100 practiced as the first embodiment, therefore, enable to impart the stable characteristics to the MOS transistors 12, 14, 16, and 18.

Now a description will be given of a method for manufacturing the semiconductor device 100 according to the first embodiment by reference to FIGS. 2 through 9.

Figure 2:
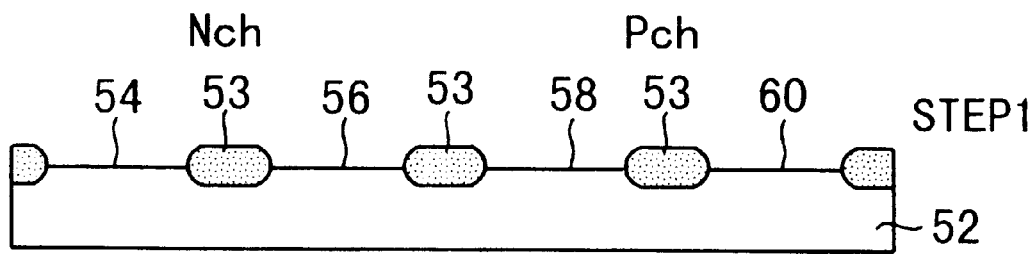
FIG. 2 is a sectional view for describing a procedure of step 1 for manufacturing the semiconductor device shown in FIG. 1.

FIG. 2 is a cross-sectional view showing a substrate 52 of the semiconductor device 100. As shown in FIG. 2, an isolation oxide film 53 is formed on the substrate 52 to a thickness of 300 nm (step 1). The surface area of the substrate 52 is separated by the isolation oxide film 53 into a low voltage NMOS region 54, a high voltage NMOS region 56, a low voltage PMOS region 58, and a high voltage PMOS region 60. Through processing, which will be described later, the regions 54, 56, 58, and 60 are provided with the low voltage NMOS transistor 12, the high voltage NMOS transistor 14, the low voltage PMOS transistor 16 and the high voltage PMOS transistor 18, respectively.

Figure 3A:
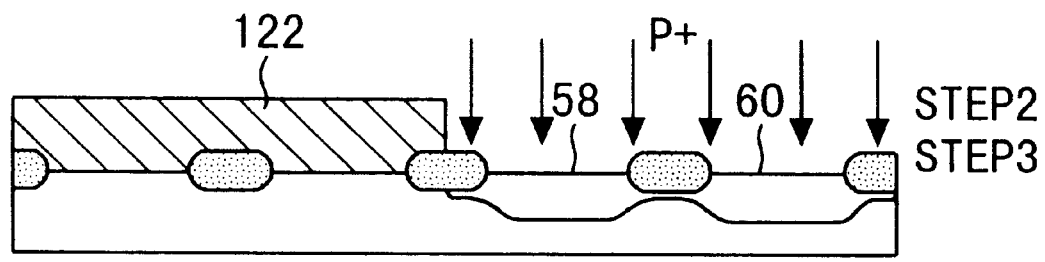
FIGS. 3A and 3B are sectional views for describing procedures of steps 2 through 4 for manufacturing the semiconductor device shown in FIG. 1.
Figure 3B:
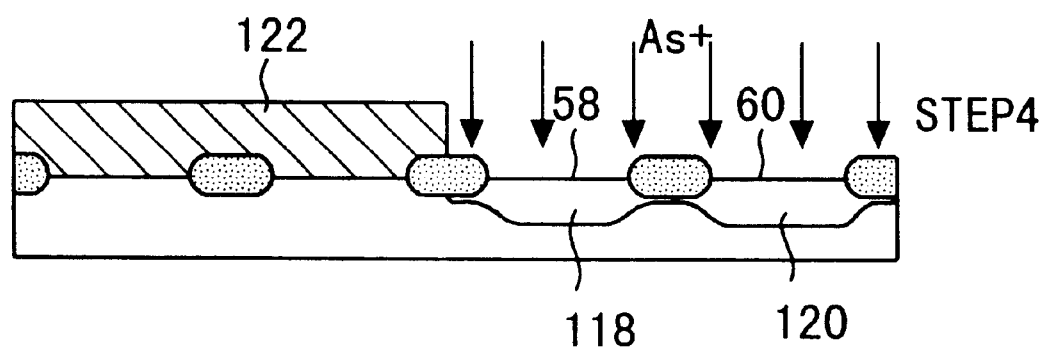

FIGS. 3A and 3B are cross-sectional views for describing formation of N-type semiconductor islands (N-type islands) 118 and 120 in the PMOS regions 58 and 50 of the substrate 52.

As shown in FIG. 3A, during the process of forming the N-type islands 118 and 120, a resist pattern 122 is formed on the substrate 52 by means of photolithography such that an opening of the resist pattern 122 lies on the PMOS regions 58 and 60 (step 2).

Next, "P" ions are implanted into the PMOS regions 58 and 60 of the substrate 52 at an energy of 360keV and a dose of $6 \times 10^{12}$ions/cm$^2$ while the resist pattern 122 is used as a mask (step 3).

As shown in FIG. 3B, during the process of forming the N-type islands 118 and 120, "As" ions are also implanted into the PMOS regions 58 and 60 of the substrate 52 while the resist pattern 122 is used as a mask. "As" ions are implanted at an energy of 140 keV and a dose of $9 \times 10^{12}$ions/cm$^2$ (step 4).

Through the foregoing processing, the N-type island 118 having a predetermined impurity profile is formed within the low voltage PMOS region 58, and the N-type island 120, which has an identical predetermined impurity profile, is formed within the high voltage PMOS region 60.

Figure 4A:
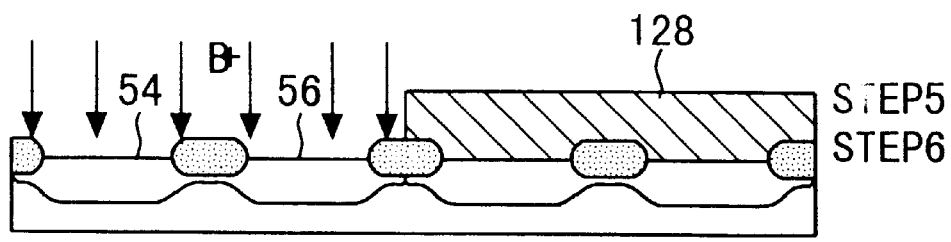
FIGS. 4A through 4C are sectional views for describing procedures of steps 5 through 8 for manufacturing the semiconductor device shown in FIG. 1.
Figure 4B:
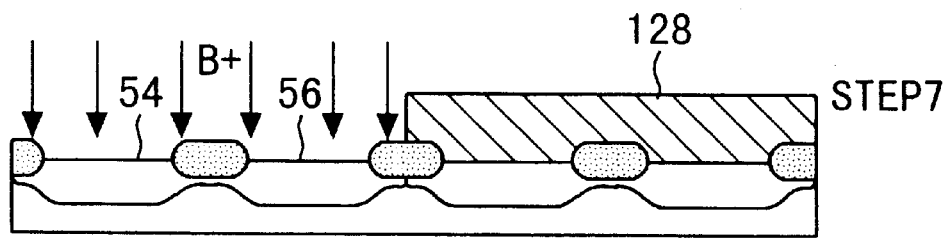
Figure 4C:
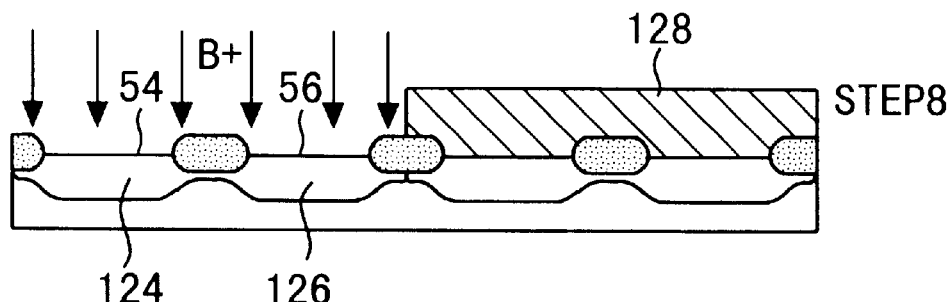

FIGS. 4A to 4C are cross-sectional views for describing formation of P-type semiconductor islands (P-type islands) 124 and 126 in the NMOS regions 54 and 56 of the substrate 52.

During the process of forming the P-type islands 124 and 126, as shown in FIG. 3A, a resist pattern 128 having an opening on the NMOS regions 54 and 56 is formed on the substrate 52 by means of photolithography (step 5). "B" ions are implanted into the NMOS regions 54 and 56 of the substrate 52 while a resist pattern 128 is used as a mask (ion implantation in the first phase). The first phase of ion implantation is performed at an energy of 250 keV and a dose of $3 \times 10^{12}$ions/cm$^2$ (step 6).

As shown in FIGS. 4B and 4C, during the process of forming the P-type islands 124 and 126, second and third phases of implantation of "B" ions into the NMOS regions 54 and 56 are executed (steps 7 and 8). The second phase of ion implantation is performed at an energy of 140 keV and a dose of $3 \times 10^2$ions/cm$^2$ (step 7). The third phase of ion implantation is performed at an energy of 50 keV and a dose of $9 \times 10^2$ions/cm$^2$.

Through the foregoing processing, the P-type island 124 having a predetermined impurity profile is formed within the low voltage NMOS region 54, while the P-type island 126, which has an identical predetermined impurity profile, is formed within the high voltage PMOS region 56.

Figure 5:
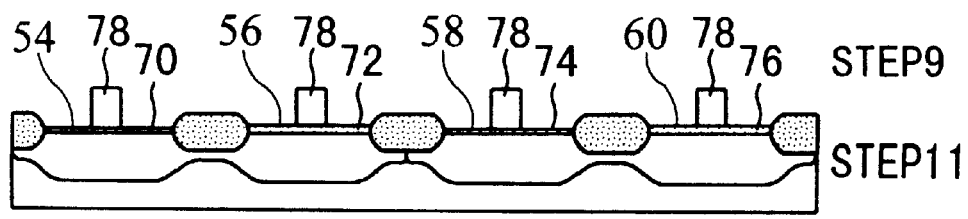
FIG. 5 is a sectional view for describing procedures of step 9 through 11 for manufacturing the semiconductor device shown in FIG. 1.

FIG. 5 is a cross-sectional view for describing formation of gate structures of a MOS transistor.

During the process of forming gate structures, the resist pattern 128 is removed at first(step 9).

Oxide films 72 and 76 with a thickness of about 7.5 nm are provided on the surface of the high voltage regions 56 and 60 by means of thermal oxidation. Similarly, oxide films 70 and 74 having a thickness of about 3.0 nm are formed on the surface of the low voltage regions 54 and 56 (step 10).

Subsequently, polysilicon is deposited on the oxide films 70, 72, 74, and 76 and is patterned, thereby gate electrodes 78 are formed in each regions 54, 56, 58, and 60 (step 11).

FIGS. 6A through 6D are cross-sectional views for describing formation of a lightly-doped drain (LDD) regions in the P-type islands 124 and 126 within the NMOS regions 54 and 56.

Figure 6A:
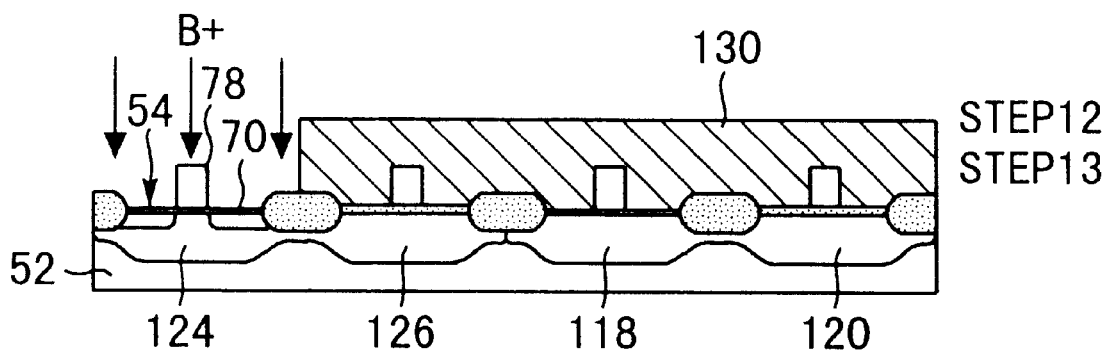
FIGS. 6A through 6D are sectional views for describing procedures of steps 12 through 17 for manufacturing the semiconductor device shown in FIG. 1.

As shown in FIG. 6A, during the process of forming an LDD region in an NMOS region, a resist pattern 130 is formed on the substrate 52 by means of photolithography in such a way that an opening of the resist pattern 130 is situated on the low voltage NMOS region 54 (step 12). "B" ions are implanted into the low voltage NMOS region 54 while the resist pattern 130 is used as a mask. "B" ions are implanted into the substrate 52 at an angle of 45° relative to an imaginary line perpendicular to the substrate 52 with an energy of 15 keV and a dose of $2 \times 10^{13}$ions/cm$^2$ (step 13).

Figure 6B:
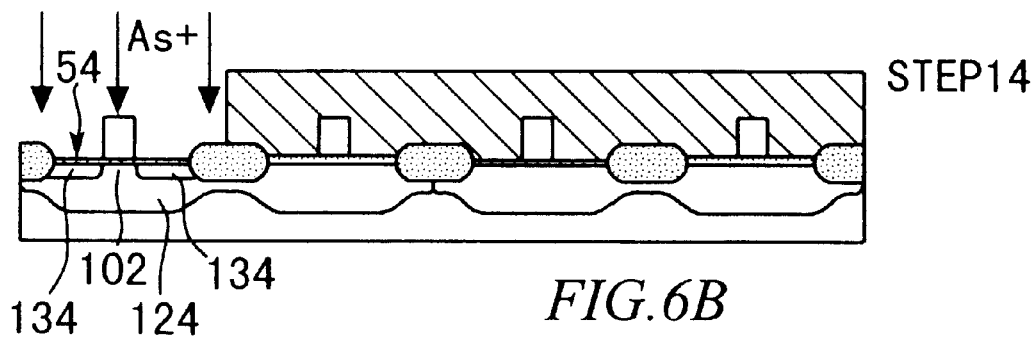

As shown in FIG. 6B, "As" ions are also implanted into the low voltage NMOS region 54 at an energy of 15 keV and a dose of $1 \times 10^{14}$ions/cm$^2$ (step 14).

Through the foregoing processing, the channel region 102, which has an impurity profile identical to that of the P-type island 124, is formed below the gate electrode 78 in the low voltage NMOS region 54. Further, on each side of the channel region 102 there is formed an LDD region 134 which has a desired impurity profile and includes a shallow pocket in which "B" ions are dispersed in a predetermined profile. The previously-described ion implantation conditions makes the junction depth of the LDD region 134 to be 1 $\mu$m or less.

Figure 6C:
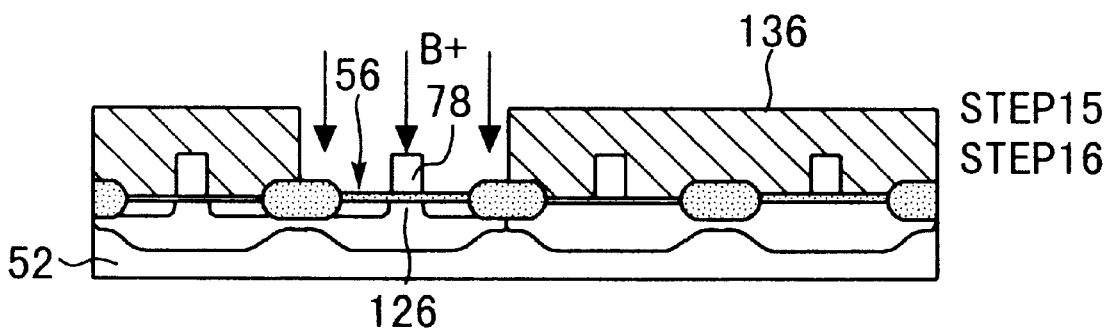

As shown in FIG. 6C, during the process of forming an LDD region in an NMOS region, a resist pattern 136 having an opening on the high voltage NMOS region 56 is formed on the substrate 52 by means of photolithography (step 15). "B" ions are implanted into the high voltage NMOS region 56 while the resist pattern 136 is used as a mask. In this step, "B" ions are implanted into the substrate 52 at an angle of 45° relative to an imaginary line perpendicular to the substrate 52 with an energy of 14 keV and a dose of $3 \times 10^{13}$ions/cm$^2$ (step 16).

Figure 6D:
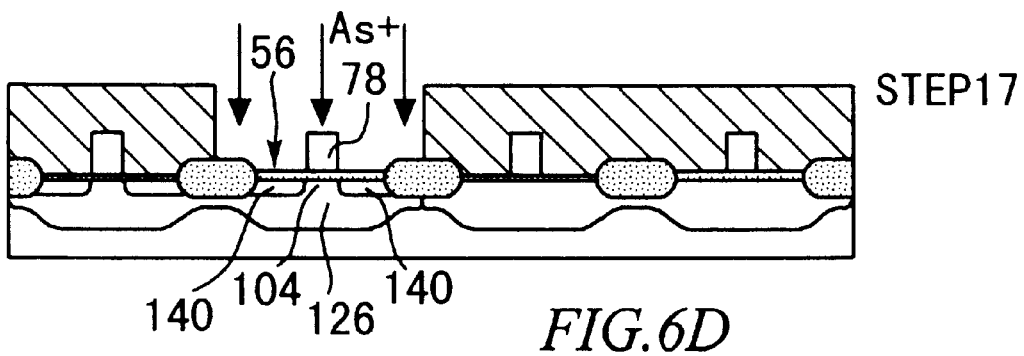

As shown in FIG. 6D, "As" ions are also implanted into the high voltage NMOS region 56 at an energy of 10 keV and a dose of $5 \times 10^4$ions/cm$^2$ (step 17).

Through the foregoing processing, the channel region 104, which has an impurity profile identical to that of the P-type island 126, is formed below the gate electrode 78 in the high voltage NMOS region 56. Further, on each side of the channel region 102 there is formed an LDD region 134 which has a desired impurity profile and a shallow pocket of "B" ions. The previously-described ion implantation conditions makes the junction depth of the LDD region 140 to be 1 $\mu$m or less.

As mentioned above, the manufacturing method according to the first embodiment forms the LDD region 134 of the low voltage NMOS region 54 and the LDD region 140 of the high voltage NMOS region 56 under different ion implantation conditions respectively. Therefore, the first embodiment enables to impart a desired impurity profile to the LDD region 134 in the low voltage NMOS region 54, while giving another desired impurity profiles to the LDD region 140 in the high voltage NMOS region 56.

FIGS. 7A through 7D are cross-sectional views for describing formation of a LDD regions in the N-type islands 118 and 120 within the PMOS regions 58 and 60.

Figure 7A:
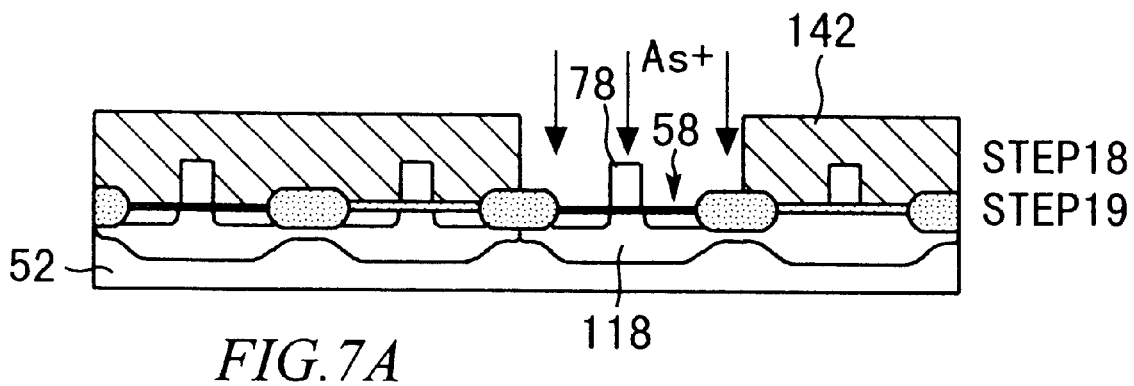
FIGS. 7A through 7D are sectional views for describing procedures of steps 18 through 23 for manufacturing the semiconductor device shown in FIG. 1.

As shown in FIG. 7A, during the process of forming an LDD region in an PMOS region, a resist pattern 142 is formed on the substrate 52 by means of photolithography in such a way that an opening of the resist pattern 142 is situated on the low voltage PMOS region 58 (step 18).

"As" ions are implanted into the low voltage PMOS region 58 while the resist pattern 142 is used as a mask. "As" ions are implanted into the substrate 52 at an angle of 45° relative to an imaginary line perpendicular to the substrate 52 with an energy of 100 keV and a dose of $1 \times 10^{13}$ions/cm$^2$ (step 19).

Figure 7B:
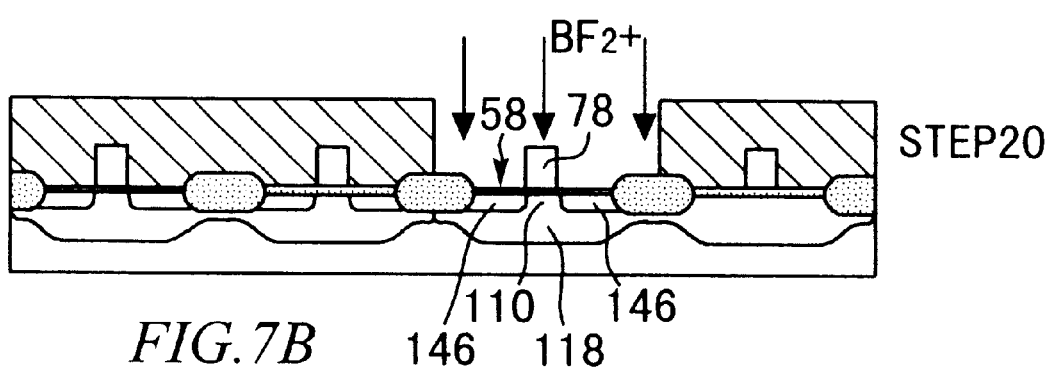

As shown in FIG. 7B, BF$_2$ ions are implanted into the low voltage PMOS region 58 at an energy of 10 keV and a dose of $2 \times 10^{14}$ions/cm$^2$ (step 20).

Through the foregoing processing, the channel region 110, which has an impurity profile identical to that of the N-type island 118, is formed below the gate electrode 78 in the low voltage PMOS region 58. Further, on each side of the channel region 110 there is formed an LDD region 146 having a desired impurity profile and a shallow pocket in which "As" ions are dispersed in a predetermined profile. Further, under the previously-described ion implantation conditions, the PN junction of the LDD region 146 is formed to a depth of 1 μm or less.

Figure 7C:
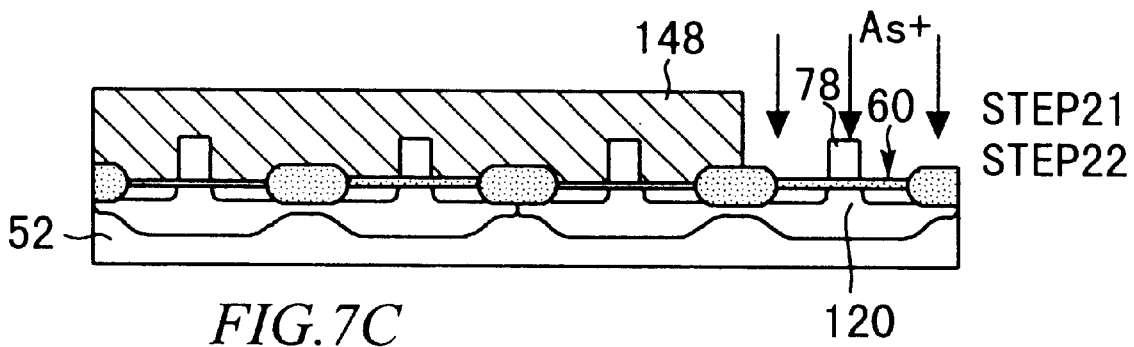

As shown in FIG. 7C, during the process of forming an LDD region in an PMOS region, a resist pattern 148 having an opening on the high voltage PMOS region 60 is formed on the substrate 52 by means of photolithography (step 21). "As" ions are implanted into the high voltage PMOS region 60 while the resist pattern 148 is used as a mask. In this step, "As" ions are implanted into the substrate 52 at an angle of 38° relative to an imaginary line perpendicular to the substrate 52 with an energy of 100 keV and a dose of $2\times10^{13}$ions/cm$^2$ (step 22).

Figure 7D:
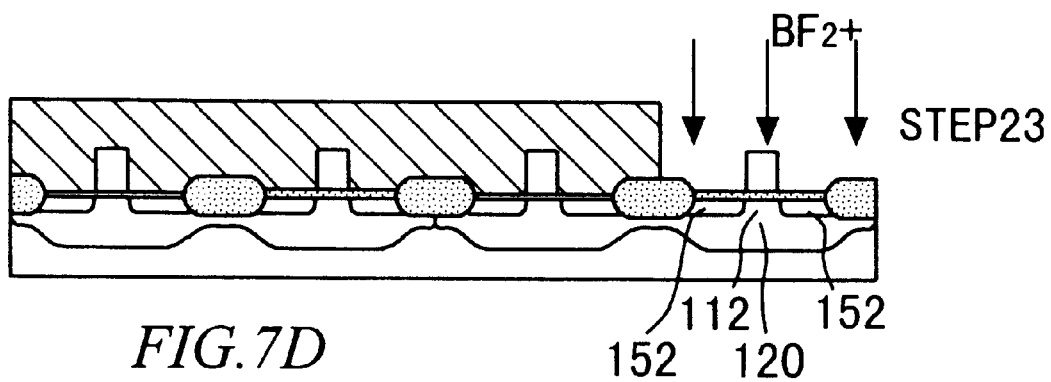

As shown in FIG. 7D, "$BF_2$" ions are also implanted into the high voltage PMOS region 60 at an energy of 10 keV and a dose of $4\times10^{14}$ions/cm$^2$ (step 23).

Through the foregoing processing, the channel region 112, which has an impurity profile identical to that of the N-type island 120, is formed below the gate electrode 78 in the high voltage PMOS region 60. Further, on each side of the channel region 112 there is formed an LDD region 152 which has a desired impurity profile and a shallow pocket of "As" ions. The previously-described ion implantation conditions makes the junction depth of the LDD region 152 to be 1 μm or less.

As mentioned above, the manufacturing method according to the first embodiment forms the LDD region 146 of the low voltage PMOS region 58 and the LDD region 152 of the high voltage PMOS region 60 under different ion implantation conditions respectively. Therefore, the first embodiment enables to impart a desired impurity profile to the LDD region 146 in the low voltage PMOS region 58, while giving another desired impurity profiles to the LDD region 152 in the high voltage PMOS region 60.

Figure 8A:
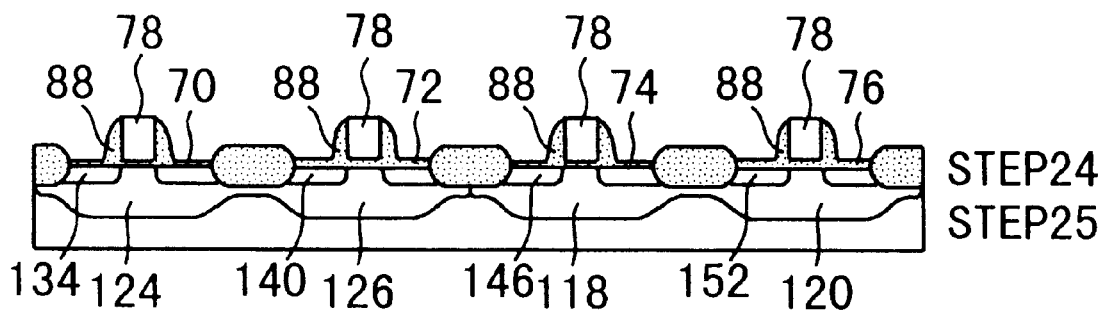
FIGS. 8A through 8C are sectional views for describing procedures of steps 24 through 29 for manufacturing the semiconductor device shown in FIG. 1.
Figure 8B:
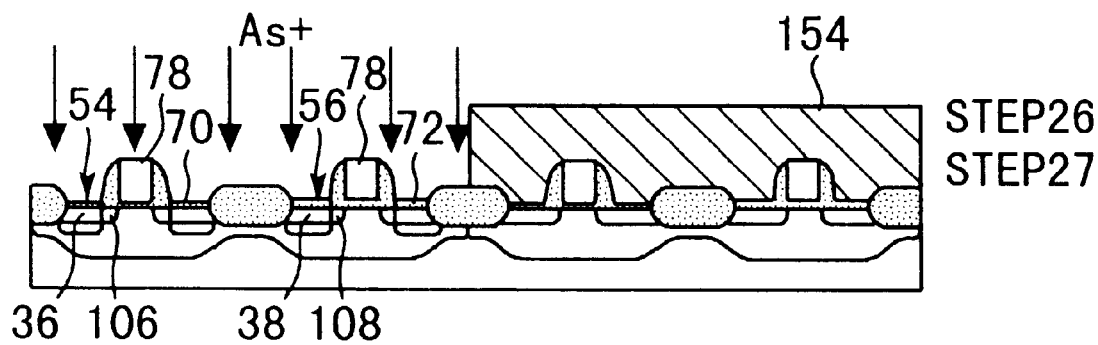
Figure 8C:
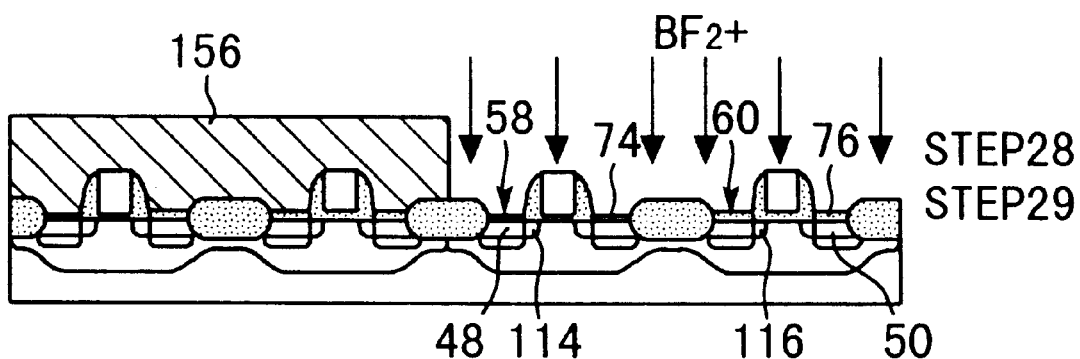

FIGS. 8A to 8C are cross-sectional views for describing formation of a source/drain region 36 in the island 124, a source/drain region 38 in the island 126, a source/drain region 48 in the island 118, and a source/drain region 50 in the island 120.

As shown in FIG. 8A, during the process of forming a source/drain region, the resist pattern 148 is removed at first (step 24).

Sidewalls 88 each surrounding the gate electrode 78 are provided on the oxide films 70, 72, 74, and 76 (step 25).

As shown in FIG. 8B, during the process of forming a source/drain region, a resist pattern 154 is formed on the substrate 52 by means of photolithography in such a way that an opening of the resist pattern 154 is situated on the NMOS regions 54 and 56 (step 26). The photolithography in the step 26 is performed using a mask identical to that used in step 5.

After formation of the resist pattern 154, "P" ions and "As" ions are implanted into the NMOS regions 54 and 56 from above the oxide films 70 and 72. More specifically, "P" ions are implanted at an energy of 40 keV and a dose of $2\times10^3$ions/cm$^2$, and "As" ions are implanted at an energy of 40 kev and a dose of $4\times10^{15}$ions/cm$^2$ (step 27).

Through the foregoing processing, the LDDEX region 106, which has an impurity profile identical to that of the LDD region 134, is formedbelow the sidewall 88 in the lowvoltage NMOS region 54, and the LDDEX region 108, which has an impurity profile identical to that of the LDD region 140, is formed below the sidewall 88 in the high voltage NMOS region 56. The source/drain region 36 is formed outside of the LDDEX region 106 so as to have an impurity concentration higher than that of the LDDEX region 106, and the source/drain region 38 is formed outside of the LDDEX region 108 so as to have an impurity concentration higher than that of the LDDEX region 108.

As shown in FIG. 8C, during the process of forming a source/drain region, a resist pattern 156 is formed on the substrate 52 by means of photolithography in such a way that an opening of the resist pattern 156 is situated on the PMOS regions 58 and 60 (step 28). The photolithography in step 28 is performed using a mask identical to that used in step 2.

After formation of the resist pattern 156, "B" ions and "$BF_2$" ions are implanted into the PMOS regions 58 and 60 from above the oxide films 74 and 76. More specifically, "B" ions are implanted at an energy of 15 keV and a dose of $2\times10^3$ions/cm$^2$, and "$BF_2$" ions are implanted at an energy of 20 kev and a dose of $4\times10^{15}$ions/cm$^2$ (step 29).

Through the foregoing processing, the LDDEX region 114, which has an impurity profile identical to that of the LDD region 146, is formed below the sidewall 88 in the low voltage PMOS region 58, and the LDDEX region 116, which has an impurity profile identical to that of the LDD region 152, is formed below the sidewall 88 in the high voltage PMOS region 60. The source/drain region 48 is formed outside of the LDDEX region 114 so as to have an impurity concentration higher than that of the LDDEX region 114, and the source/drain region 50 is formed outside of the LDDEX region 116 so as to have an impurity concentration higher than that of the LDDEX region 116.

FIGS. 9A to 9D are cross-sectional views for describing the details of another processing operation performed during the course of manufacturing the semiconductor device 100.

Figure 9A:
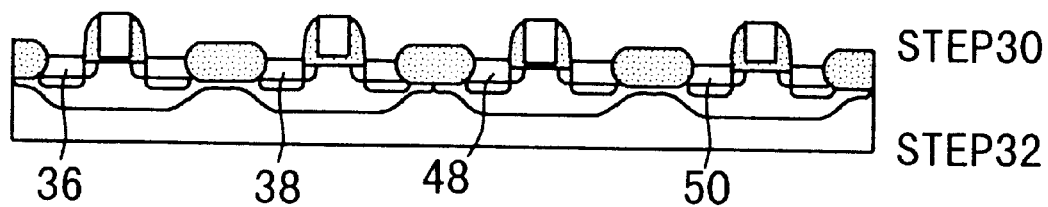
FIGS. 9A through 9D are sectional views for describing procedures of steps 30 through 35 for manufacturing the semiconductor device shown in FIG. 1.

During the course of manufacturing the semiconductor device 100, as shown in FIG. 9A, upon completion of the processing in step 29 the resist pattern 156 is removed (step 30).

Subsequently, the oxide films still remaining on the source/drain regions 36, 38, 48, and 50 are removed (step 31).

After removal of the oxide films, the substrate 52 is subjected to lamp annealing at 1000° C. for three seconds (step 32).

Figure 9B:
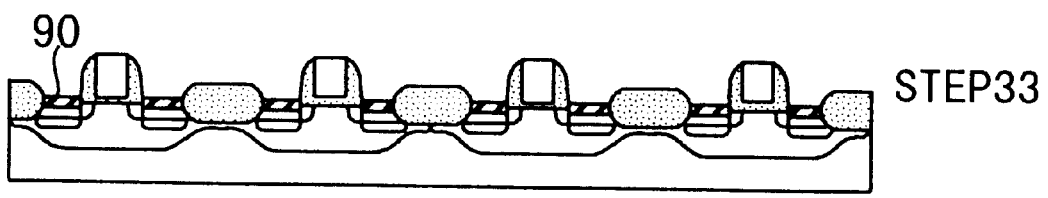

As show in FIG. 9B, upon completion of the lamp annealing, a salicide film 90 is formed on the surface of the respective source/drain regions 36, 38, 48, and 50 (step 33).

Figure 9C:
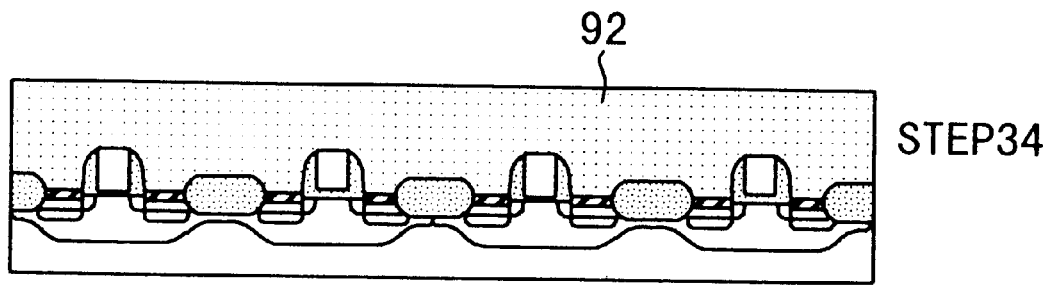

As shown in FIG. 9C, an oxide film 92 is formed on the substrate 52 (step 34).

Figure 9D:
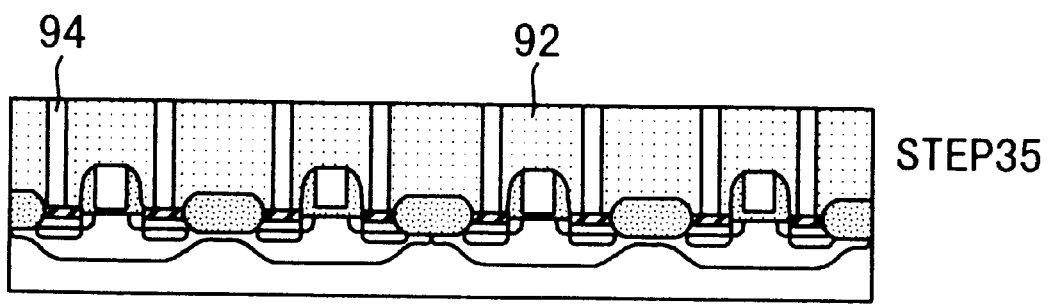

Subsequently, as shown in FIG. 9D, contact holes 94 are formed within the oxide film 92 until they reach the surface of the salicide film 90 (step 35).

A contact layer is formed on the interior surface of each contact hole 94, and a metal wiring layer is formed on the oxide film 92 so as to establish continuity with the contact layers, thereby completing manufacture of the semiconductor device 100 shown in FIG. 1.

As mentioned above, under the manufacturing method according to the first embodiment, the channel regions 102 and 110 of the low voltage MOS transistors 12 and 16 are imparted with impurity profiles each of which 4 is identical to that of the channel regions 104 and 112 of the high voltage MOS transistors 14 and 18 respectively. In contrast, the first embodiment imparts different impurity profiles independently to the LDDEX regions 106 and 114 of the low voltage MOS transistors 12 and 16 and the LDDEX regions 108 and 116 of the high voltage MOS transistors 14 and 18.

Figure 10:
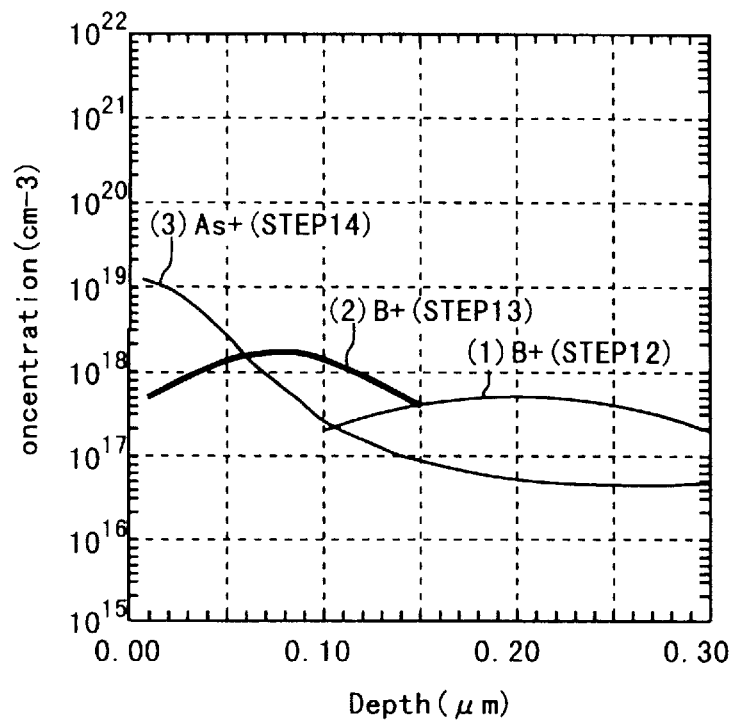
FIG. 10 is a graph showing a impurity profile of a LDDEX region provided in a low voltage NMOS transistor shown in FIG. 1.
Figure 11:
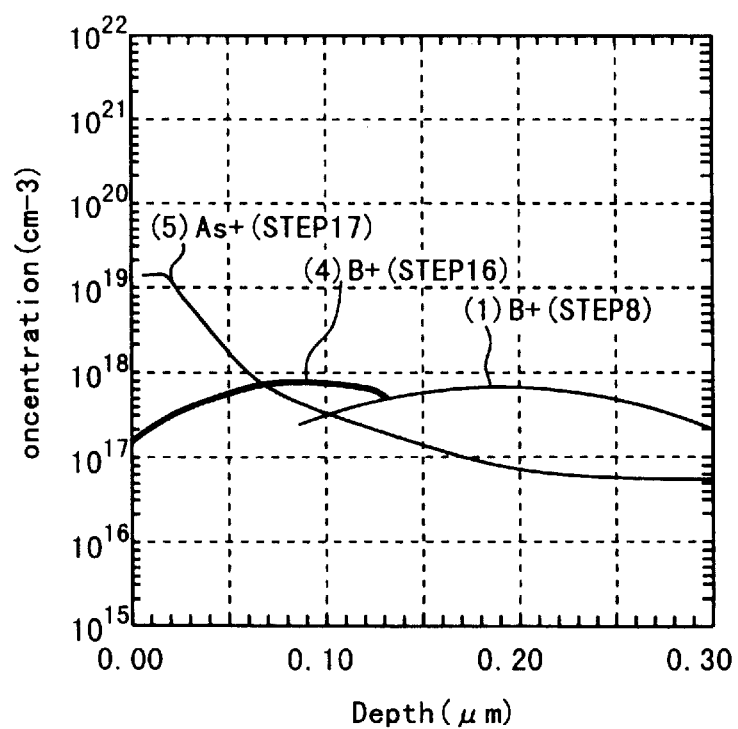
FIG. 11 is a graph showing a impurity profile of a LDDEX region provided in a high voltage NMOS transistor shown in FIG. 1.

FIG. 10 shows a depthwise impurity profile of the LDDEX region 106 in the low voltage NMOS transistor 12, while FIG. 11 shows a depthwise impurity profile of the LDDEX region 108 in the high voltage NMOS transistor 14. In FIGS. 10 and 11, curve 1 represents the concentration of "B" ions implanted into the islands 124 and 126 during the processing in step 8 (see FIG. 4C); curve 2 represents the concentration of "B" ions implanted into the LDD region 134 in step 13 (see FIG. 6A); and curve 4 represents the concentration of "B" ions implanted into the LDD region 140 in step 16 (see FIG. 6C). Further, curve 3 represents the concentration of "As" ions implanted into the LDD region 134 in step 14 (see FIG. 6B), and curve 5 represents the concentration of "As" ions implanted into LDD region 140 in step 17 (see FIG. 6D).

An intersection of curves 2 and 3 shown in FIG. 10 represents a position of the PN junction of the LDDEX region 106, whereas an intersection of curves 4 and 5 shown in FIG. 11 represents a position of the PN junction of the LDDEX region 108. The threshold voltage of the low voltage NMOS transistor 12 is greatly affected by impurity concentrations of the PN junction of the LDDEX region 106. Likewise, the threshold voltage of the high voltage NMOS transistor 14 is greatly affected by impurity concentrations of the LDDEX region 108. Consequently, these threshold voltages can be adjusted to relevant values by appropriately controlling the impurity concentrations of the LDDEX regions 106 and 108.

Hot carriers in the low voltage NMOS transistor 12, and hot carriers in the high voltage NMOS transistor 14 can be efficiently retarded by appropriately controlling the impurity profiles of the LDDEX regions 106 and 108, especially by controlling the relationship between curves 2 and 3 as well as the relationship between curves 4 and 5. Accordingly, the first embodiment with appropriate control of the impurity profiles of the LDDEX regions 106 and 108 enables to impart relevant threshold values to both of the low and high voltage NMOS transistors 12 and 16, while efficiently preventing hot carriers therein. Likewise, the first embodiment with appropriate control of the impurity profiles of the LDDEX regions 114 and 116 enables to impart relevant threshold values to both of the low and high voltage PMOS transistors 14 and 18, while efficiently preventing hot carriers therein.

The LDDEX regions 106 and 114 of the low voltage MOS transistor 12 and 16 in the first embodiment have impurity profiles each of which imparts a desired threshold value to a corresponding transistor and efficiently prevents hot carrier within the same (see FIG. 10). The LDDEX regions 108 and 116 of the high voltage MOS transistor 14 and 18 in the first embodiment also have impurity profiles each of which imparts a desired threshold value to a corresponding transistor and efficiently prevents hot carrier within the same (see FIG. 11).

This allows all of the high and low voltage transistors in the semiconductor device 100 to operate stably, while restraining hot carriers therein.

As mentioned above, in the semiconductor device 100 according to the first embodiment, the junction depth in each of the LDDEX regions 106, 108, 114, and 116 of the MOS transistors 12, 14, 16, and 18 is set so as to be 1 $\mu$m or less. The LDDEX region having a junction depth of 1 $\mu$m or less efficiently prevents impurities therein from diffusing to the channel region.

Accordingly, even when MOS transistors are sufficiently miniaturized, the semiconductor device 100 can maintain the characteristics of the MOS transistors stable.

Second Embodiment

A second embodiment of the present invention will now be described by reference to FIGS. 12 to 20.

Figure 12:
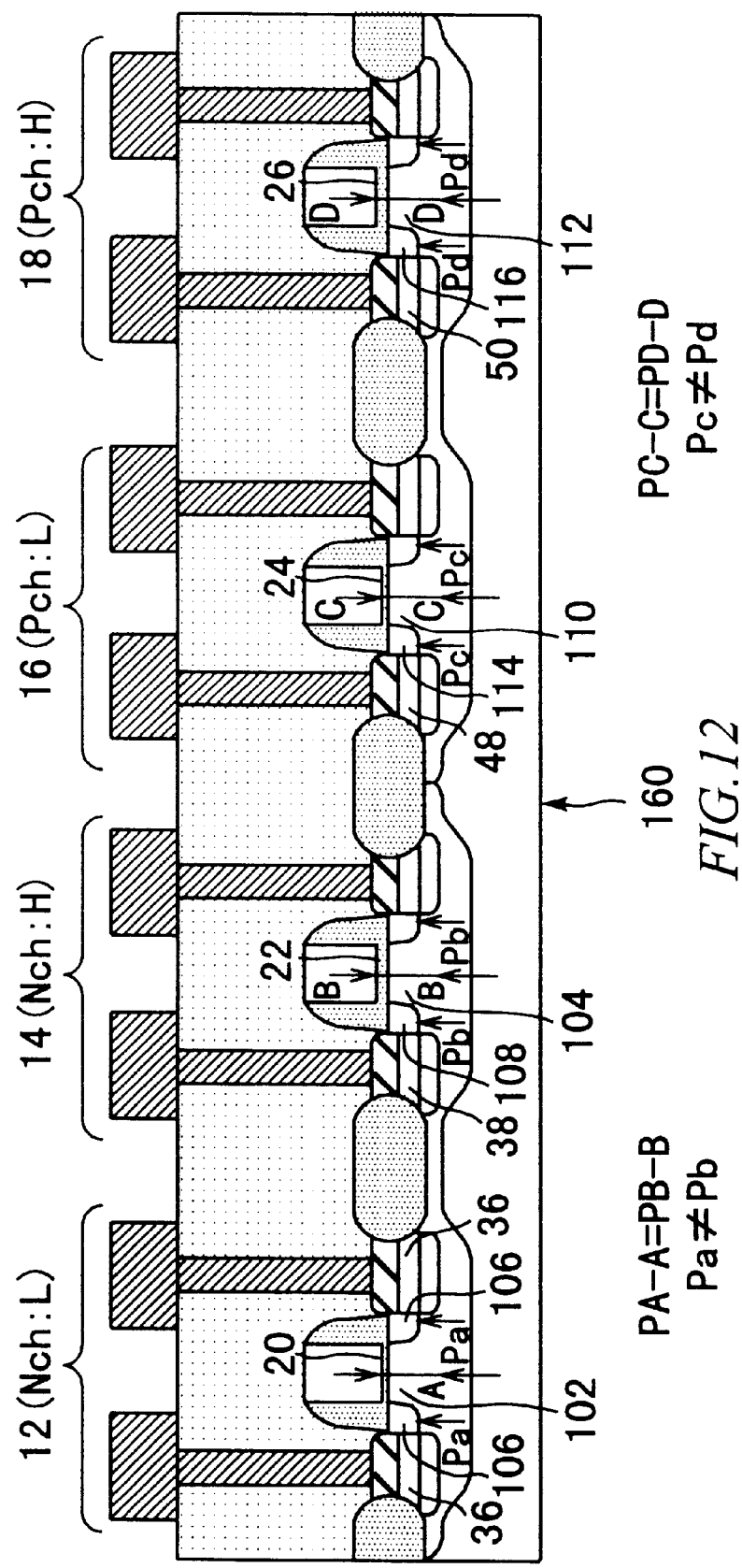
FIG. 12 is a sectional view of a semiconductor device practiced as a second embodiment of the present invention.
Figure 13:
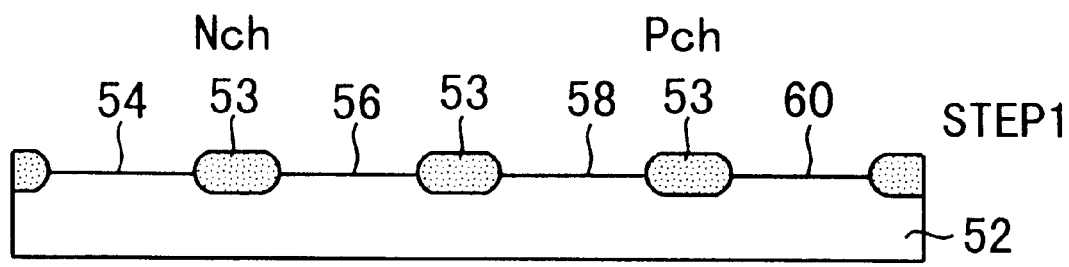
FIG. 13 is a sectional view for describing a procedure of step 1 for manufacturing the semiconductor device shown in FIG. 12.
Figure 14A:
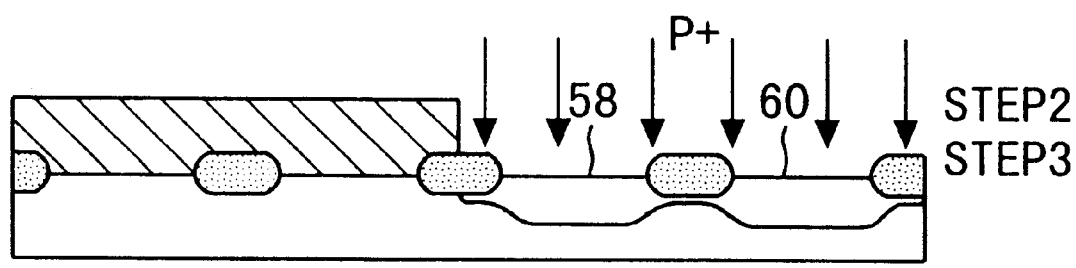
FIGS. 14A and 14B are sectional views for describing procedures of steps 2 through 4 for manufacturing the semiconductor device shown in FIG. 12.
Figure 14B:
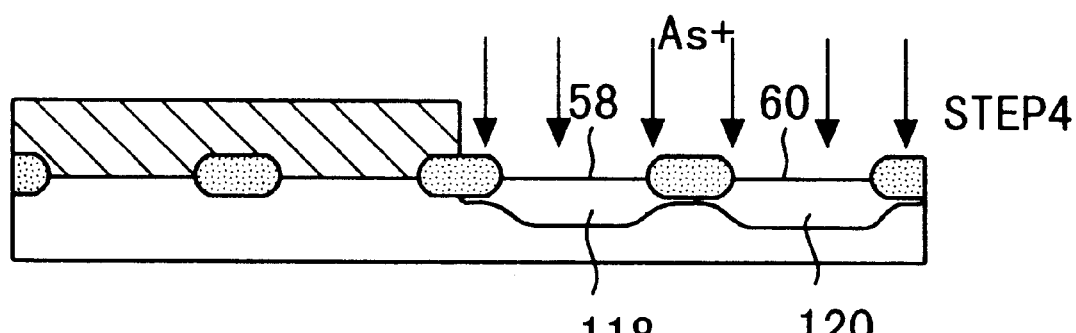
Figure 15A:
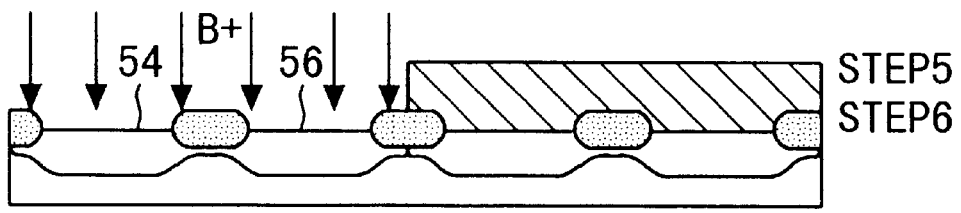
FIGS. 15A through 15C are sectional views for describing procedures of steps 5 through 8 for manufacturing the semiconductor device shown in FIG. 12.
Figure 15B:
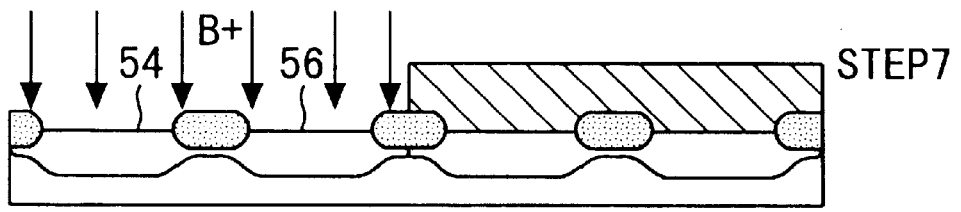
Figure 15C:
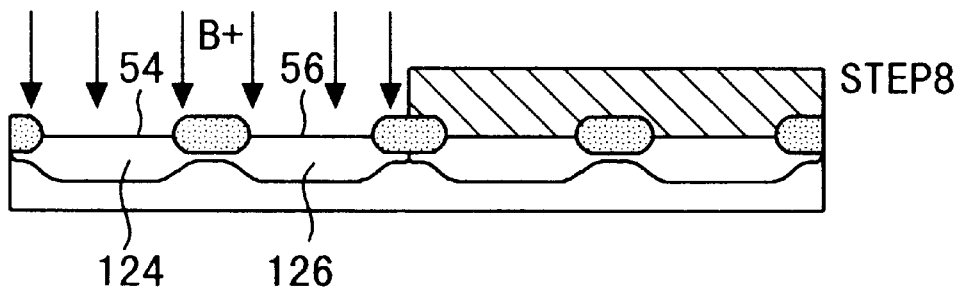
Figure 16:
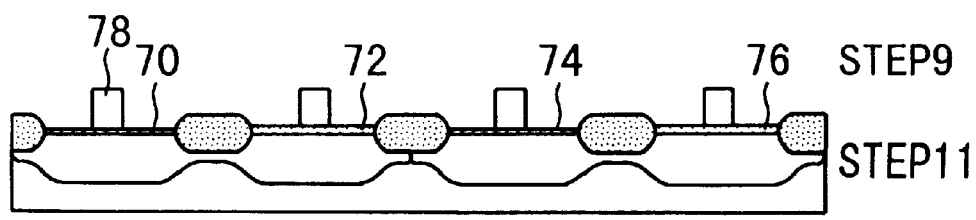
FIG. 16 is a sectional view for describing procedures of step 9 through 11 for manufacturing the semiconductor device shown in FIG. 12.

FIG. 12 is a cross-sectional view showing a semiconductor device 160 according to a second embodiment of the present invention. As in the case of the semiconductor device 100 according to the first embodiment, the semiconductor device 160 comprises a low voltage NMOS transistor 12, a high voltage NMOS transistor 14, a low voltage PMOS transistor 16, and a high voltage PMOS transistor 18, which are provided on a single chip. Further, the semiconductor device 160 has an identical impurity profiles in the channel regions 102 and 110 of the low voltage MOS transistors 12 and 16 and the channel regions 104 and 114 of the high voltage MOS transistor 14 and 18 (i.e., PA-A=PBB, PC-C= PD-D), as in the first embodiment. Moreover, the semiconductor device 160 has impurity profiles in the LDDEX regions 106 and 110 of the low voltage MOS transistors 12 and 16, which are independently arranged each other with impurity profiles in the LDDEX regions 108 and 116 of the high voltage MOS transistors 14 and 18 (i.e., Pa Pb, Pc Pd). The semiconductor device 160 according to the second embodiment is characterized by being manufactured through use of fewer masks than is the semiconductor device according to the first embodiment.

A method of manufacturing the semiconductor device 160 according to the second embodiment will now be described by reference to FIGS. 13 through 20.

FIGS. 13 through 16 are cross-sectional views for describing processes of forming an isolation oxide film 53, islands 118, 120, 124, and 126, and gate structures on a substrate 52 of the semiconductor device 160. As shown in FIGS. 13 through 16, these constituent elements are fabricated through the processing in steps 1 through 11 as in the case of the first embodiment (see FIGS. 2 through 5).

FIGS. 17A through 17D are cross-sectional views for describing formation of LDD regions in P-type islands 124 and 126 within NMOS regions 54 and 56.

Figure 17A:
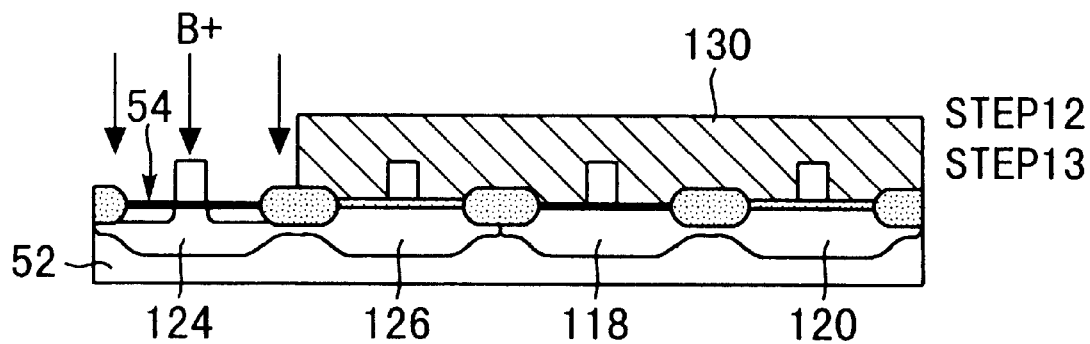
FIGS. 17A through 17D are sectional views for describing procedures of steps 12 through 14 and 36 through 38 for manufacturing the semiconductor device shown in FIG. 12.
Figure 17B:
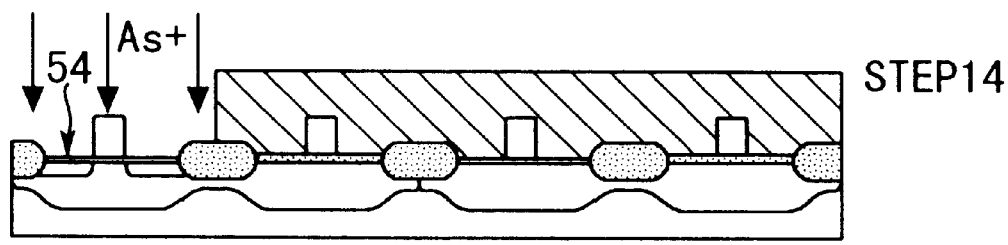

As shown in FIGS. 17A and 17B, during the process of forming LDD regions in NMOS regions, a resist pattern 130 having opening on the low voltage NMOS region 54 is formed on the substrate 52 at first (step 12) as in the case of the first embodiment.

Subsequently, "B" and "As" ions are implanted into the low voltage NMOS region 54 (steps 13 and 14).

Figure 17C:
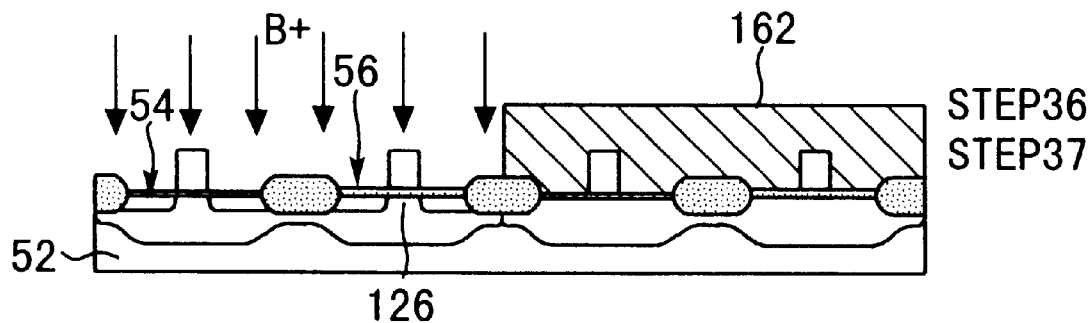

As shown in FIG. 17C, under the manufacturing method according to the second embodiment, a resist pattern 162 is formed on the substrate 52 by means of photolithography in such a way that an opening of the resist pattern 162 is situated on the low voltage NMOS regions 54 and the high voltage NMOS region 56 (step 36). The photolithography is performed within step 36 through use of the same mask as that used in step 5.

While the resist pattern 162 is used as a mask, "B" ions are simultaneously implanted into the low voltage NMOS region 54 and the high voltage NMOS region 56 at an angle of 45° relative to an imaginary line perpendicular to the substrate 52 at an energy of 14keV and a dose of $3 \times 10^{13}$ions/cm$^2$ (step 37).

Figure 17D:
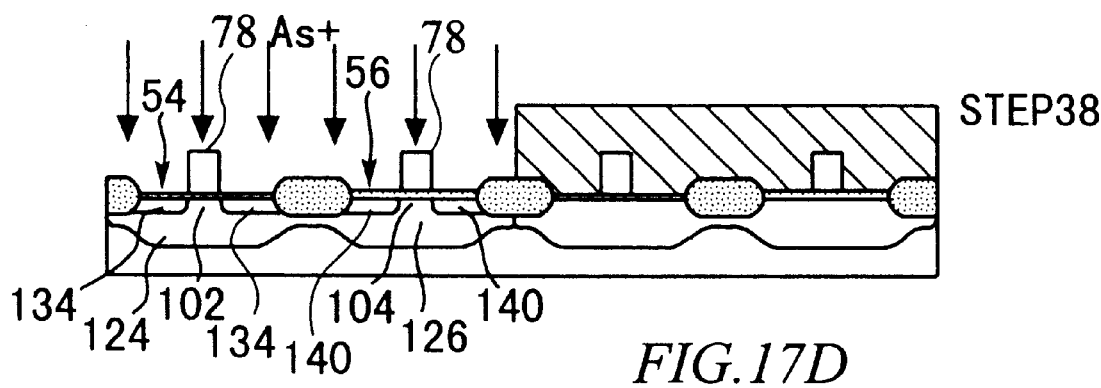

Subsequently, as show in FIG. 17D, "As" ions are simultaneously implanted into the low voltage NMOS region 54 and the high voltage NMOS region 56 at an energy of 10 keV and a dose of $5 \times 10^{14}$ions/cm$^2$ (step 38).

Through the foregoing processing, a channel region 102, which has an impurity profile identical to that of the N-type island 124, is formed below the gate electrode 78 in the low voltage NMOS region 54, and a channel region 104, which has an impurity profile identical to that of the N-type island 126, is formed below the gate electrode 78 in the high voltage NMOS region 56. On each side of the channel region 102 there is formed an LDD region 134 having a shallow pocket of "B" ion and a desired impurity profile. Further, on each side of the channel region 104 there is formed an LDD region 140 having a shallow pocket of "B" ion and a desired impurity profile. The manufacturing method according to the second embodiment enables independent control of the impurity profile of the LDD region 134 and the impurity profile of the LDD region 140. Further, under the previously-described ion implantation conditions, the PN junction of each of the LDD regions 134 and 140 is formed to a depth of 1 $\mu$m or less.

FIGS. 18A through 18D are cross-sectional views for describing formation of LDD regions in N-type islands 118 and 120 within the PMOS regions 58 and 60.

Figure 18A:
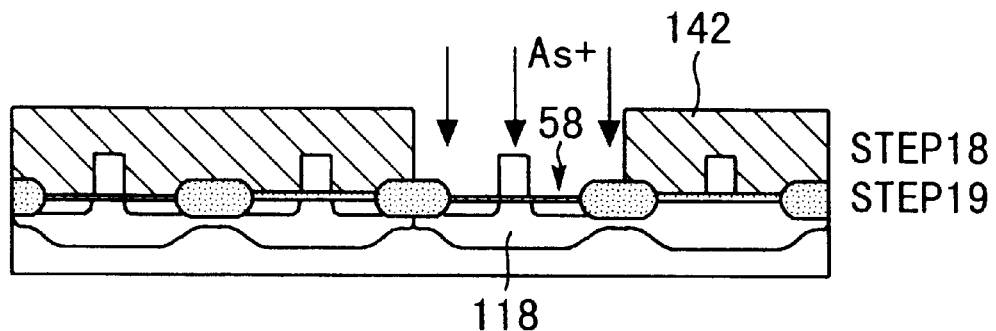
FIGS. 18A through 18D are sectional views for describing procedures of steps 18 through 20 and 39 through 41 for manufacturing the semiconductor device shown in FIG. 12.
Figure 18B:
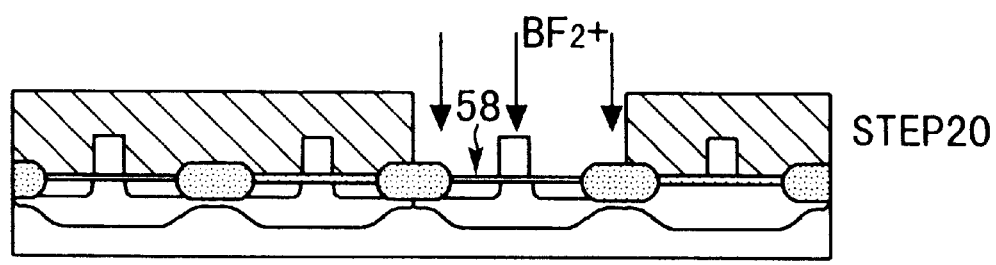

As shown in FIGS. 18A and 18B, during the process of forming an LDD region in a PMOS region, as in the case of the first embodiment, a resist pattern 142 is formed on the substrate 52 such that an opening of the resist pattern 142 is situated on the low voltage PMOS region 58 (step 18). Subsequently, "As" and "BF$_2$" ions are implanted into the low voltage PMOS region 58 (steps 19 and 20).

Figure 18C:
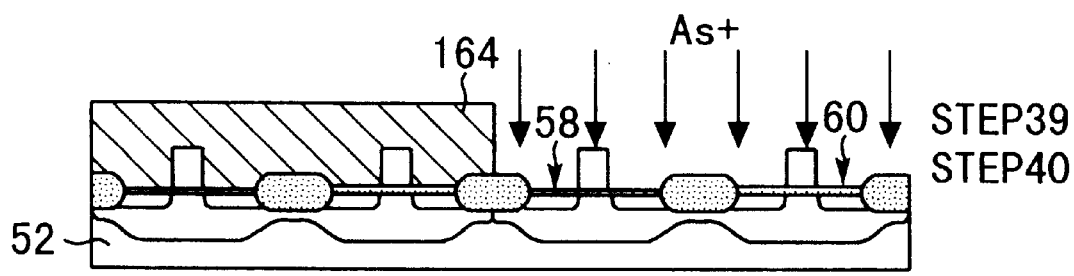

As show in FIG. 18C, under the manufacturing method according to the second embodiment, a resist pattern 164 is formed on the substrate 52 by means of photolithography in such a way that an opening of the resist pattern 164 is situated on the low voltage PMOS region 58 and the high voltage PMOS region 60 (step 39). The photolithography is performed within step 39 through use of the same mask as that used in step 2.

While the resist pattern 164 is used as a mask, "As" ions are simultaneously implanted into the low voltage PMOS region 58 and the high voltage PMOS region 60 at an angle of 45° relative to an imaginary line perpendicular to the substrate 52 at an energy of 100 keV and a dose of $2 \times 10^{13}$ ions/cm$^2$ (step 40).

Figure 18D:
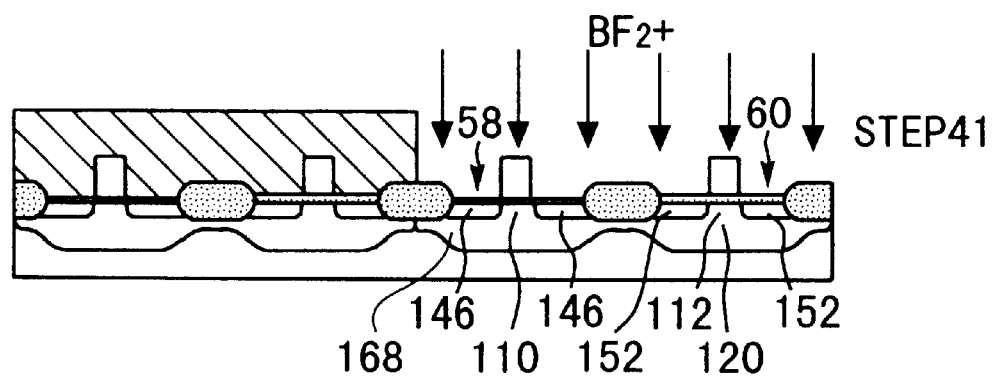
Figure 19A:
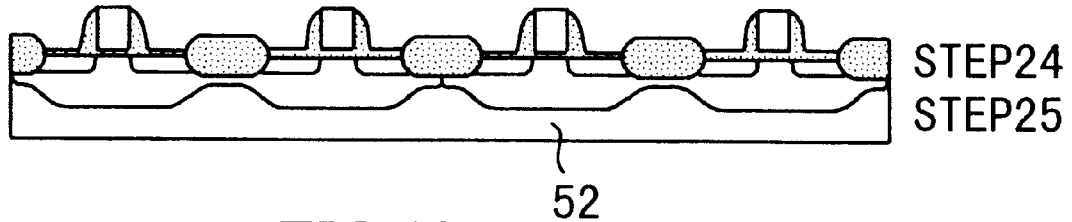
FIGS. 19A through 19C are sectional views for describing procedures of steps 24 through 29 for manufacturing the semiconductor device shown in FIG. 12.
Figure 19B:
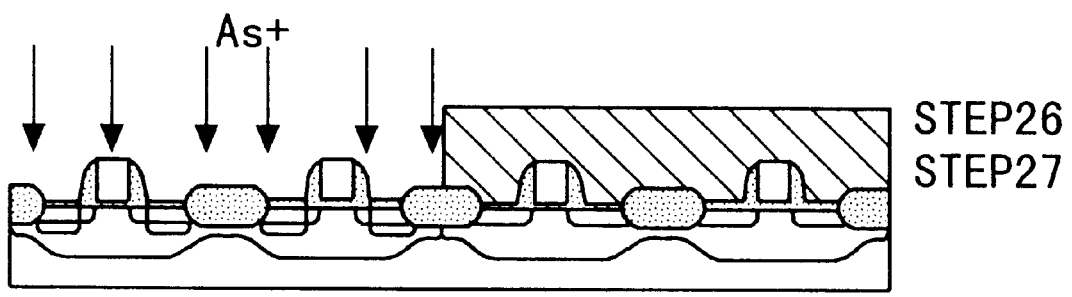
Figure 19C:
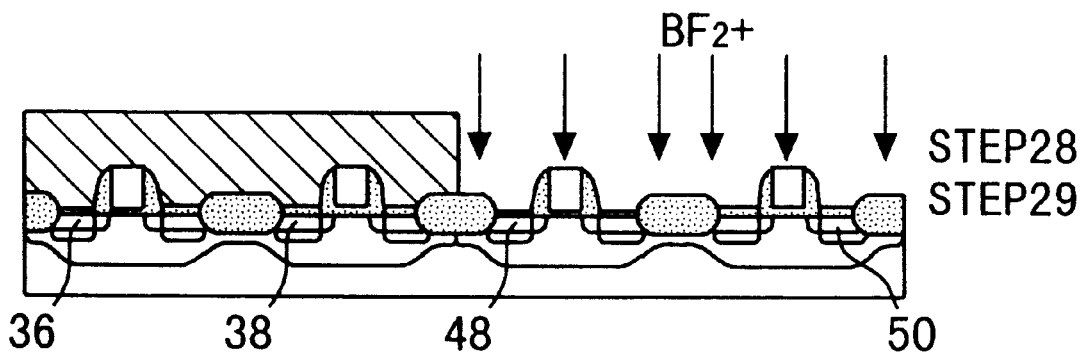
Figure 20A:
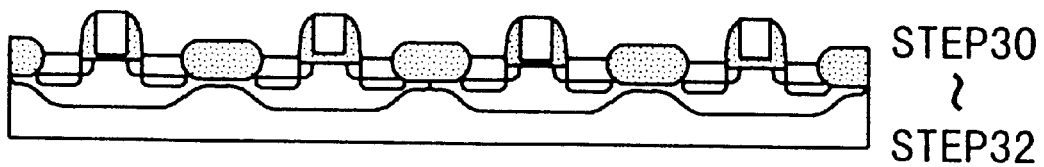
FIGS. 20A through 20D are sectional views for describing procedures of steps 30 through 35 for manufacturing the semiconductor device shown in FIG. 12.
Figure 20B:
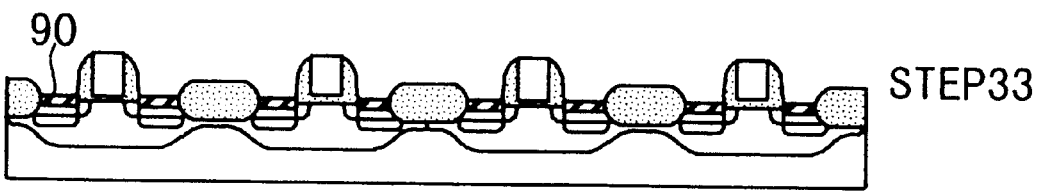
Figure 20C:
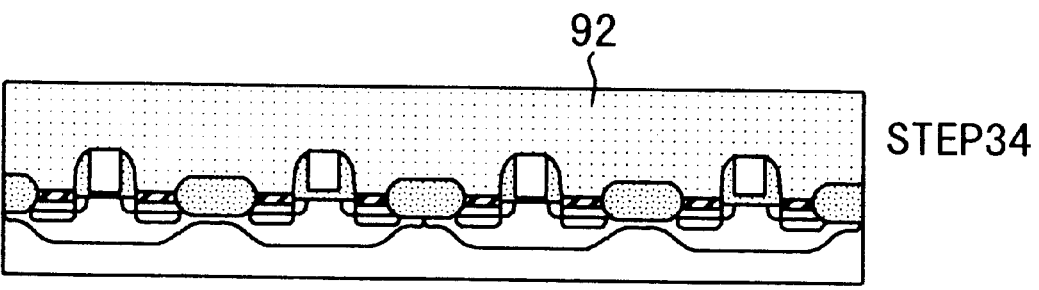
Figure 20D:
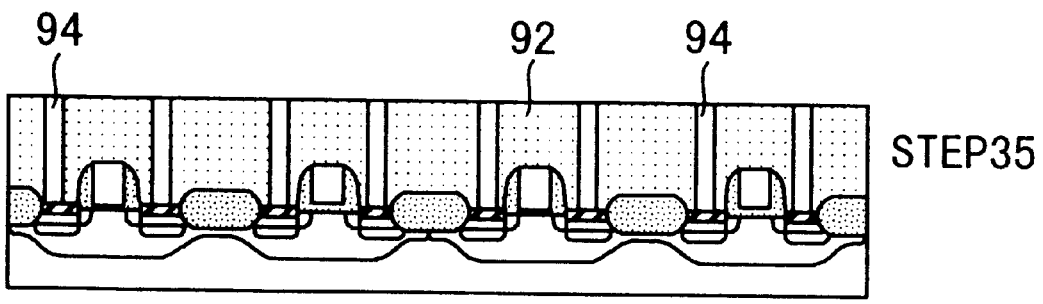

Subsequently, as show in FIG. 18D, "BF$_2$" ions are simultaneously implanted into the low voltage PMOS region 58 and the high voltage PMOS region 60 at an energy of 10 keV and a dose of $4 \times 10^{14}$ ions/cm$^2$ (step 41).

Through the foregoing processing, a channel region 110, which has an impurity profile identical to that of the N-type island 118, is formed below the gate electrode 78 in the low voltage PMOS region 58, and a channel region 112, which has an impurity profile identical to that of the N-type island 120, is formed below the gate electrode 78 in the high voltage PMOS region 60. On each side of the channel region 110 there is formed an LDD region 146 having shallow pocket of "As" ion and a desired impurity profile. Further, on each side of the channel region 112 there is formed an LDD region 152 having a shallow pocket of "As" ion and a desired impurity profile. While the LDD region 146 is imparted with an impurity concentration which is higher than that imparted to the LDD region 152, the manufacturing method according to the second embodiment enables independent control of the impurity profile of the LDD region 146 and the impurity profile of the LDD region 152. Further, under the previously-described ion implantation conditions, the PN junction of each of the LDD regions 146 and 152 is formed to a depth of 1 $\mu$m or less.

FIGS. 19A to 19C and FIGS. 20A to 20D are cross-sectional views for describing the process of forming source/drain regions 36, 38, 48, 50, a salicide film 90, an oxide film 92, and contact holes 94. As shown in FIGS. 19A to 19C and FIGS. 20A to 20D, these constituent elements are fabricated through processing in steps 24 to 35, as in the case of the first embodiment (see FIGS. 8A to 8C and FIGS. 9A to 9D). In the foregoing manufacturing process, photolithography is performed within step 26 through use of the same mask as that used in steps 5 and 36. Further, photolithography is performed within step 28 through use of the same mask as that used in steps 2 and 39.

The manufacturing method according to the second embodiment enables the LDDEX regions 106 and 114 of the low voltage MOS transistors 12 and 16 and the LDDEX regions 108 and 116 of the high voltage MOS transistors 14 and 18 to be independently imparted with different impurity profiles. Under the manufacturing method according to the second embodiment, photolithography required to impart the profile characteristics to the LDDEX regions (in steps 36 and 39) may be performed through use of the mask used in another process. For this reason, compared with the manufacturing method according to the first embodiment, the manufacturing method according to the second embodiment enables more inexpensively manufacture the semiconductor device 160 capable of ensuring two types of threshold voltages and retarding hot carriers.

As the low voltage MOS transistors 12 and 16 have a greater current drive capability, the semiconductor device 160 according to the second embodiment operates faster. For this reason, compared with the high voltage MOS transistors 14 and 18, the low voltage MOS transistors 12 and 16 are required to have a greater current drive capability. As mentioned above, under the manufacturing method according to the second embodiment, the LDDEX regions 106 and 114 of the low voltage MOS transistors 12 and 16 are imparted with impurity concentrations which are higher than those imparted to the LDDEX regions 108 and 116 of the high voltage MOS transistors 14 and 18. The current drive capability of the MOS transistor can be increased by imparting high impurity concentrations to the source/drain region provided on the both side of the channel region. Accordingly, in the semiconductor device 160, a sufficient current drive capability is imparted to the low voltage MOS transistors 12 and 16, thereby sufficiently increasing the processing speed of the semiconductor device 160.

Third Embodiment

A third embodiment will now be described by reference to FIGS. 21 through 29.

Figure 21:
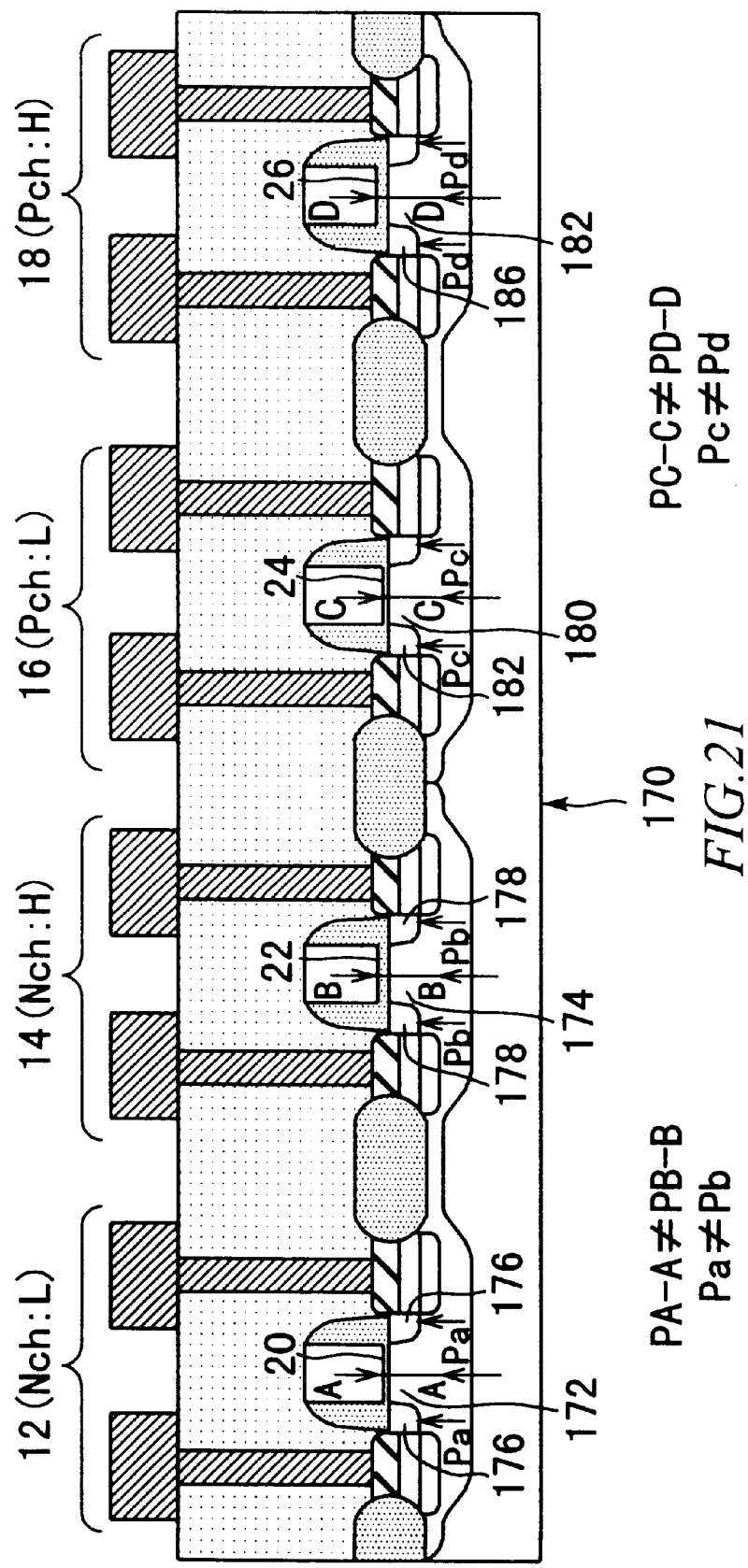
FIG. 21 is a sectional view of a semiconductor device practiced as a third embodiment of the present invention.

FIG. 21 is a cross-sectional view showing a semiconductor device 170 according to the third embodiment of the present invention. As with the semiconductor device 100 according to the first embodiment, the semiconductor device 170 comprises a low voltage NMOS transistor 12, a high voltage NMOS transistor 14, a low voltage PMOS transistor 16, and a high voltage PMOS transistor 18, which are provided in a single chip.

The low voltage NMOS transistor 12 has a channel region 172 provided below a gate electrode 78, and the high voltage NMOS transistor 14 has a channel region 174 provided below a gate electrode 78. In the semiconductor device 170, the channel region 172 is imparted with an impurity profile differing from that of the channel region 174 (i.e., PA-A PB-B). The low voltage NMOS transistor 12 has an LDDEX region 176 provided on both side of the channel region 172, as well as the high voltage NMOS transistor 14 has an LDDEX region 178 provided across the channel region 174. In the third embodiment, the LDDEX region 176 is imparted with an impurity profile differing from that of the LDDEX region 178 (i.e., Pa Pb). Similarly, the low voltage PMOS transistor 16 has a channel region 180 whose impurity profile differs from that of a channel region 182 of the high voltage PMOS transistor 18 (i.e., PC-C PD-D). Further, the low voltage PMOS transistor 16 has an LDDEX region 184 whose impurity profile differs from that of an LDDEX region 186 of the high voltage PMOS transistor 18 (i.e., Pc Pd).

A method of manufacturing the semiconductor device 170 according to the third embodiment will now be described by reference to FIGS. 22 through 29D.

Figure 22:
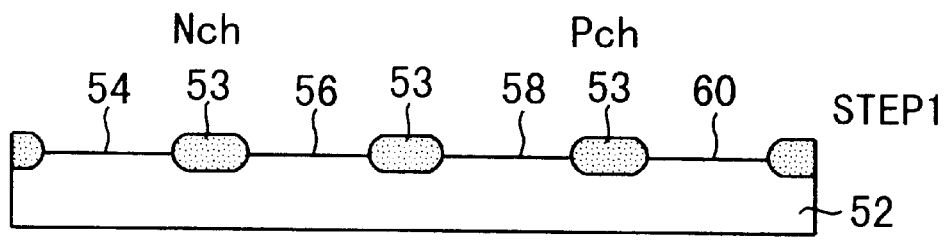
FIG. 22 is a sectional view for describing a procedure of step 1 for manufacturing the semiconductor device shown in FIG. 21.

FIG. 22 is a cross-sectional view for describing formation of an isolation oxide film 53 on the substrate 52 of the semiconductor device 170. As shown in FIG. 22, the isolation oxide film 53 is formed through the processing in step 1, as in the case of the first embodiment (see FIG. 2).

Figure 23A:
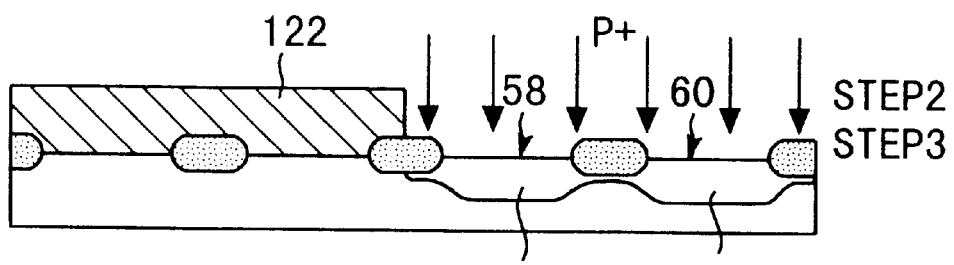
FIGS. 23A through 23C are sectional views for describing procedures of steps 2 through 4, 42 and 43 for manufacturing the semiconductor device shown in FIG. 21.
Figure 23B:
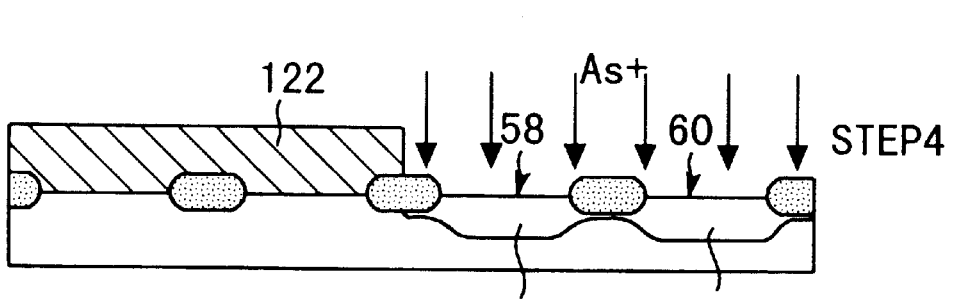
Figure 23C:
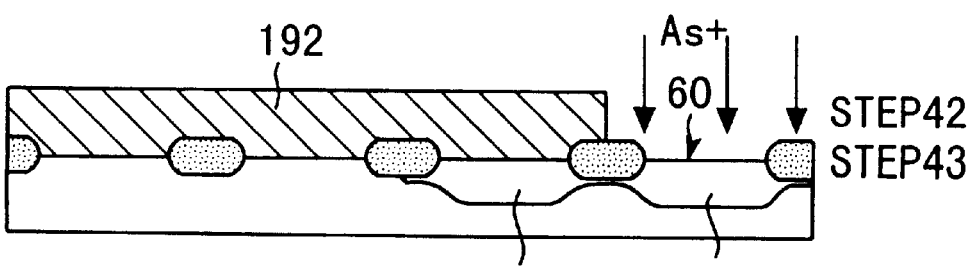

FIGS. 23A to 23C show the process of forming N-type islands 188 and 190 in PMOS regions 58 and 60.

As shown in FIG. 23A, as in the case of the first embodiment, in the process of forming an N-type island, a resist pattern 122 is formed on the substrate 52 (step 2); subsequently, "P" and "As" ions are sequentially implanted into the PMOS regions 58 and 60 (steps 3 and 4) (see FIGS. 3A and 3B).

As shown in FIG. 23C, under the manufacturing method according to the third embodiment, a resist pattern 192 is formed on the substrate 52 in such a way that an opening of the resist pattern 192 is situated on the high voltage PMOS region 60 (step 42).

Subsequently, "As" ions are implanted into the high voltage PMOS region 60 at an energy of 90keV and a dose of $9 \times 10^{12}$ ions/cm$^2$ (step 43).

Through the foregoing processing, the impurity profile of the N-type island 188 and the impurity profile of the N-type island 190 can be independently controlled while the N-type island 190 of the high voltage PMOS region 60 is imparted with impurity concentrations which are higher than those of the N-type island 188 of the low voltage PMOS region 58.

Figure 24A:
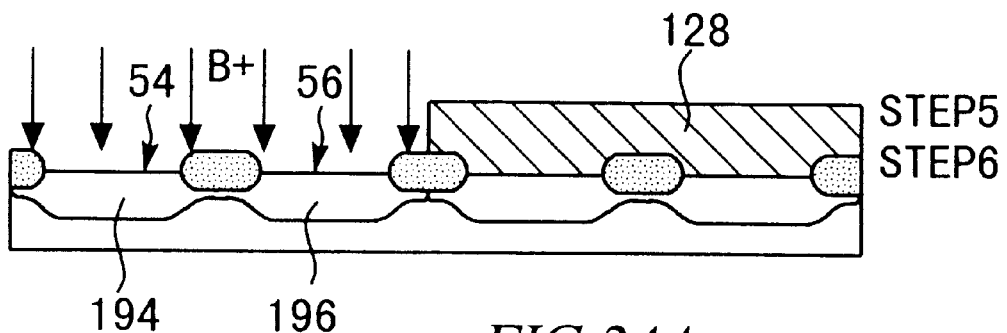
FIGS. 24A through 24D are sectional views for describing procedures of steps 5 through 8, 44 and 45 for manufacturing the semiconductor device shown in FIG. 21.
Figure 24B:
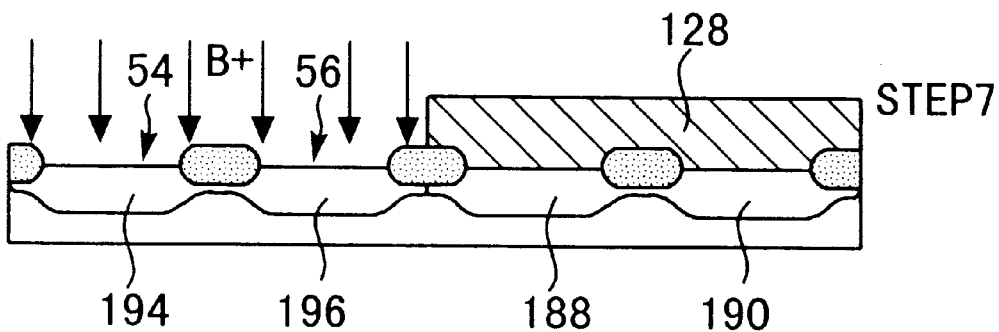
Figure 24C:
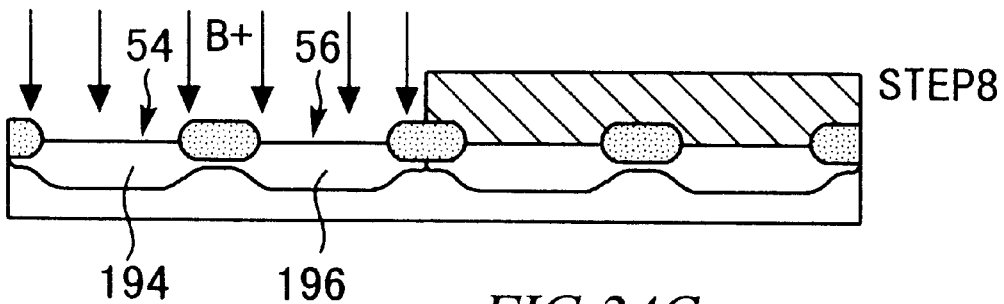

FIGS. 24A to 24C are cross-sectional views for describing formation of P-type islands 194 and 196 in the NMOS regions 54 and 56.

As shown in FIGS. 24A to 24C, during the process of forming a P-type island, as in the case of the first embodiment, a resist pattern 128 is formed on the substrate 52 (step 5); "B" ions are implanted into the NMOS regions 54 and 56 under differing three conditions (steps 6 to 8) (see FIGS. 4A to 4C).

Figure 24D:
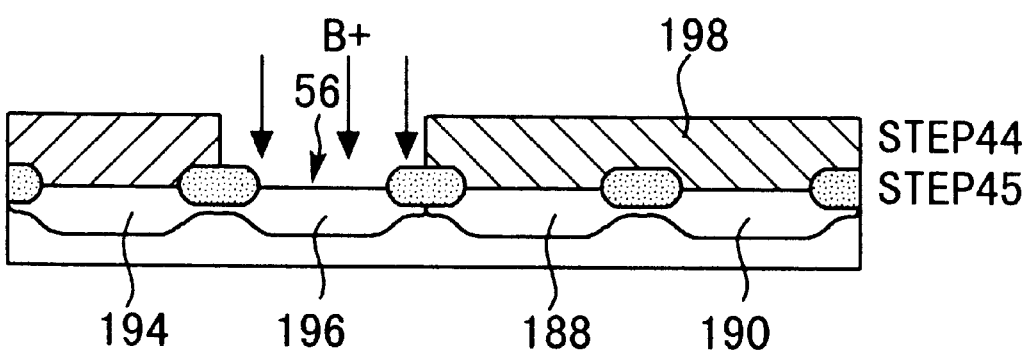

Under the manufacturing method according to the third embodiment, as shown in FIG. 24D, a resist pattern 198 is formed on the substrate 52 in such a way that an opening of the resist pattern 198 is situated on the high voltage NMOS region 56 (step 44).

Subsequently, "B" ions are implanted into the high voltage NMOS region 56 at an energy of 15 keV and a dose of $2 \times 10^{12}$ ions/cm$^2$ (step 45).

Through the processing, the impurity profile of the N-type island 194 and the impurity profile of the N-type island 196 can be independently controlled while the N-type island 196 of the high voltage NMOS region 56 is imparted with impurity concentrations which are higher than those of the N-type island 194 of the low voltage NMOS region 54.

Figure 25:
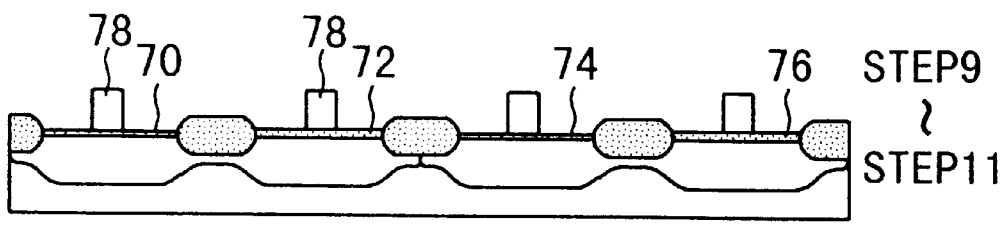
FIG. 25 is a sectional view for describing procedures of step 9 through 11 for manufacturing the semiconductor device shown in FIG. 21.

FIG. 25 is a cross-sectional view for describing formation of gate structures on the substrate 52. As shown in FIG. 25, under the manufacturing method according to the third embodiment, gate structures are formed through the processing in steps 9 to 11, as in the case of the first embodiment (see FIG. 5).

Figure 26A:
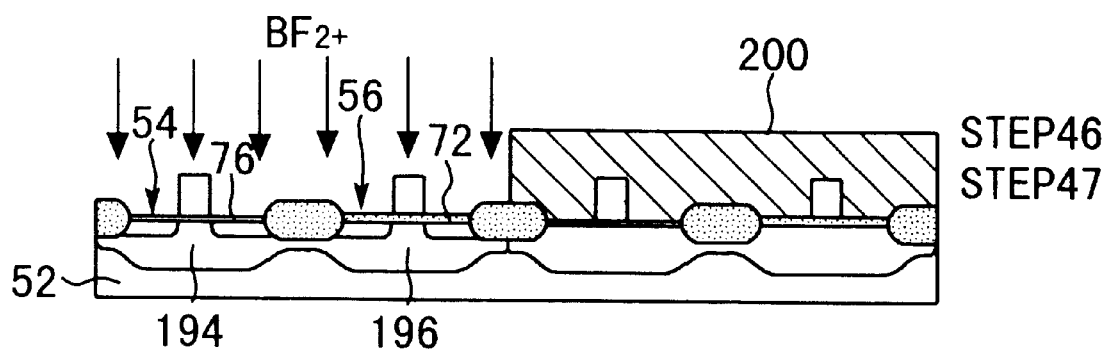
FIGS. 26A and 26B are sectional views for describing procedures of steps 46 through 48 for manufacturing the semiconductor device shown in FIG. 21.
Figure 26B:
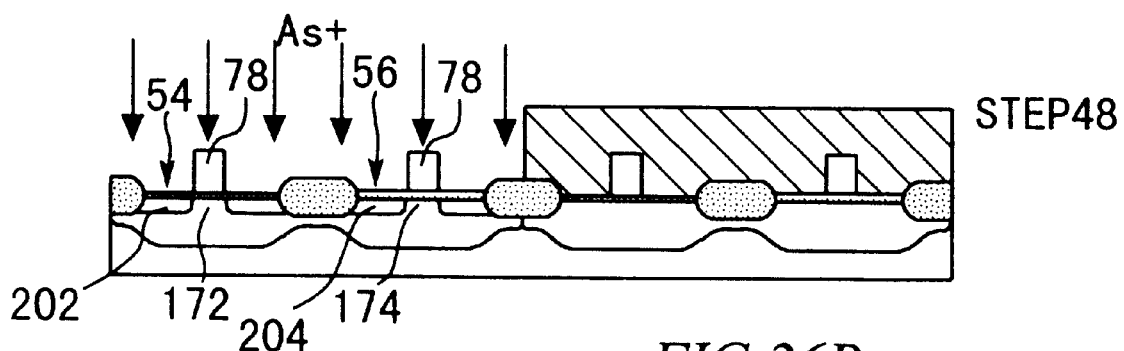

FIGS. 26A and 26B are cross-sectional views for describing formation of LDD regions in the P-type islands 194 and 196 within the NMOS regions 54 and 56.

As shown in FIG. 26A, during the process of forming LDD regions in the NMOS regions, a resist pattern 200 is formed on the substrate 52 in such a way that an opening of the resist pattern 200 is situated on the NMOS regions 54 and 56 (step 46).

Subsequently, while the resist pattern 200 is used as a mask, "BF$_2$" ions are simultaneously implanted into the NMOS regions 54 and 56 at an angle of 45° relative to an imaginary line perpendicular to the substrate 52 at an energy of 20 keV and a dose of $8 \times 10^{13}$ ions/cm$^2$ (step 47).

As shown in FIG. 26B, during the process of forming LDD regions in the NMOS regions, "As" ions are simultaneously implanted into the NMOS regions 54 and 56 at an energy of 10 keV and a dose of $5 \times 10^{14}$ ions/cm$^2$ while the resist pattern 200 is used as a mask (step 48).

Through the foregoing processing, a channel region 172, which has an impurity profile identical to that of the P-type island 194, is formed below the gate electrode 78 in the low voltage NMOS region 54, and a channel region 174, which has an impurity profile identical to that of the P-type island 196, is formed below the gate electrode 78 in the high voltage NMOS region 56. An LDD region 202 is formed across the channel region 172, and an LDD region 204 is formed across the channel region 174. The LDD region 202 has an impurity profile which is a synthesis of the profile of impurities within the P-type island 172 and the profile of impurities implanted into the LDD region 202. likewise, the LDD region 204 has an impurity profile which is a synthesis of the profile of impurities within the P-type island 174 and the profile of impurities implanted into the LDD region 204. Consequently, under the manufacturing method according to the third embodiment, different impurity profiles can be imparted to the LDD regions 202 and 204 while "BF$_2$" and "As" ions are implanted into the LDD regions 202 and 204 under identical conditions. Under the foregoing ion implantation conditions, the PN junction in each of the LDD regions 202 and 204 is formed to a depth of lm or less.

Figure 27A:
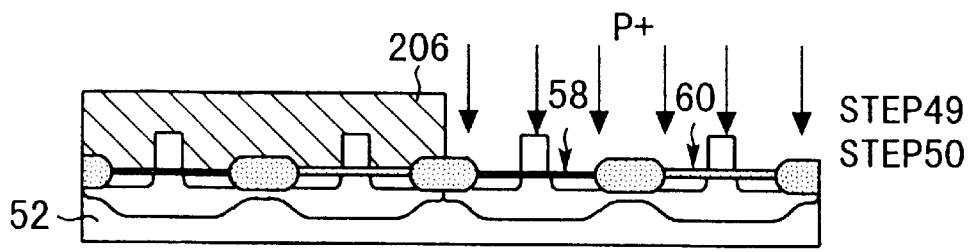
FIGS. 27A and 27B are sectional views for describing procedures of steps 49 through 51 for manufacturing the semiconductor device shown in FIG. 21.
Figure 27B:
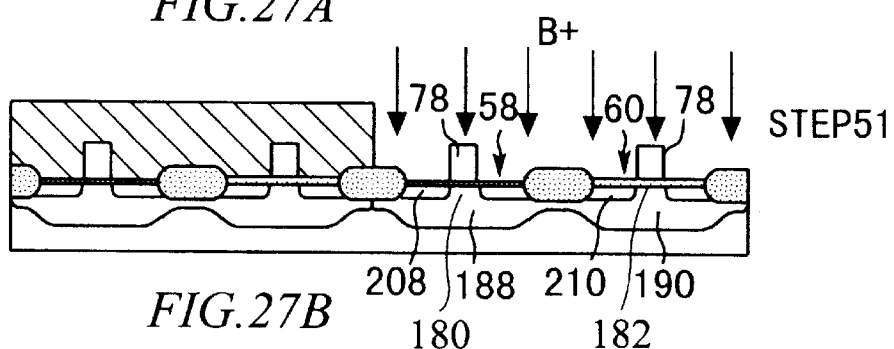
Figure 28A:
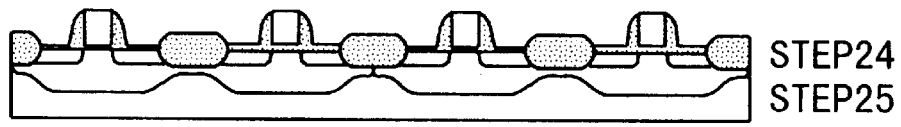
FIGS. 28A through 28C are sectional views for describing procedures of steps 24 through 29 for manufacturing the semiconductor device shown in FIG. 21.
Figure 28B:
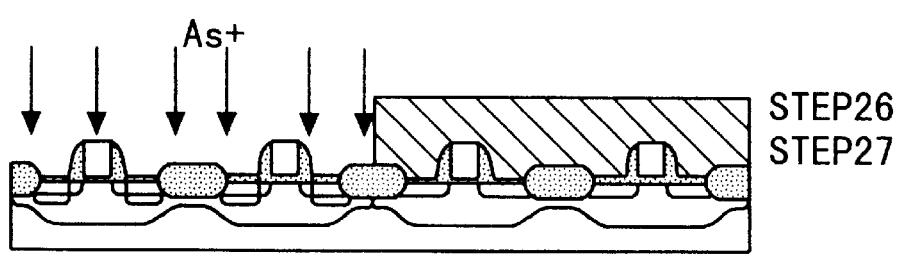
Figure 28C:
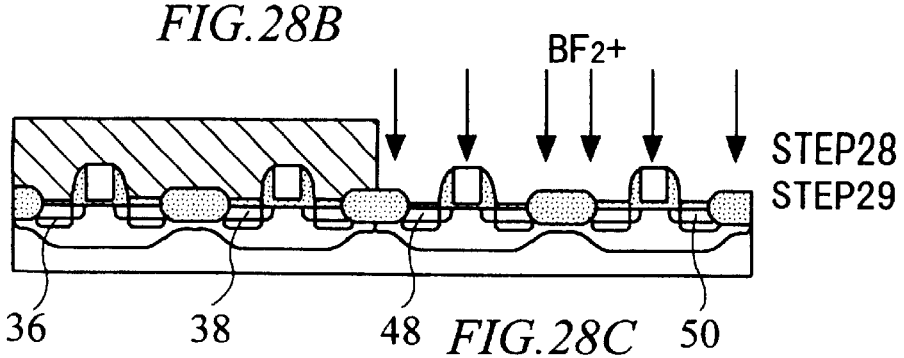

FIGS. 27A and 27B are cross-sectional views for describing formation of LDD regions in the N-type islands 188 and 190 within the PMOS regions 58 and 60.

As shown in FIG. 27A, during the process of forming LDD regions in the PMOS region, a resist pattern 206 is formed on the substrate 52 in such a way that an opening of the resist pattern 206 is situated on the PMOS regions 58 and 60 (step 49).

Subsequently, while the resist pattern 206 is used as a mask, "As" ions are simultaneously implanted into the PMOS regions 58 and 60 at an energy of 100keV and a dose of $2 \times 10^3$ ions/cm$^2$ (step 50).

As shown in FIG. 27B, during the process of forming LDD regions in the PMOS regions, "B" ions are simultaneously implanted into the PMOS regions 58 and 60 at an angle of 45° relative to an imaginary line perpendicular to the substrate 52 at an energy of 10 keV and a dose of $2 \times 10^{14}$ ions/cm$^2$ while the resist pattern 206 is used as a mask (step 51).

Through the foregoing processing, a channel region 180, which has an impurity profile identical to that of the N-type island 188, is formed below the gate electrode 78 in the low voltage PMOS region 58, and a channel region 182, which has an impurity profile identical to that of the N-type island 190, is formed below the gate electrode 78 in the high voltage PMOS region 60. Through the foregoing processing, LDD regions 208 and 210 are also formed on the both side of the channel regions 180 and 182 respectively. The LDD region 208 has an impurity profile which is a synthesis of the profile of impurities within the N-type island 188 and the profile of impurities implanted into the LDD region 208. likewise, the LDD region 210 has an impurity profile which is a synthesis of the profile of impurities within the N-type island 190 and the profile of impurities implanted into the LDD region 210. Consequently, under the manufacturing method according to the third embodiment, different impurity profiles can be imparted to the LDD regions 208 and 210 while "P" and "B" ions are implanted into the LDD regions 208 and 210 under identical conditions. Under the foregoing ion implantation conditions, the PN junction in each of the LDD regions 208 and 219 is formed to a depth of 1 μm or less.

FIGS. 28A to 28C and FIGS. 29A to 29D are cross-sectional views for describing the process of forming source/drain regions 36, 38, 48, 50, a salicide film 90, an oxide film 92, and contact holes 94. As shown in FIGS. 28A to 28C and FIGS. 29A to 29D, these constituent elements are fabricated through processing in steps 24 to 35, as in the case of the first embodiment (see FIGS. 8A to 8C and FIGS. 9A to 9D).

The aforementioned manufacturing method imparts different impurity profiles to the channel regions within the low voltage MOS regions 54 and 58 and the channel regions within the high voltage MOS regions 56 and 60, as well as imparting different impurity profiles to the LDDEX regions within the low voltage MOS regions 54 and 58 and the LDDEX regions of the high voltage MOS regions 56 and 60. The manufacturing method, therefore, enables the threshold voltages of the low voltage MOS transistors 12 and 16 to be set to a relevant voltage, enables the threshold voltages of the high voltage MOS transistors 14 and 18 to be set to another relevant voltage, and enables characteristics suitable for retarding hot carriers to be imparted to each of the MOS transistors.

Fourth Embodiment

A description will now be given of a fourth embodiment of the present invention with reference to FIGS. 30 through 38.

Figure 30:
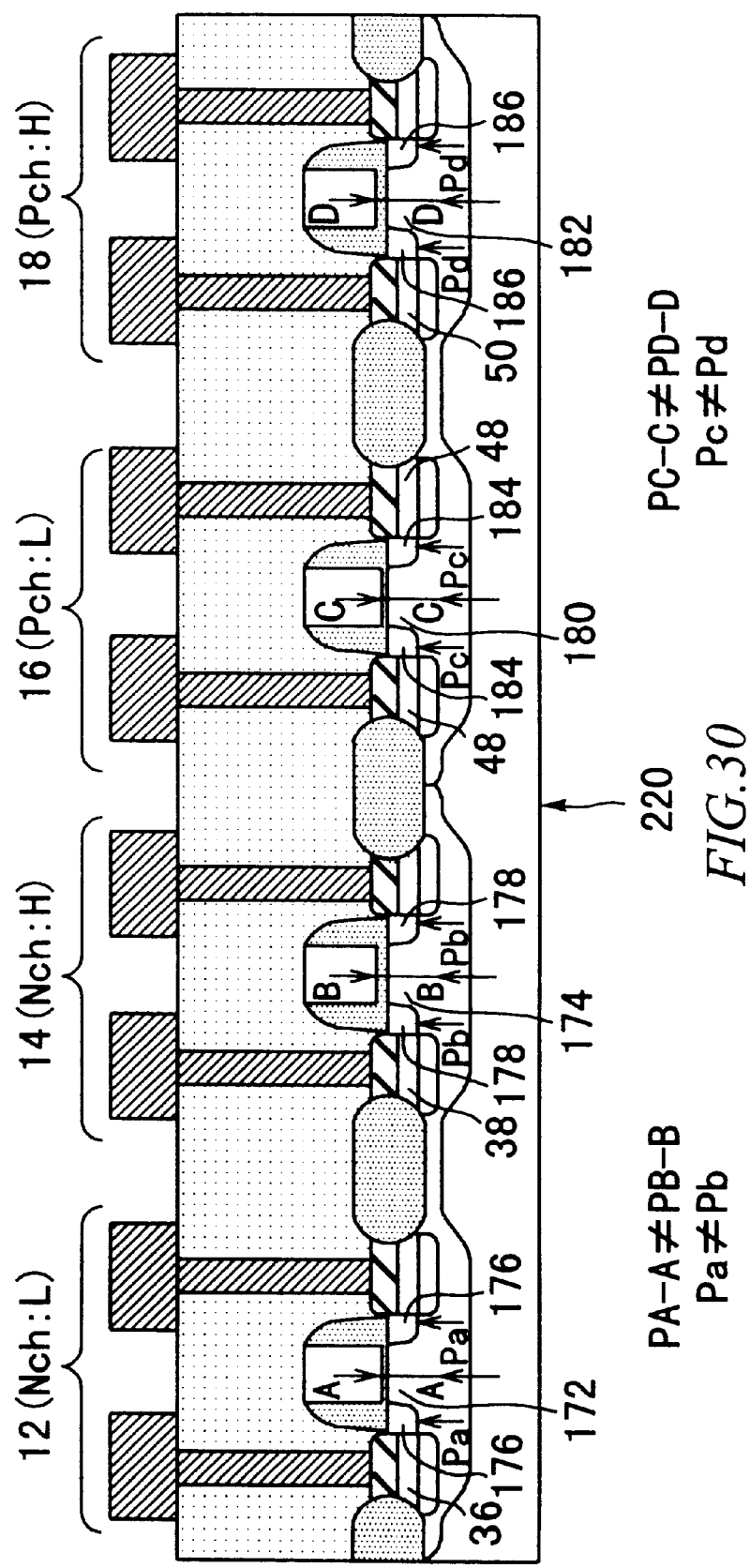
FIG. 30 is a sectional view of a semiconductor device practiced as a fourth embodiment of the present invention.
Figure 31:
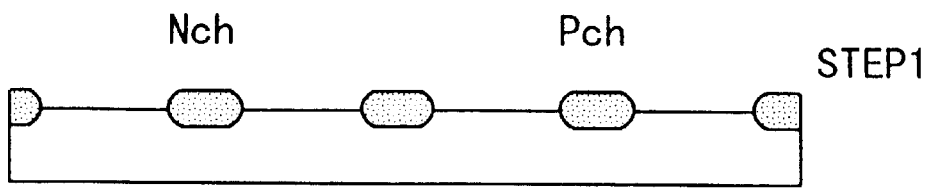
FIG. 31 is a sectional view for describing a procedure of step 1 for manufacturing the semiconductor device shown in FIG. 30.
Figure 32A:
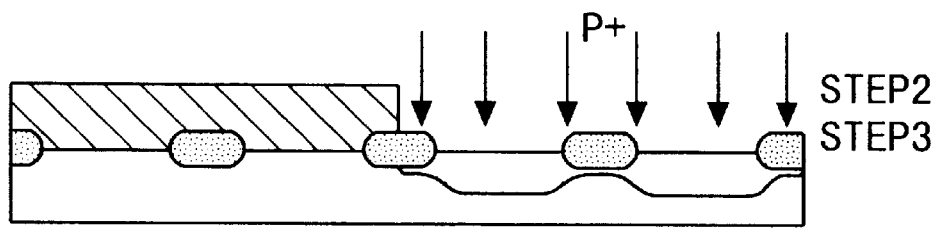
FIGS. 32A through 32C are sectional views for describing procedures of steps 2 through 4, 42 and 43 for manufacturing the semiconductor device shown in FIG. 30.
Figure 32B:
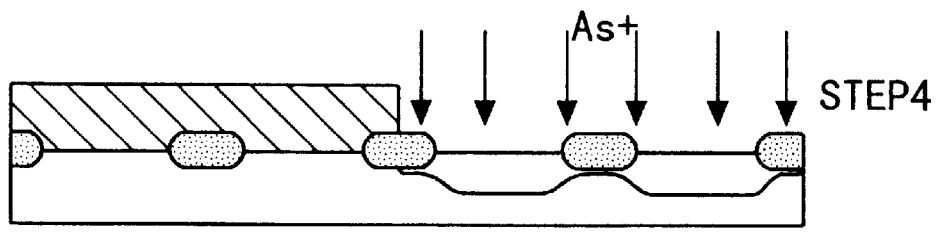
Figure 32C:
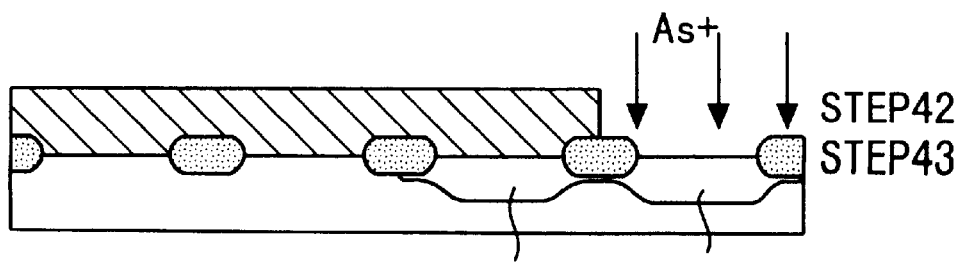
Figure 33A:
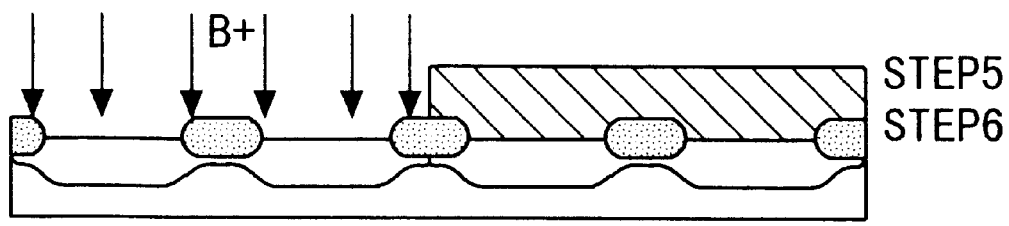
FIGS. 33A through 33D are sectional views for describing procedures of steps 5 through 8, 44 and 45 for manufacturing the semiconductor device shown in FIG. 30.
Figure 33B:
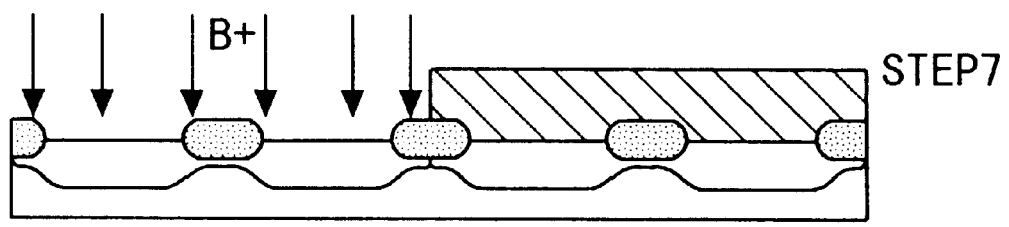
Figure 33C:
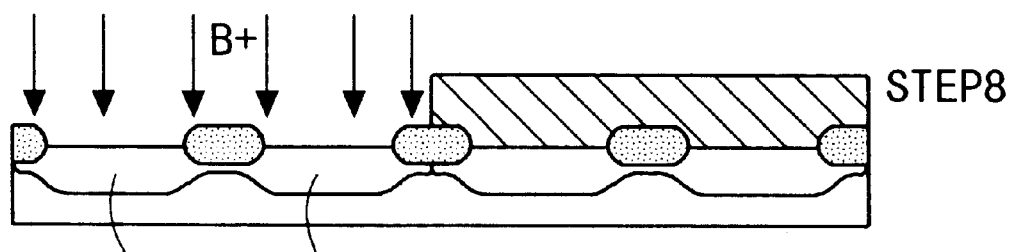
Figure 33D:
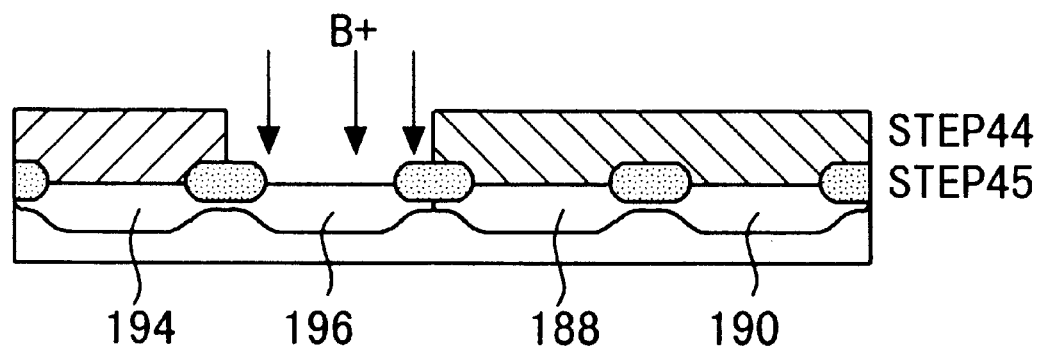
Figure 34:
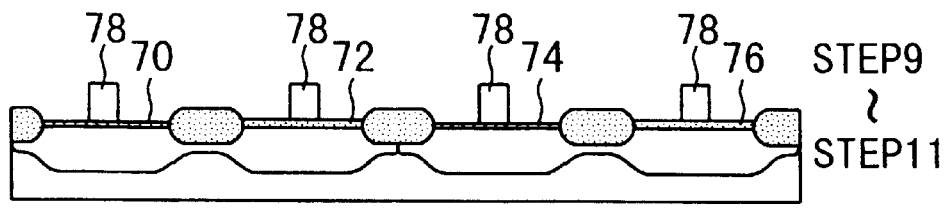
FIG. 34 is a sectional view for describing procedures of step 9 through 11 for manufacturing the semiconductor device shown in FIG. 30.
Figure 35A:
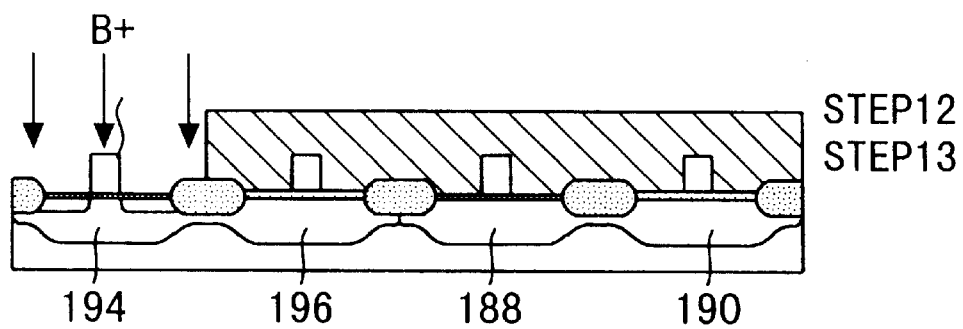
FIGS. 35A through 35D are sectional views for describing procedures of steps 12 through 17 for manufacturing the semiconductor device shown in FIG. 30.
Figure 35B:
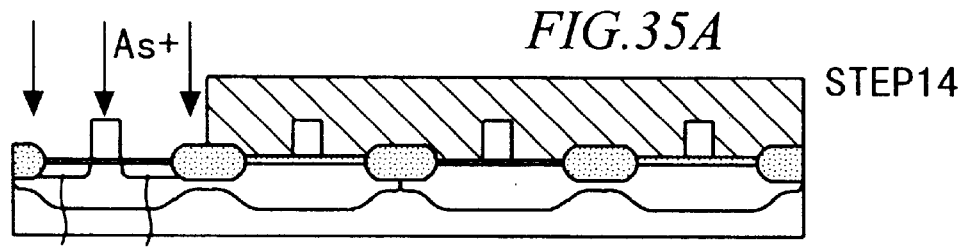
Figure 35C:
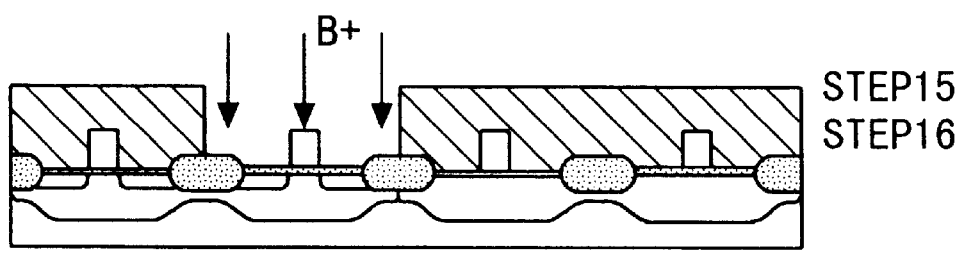
Figure 35D:
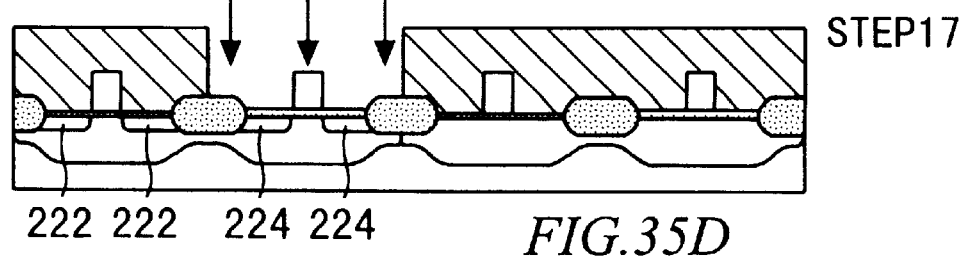
Figure 36A:
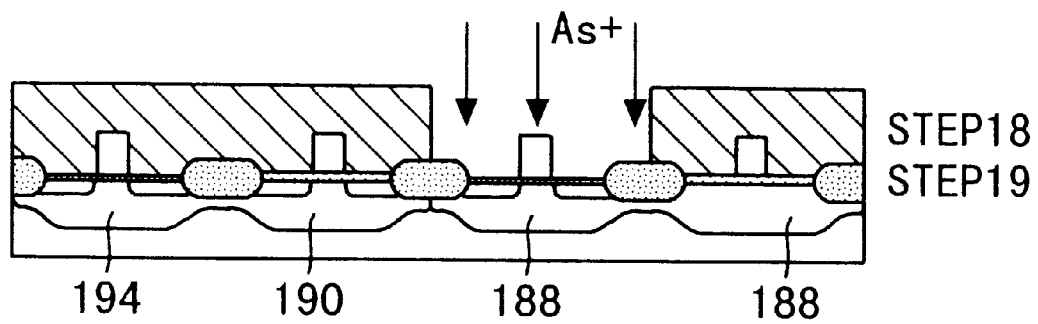
FIGS. 36A through 36D are sectional views for describing procedures of steps 18 through 23 for manufacturing the semiconductor device shown in FIG. 30.
Figure 36B:
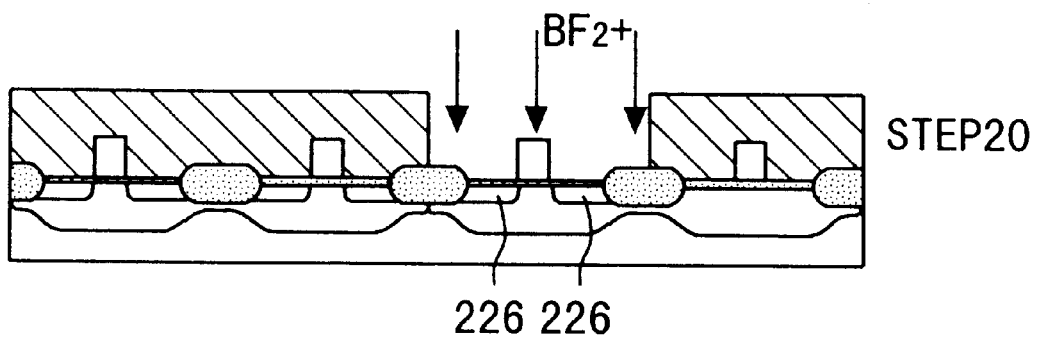
Figure 36C:
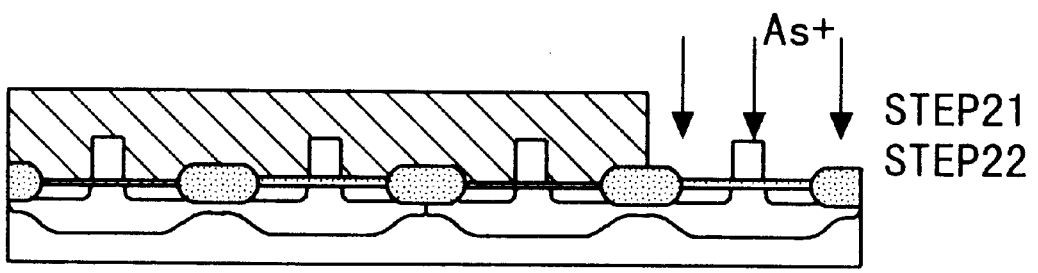
Figure 36D:
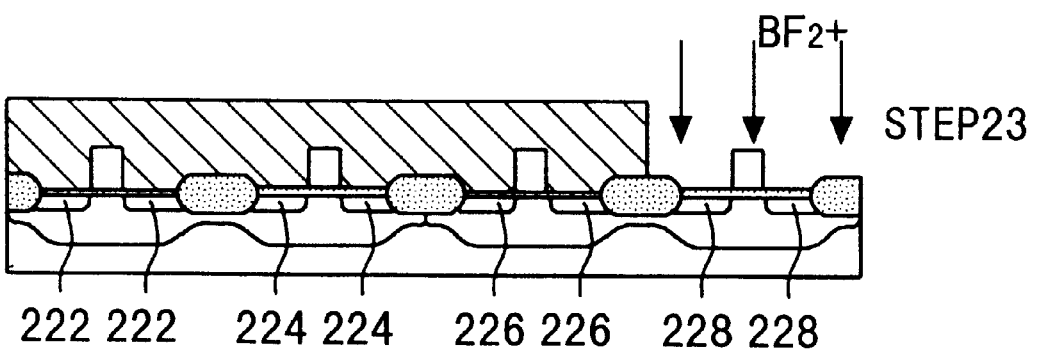
Figure 37A:
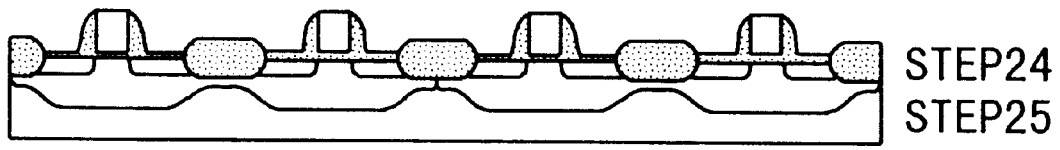
FIGS. 37A and 37C are sectional views for describing procedures of steps 24 through 29 for manufacturing the semiconductor device shown in FIG. 30.
Figure 37B:
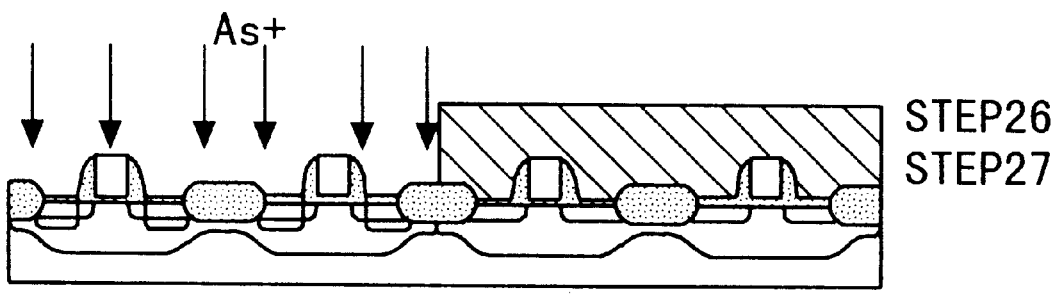
Figure 37C:
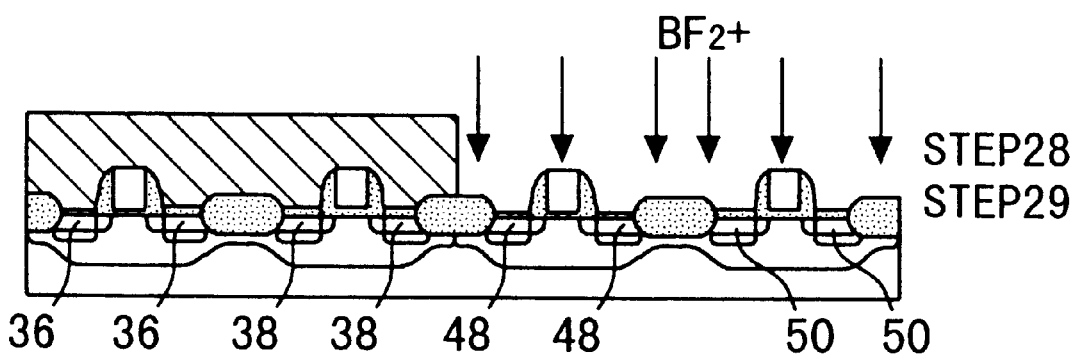
Figure 38A:
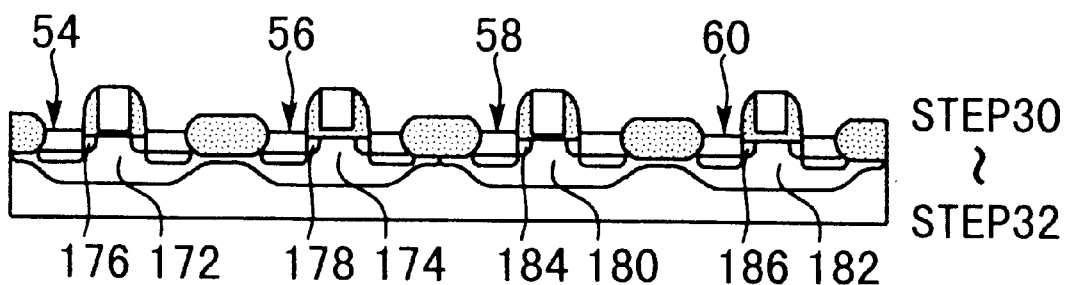
FIGS. 38A through 38D are sectional views for describing procedures of steps 30 through 35 for manufacturing the semiconductor device shown in FIG. 30.
Figure 38B:
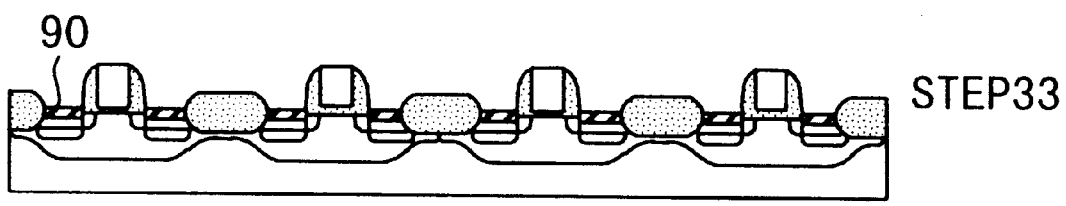
Figure 38C:
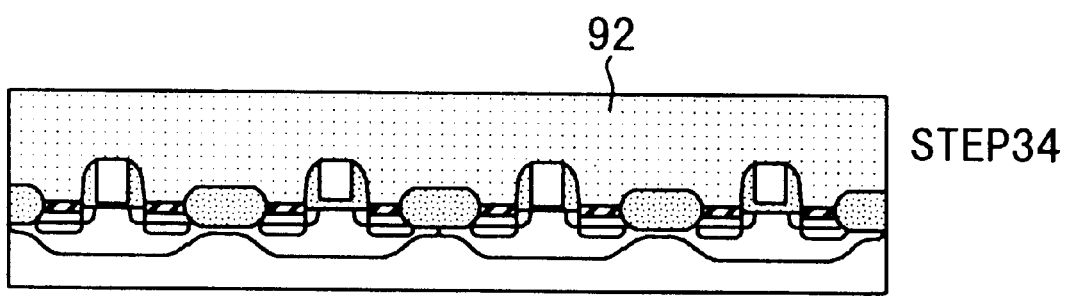
Figure 38D:
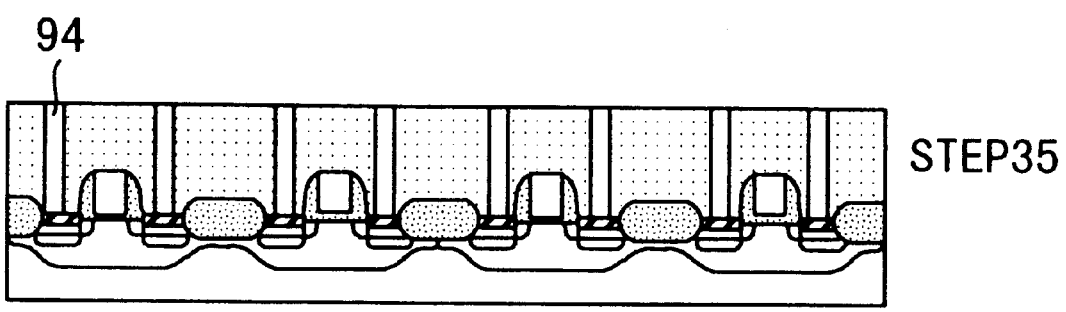

FIG. 30 is a cross-sectional view showing a semiconductor device 220 according to a fourth embodiment of the present invention. As in the case of the semiconductor device 170 according to the third embodiment, the semiconductor device 220 comprises a low voltage NMOS transistor 12, a high voltage NMOS transistor 14, a low voltage PMOS transistor 16, and a high voltage PMOS transistor 18, which are provided in a single chip.

As in the case of the third embodiment, the semiconductor device 220 has different impurity profiles within the channel regions of the low voltage MOS transistors 12 and 16 and within the channel regions of the high voltage MOS transistors 14 and 18 respectively(i.e., PA-A PC-C, and PB-B PD-D). Further, the semiconductor device 220 has different impurity profiles within the LDDEX regions of the low voltage MOS transistors 12 and 16 and within the LDDEX regions of the high voltage MOS transistors 14 and 18 respectively (i.e., Pa Pc, and Pb Pd).

As mentioned above, the third embodiment implants impurities into the islands within the low voltage MOS regions and the islands within the high voltage MOS regions under the different conditions, whereby the LDDEX regions of the low voltage MOS transistors and the LDDEX regions of the high voltage MOS transistors have different impurity profiles each other. In contrast, the fourth embodiment makes difference between the impurity profiles within the LDDEX regions of the low voltage MOS transistors and the LDDEX regions of the high voltage MOS transistors by changing conditions under which impurities are implanted into islands as well as changing conditions under which impurities are implanted into LDD regions.

A method of manufacturing the semiconductor device 220 according to the fourth embodiment will now be described by reference to FIGS. 31 to 38D.

FIGS. 31 through 34 are cross-sectional views for describing the process of forming on the substrate 52 of the semiconductor device 220 an isolation oxide film 53, islands 188, 190, 194, and 196, and gate structure. As shown in FIGS. 31 through 34, these constituent elements are formed through processing in steps 1 through 11 and processing in steps 42 to 45 as in the case of the third embodiment (see FIGS. 22 through 25).

FIGS. 35A through 35D and 36A through 36D are cross-sectional views for describing formation of LDD regions 222, 224, 226 and 228 in the islands 194, 196, 188 and 190, respectively. As shown in FIGS. 35A through 35D and 36A through 36D, the LDD regions 222 to 228 are formed through the processing in steps 12 through 23 (see FIGS. 6A to 6D and FIGS. 7A to 7D), as in the case of the first embodiment. Through the foregoing processing, the impurity profiles of the LDD regions 222 to 228 can be independently controlled. Under the foregoing conditions, the PN junction in each of the LDD regions 222 to 228 is formed to a depth of 1 μm or less.

FIGS. 37A to 37C and FIGS. 38A to 38D are cross-sectional views for describing the process of forming on the substrate 52 of the semiconductor device 220 source/drain regions 36, 38, 48, and 50, a salicide film 90, an oxide film 92, and contact holes 94. As shown in FIGS. 37A to 37C and FIGS. 38A to 38D, these constituent elements are formed through processing in steps 24 through 35 as in the case of the first embodiment (see FIGS. 8A to 8C and FIGS. 9A to 9D).

According to the foregoing manufacturing method, the impurity profile of the channel regions 172 and 180 within the low voltage MOS region 54 and 58 can be independently controlled apart from the impurity profile of the channel regions 174 and 182 within the high voltage MOS regions 56 and 60. Further, the foregoing manufacturing method enables to control the impurity profile of the LDDEX regions 176 and 184 within the low voltage MOS region 54 and 58 and the impurity profile of the LDDEX regions 178 and 186 within the high voltage MOS regions 56 and 60 independently each other. For this reason, compared with the manufacturing method according to the third embodiment, the fourth embodiment enables to set the threshold voltages of all the MOS transistors more accurately to desired voltages, as well as enabling to impart characteristics more suitable for retarding hot carriers to all the MOS transistors.

Fifth Embodiment

A fifth embodiment of the present invention will now be described by reference to FIGS. 39 to 45B.

Figure 39:
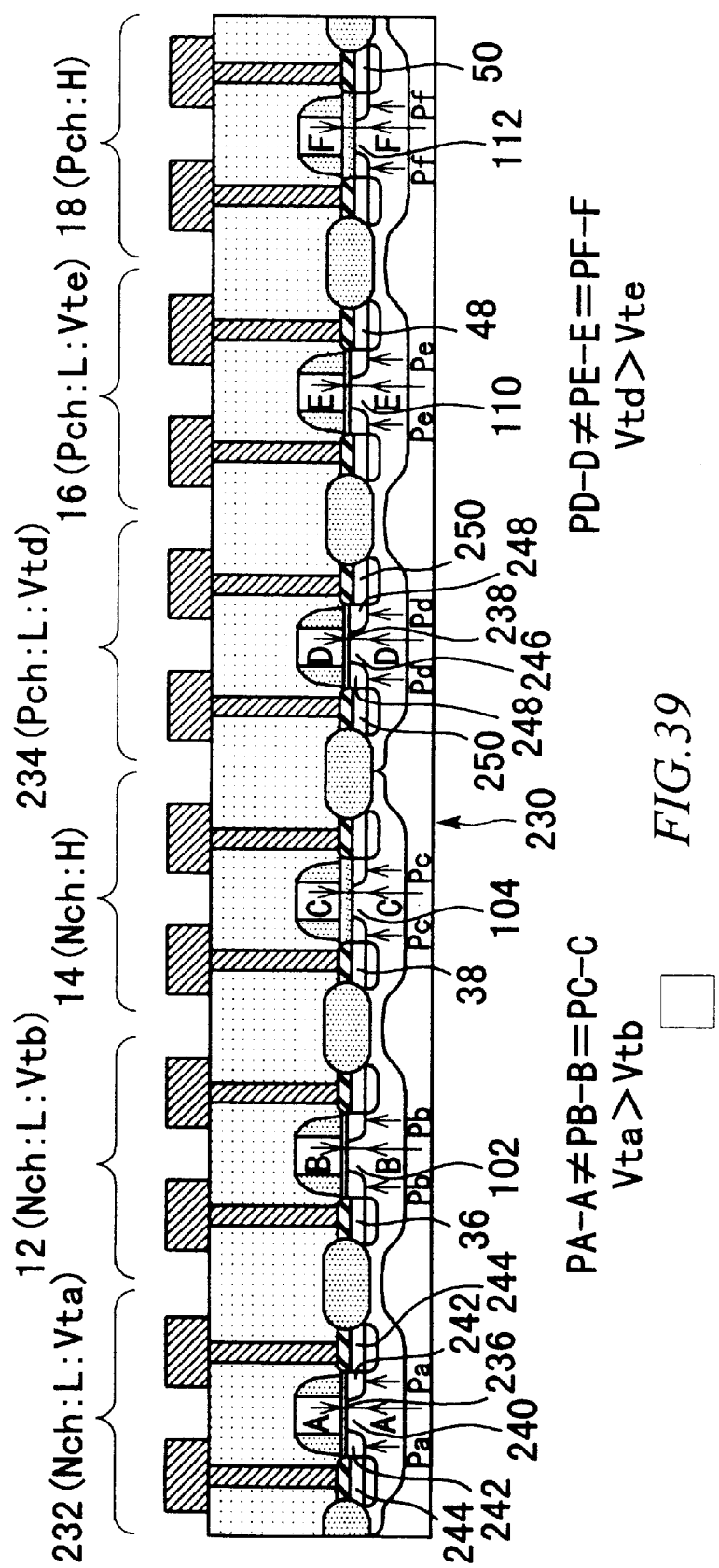
FIG. 39 is a sectional view of a semiconductor device practiced as a fifth embodiment of the present invention.

FIG. 39 is a cross-sectional view showing a semiconductor device 230 according to a fifth embodiment of the present invention. As with the semiconductor device 100 according to the first embodiment, the semiconductor device 230 comprises in a single chip a low voltage NMOS transistor 12, a high voltage NMOS transistor 14, a low voltage PMOS transistor 16, and a high voltage PMOS transistor 18. The semiconductor device 230 according to the fifth embodiment further comprises a low voltage NMOS transistor 232 and a low voltage PMOS transistor 234.

The low voltage NMOS transistor 232 and the low voltage PMOS transistor 234 are used as a portion of circuitry—which exchanges signals within solely inside of the semiconductor device 230—such as a logic circuit incorporated in the semiconductor device 230, as in the case of the low voltage NMOS transistor 12 and the low voltage PMOS transistor 16. These transistors will be hereinafter referred to simply as "low voltage MOS transistors 232 and 234." As in the case of the low voltage MOS transistors 12 and 16, the low voltage NMOS transistors 232 and 234 comprises thin-film gate oxide films 236 and 238 both having a thickness of about 3.0 nm respectively.

The low voltage NMOS transistor 232 has a P-type channel region 240 formed below the gate oxide film 236. On each side of the channel region 240 is an N-type LDDEX region 242. Further, an N-type source/drain (S/D) region 244 is formed outside of the LDDEX region 242. Similarly, the low voltage PMOS transistor 234 has an N-type channel region 246 formed below the gate oxide film 238, an N-type LDDEX region 248 formed across the channel region 246 and an N-type source/drain (S/D) region 250 formed outside of the LDDEX region 248.

In the semiconductor device 230 according to the fifth embodiment, an impurity profile—which differs from that of the channel region 102 of the low voltage NMOS transistor 12 and that of the channel region 104 of the high voltage NMOS transistor 14—is imparted to the channel region 240 of the low voltage NMOS transistor 232. More specifically, as shown in FIG. 39, the impurity profiles of the channel regions of the NMOS regions in the semiconductor device 230 are set so as to satisfy the relationship of PA-A PB-B=PC-C. Further, an impurity profile—which differs from that of the channel region 110 of the low voltage PMOS transistor 16 and that of the channel region 112 of the high voltage PMOS transistor 18—is imparted to the channel region 246 of the low voltage PMOS transistor 234. More specifically, as shown in FIG. 39, the impurity profiles of the channel regions of the PMOS regions in the semiconductor device 230 are set so as to satisfy the relationship of PD-D PE-E=PF-F.

More specifically, in the fifth embodiment, the impurity profile of the channel region 240 of the low voltage NMOS transistor 232 is set in such a way that the threshold voltage Vta of the NMOS transistor 232 becomes larger than the threshold voltage Vtb of the low voltage NMOS transistor 12. Further, the impurity profile of the channel region 246 of the low voltage PMOS transistor 234 is set in such a way that the threshold voltage Vtd of the PMOS transistor 234 becomes greater than that of the threshold voltage of the low voltage PMOS transistor 16. Consequently, two types of circuits capable of operation at different threshold voltages can be formed within the semiconductor device 230.

A method of manufacturing the semiconductor device 230 according to the fifth embodiment will now be described by reference to FIG. 40 through FIGS. 46A to 46C.

Figure 40:
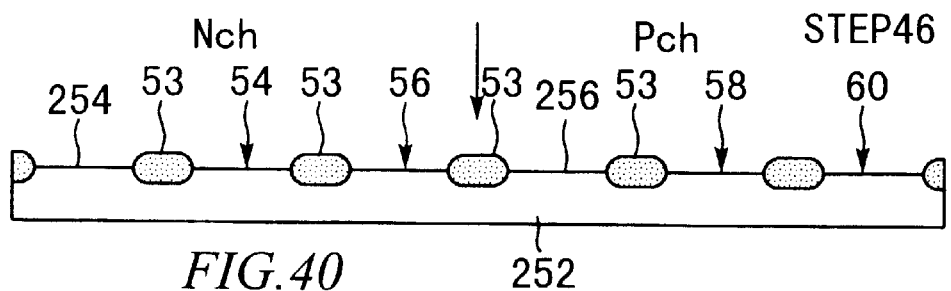
FIG. 40 is a sectional view for describing a procedure of step 46 for manufacturing the semiconductor device shown in FIG. 39.

FIG. 40 is a cross-sectional view showing a substrate 252 of the semiconductor device 230. As shown in FIG. 40, during the process of manufacturing the semiconductor device 230, an isolation oxide film 53 is formed on the substrate 252 to a thickness of 300 nm (step 46). By means of presence of the isolation oxide film 53, the surface of the substrate 252 is divided into a low voltage NMOS region 54, a high voltage NMOS region 56, a low voltage PMOS region 58, a high voltage NMOS region 60, a low voltage NMOS region 254, and a low voltage PMOS region 256. Through processing, which will be described later, the low voltage NMOS transistor 12 is formed within the low voltage NMOS region 54; the high voltage NMOS transistor 14 is formed within the high voltage NMOS region 56; the low voltage PMOS transistor 16 is formed within the low voltage PMOS region 58; the high voltage PMOS transistor 18 is formed within the high voltage NMOS region 60; the low voltage NMOS transistor 232 is formed within the low voltage NMOS region 254; and the low voltage PMOS region 234 is formed within the low voltage PMOS region 256.

FIGS. 41A to 41D are cross-sectional views for describing formation of an N-type islands 257, 258, and 259 in the PMOS regions 256, 58, and 60 of the substrate 252.

Figure 41A:
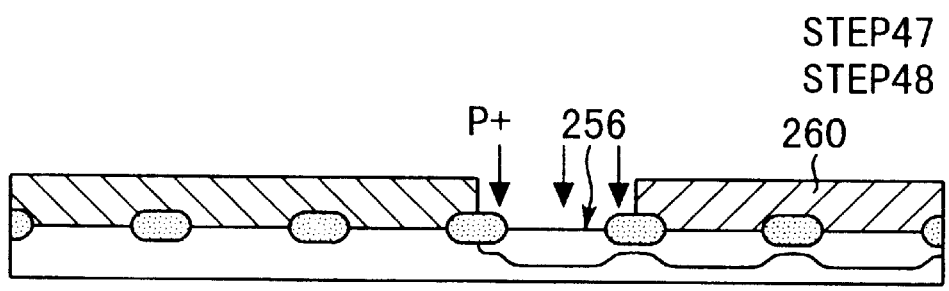
FIGS. 41A through 41D are sectional views for describing procedures of steps 47 through 52 for manufacturing the semiconductor device shown in FIG. 39.

As shown in FIG. 41A, during the process of forming N-type islands, a resist pattern 260 is formed on the substrate 252 by means of photolithography in such a way that an opening of the resist pattern 260 is situated on the low voltage PMOS region 256 (step 47).

Figure 41B:
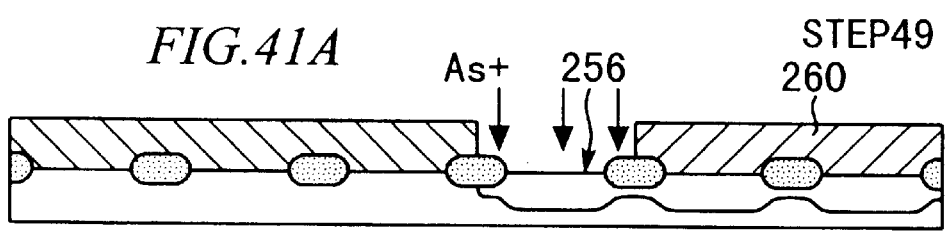

As shown in FIGS. 41A and 41B, "P" and "As" ions are sequentially implanted into the low voltage PMOS region 256 while the resist pattern 260 is used as a mask (steps 48 and 49).

Figure 41C:
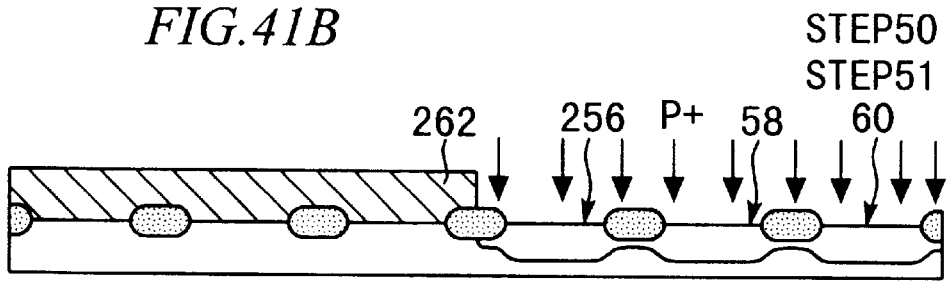

As shown in FIG. 41C, during the process of forming N-type islands, a resist pattern 262 is formed on the substrate 252 by means of photolithography in such a way that an opening of the resist pattern 262 is situated on the PMOS regions 256, 58, and 60 (step 50).

Figure 41D:
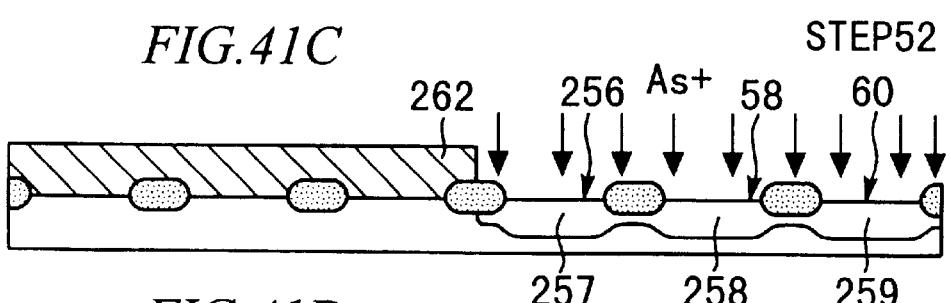

As shown in FIGS. 41C and 41D, "P" and "As" ions are sequentially implanted into all the PMOS regions 256, 58, and 60 while the resist pattern 262 is used as a mask (steps 51 and 52). During the course of the foregoing processing, "P" ions are implanted at an energy of 360 keV and a dose of $6\times10^{12}$ions/cm$^2$, and "As" ions are implanted at an energy of 140 keV and a dose of $9\times10^2$ions/cm$^2$.

Through the processing, the N-type islands 258 and 259 both of which equally have a predetermined impurity profile are formed within the low voltage PMOS region 58 and high voltage PMOS region 60, while the N-type island 257, which has an impurity profile differing from those of the islands 258 and 259, is formed within the low voltage PMOS region 256.

FIGS. 42A through 42F are cross-sectional views for describing formation of P-type islands 263, 264, and 265 in the NMOS regions 254, 54, and, 56 of the substrate 252.

Figure 42A:
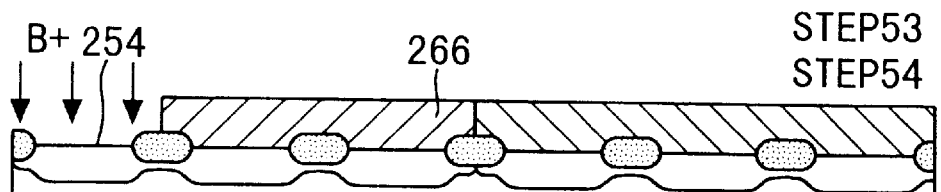
FIGS. 42A through 42F are sectional views for describing procedures of steps 53 through 60 for manufacturing the semiconductor device shown in FIG. 39.

As shown in FIG. 42A, during the process of forming P-type islands, a resist pattern 266 is formed on the substrate 51 by means of photolithography in such a way that an opening of the resist pattern 266 is situated on the low voltage NMOS region 254 (step 53).

Figure 42B:
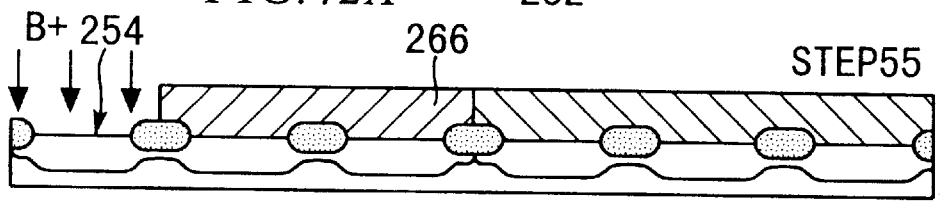
Figure 42C:
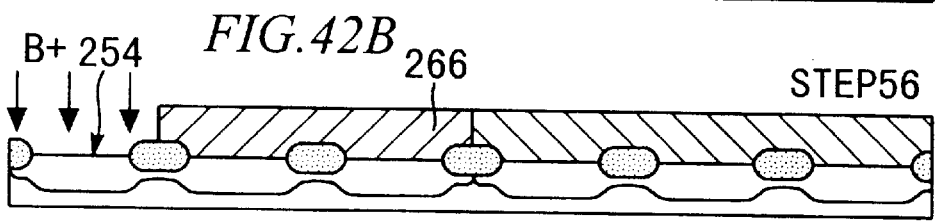

As shown in FIGS. 42A through 42C, "B" ions are implanted into the low voltage NMOS region 254 under first through third differing conditions in a phased manner(steps 54 to 56).

Figure 42D:
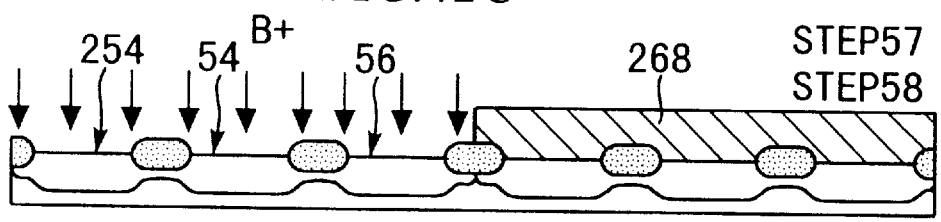

As shown in FIG. 42D, during the process of forming P-type islands, a resist pattern 268 is formed on the substrate 252 by means of photolithography in such a way that an opening of the resist pattern 268 is situated on the NMOS regions 254, 54, and 56 (step 57).

Figure 42E:
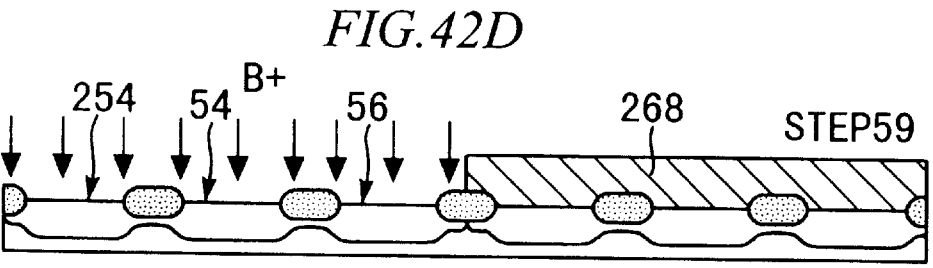
Figure 42F:
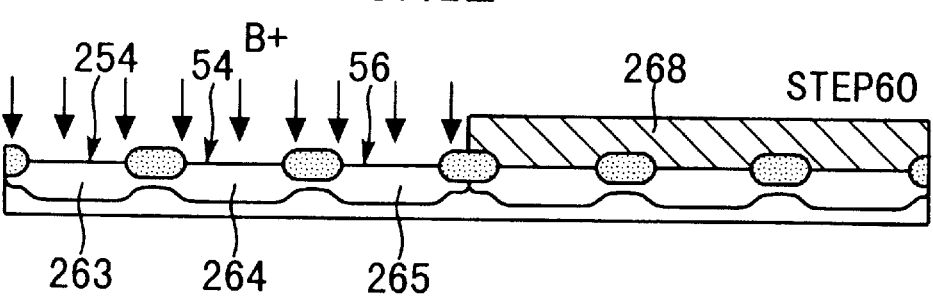

As shown in FIGS. 42D through 42F, while the resist pattern 268 is used as a mask, "B" ions are implanted into all the NMOS regions 254, 54, and 56 of the substrate 252 under first through third differing conditions in a phased manner (steps 58 through 60). During the first stage of ion implantation, "B" ions are implanted at an energy of 250 keV and a dose of $3\times10^{12}$ions/cm$^2$. During the second stage of ion implantation, "B" ions are implanted at an energy of 140 keV and a dose of $3\times10^{12}$ions/cm$^2$. During the third stage of ion implantation, "B" ions are implanted at an energy of 50 keV and a dose of $9\times10^2$ions/cm$^2$.

Through the processing, the P-type islands 264 and 265 both of which equally have a predetermined impurity profile are formed within the low voltage NMOS region 54 and high voltage NMOS region 56, while the P-type island 263, which has an impurity profile differing from those of the islands 264 and 265, is formed within the low voltage NMOS region 254.

Figure 43:
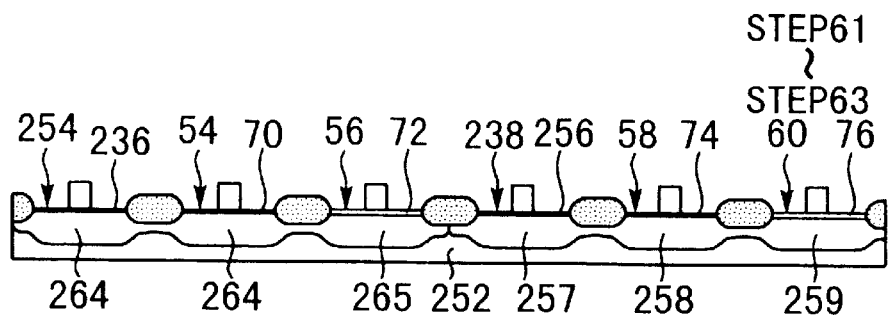
FIG. 43 is a sectional view for describing procedures of step 61 through 63 for manufacturing the semiconductor device shown in FIG. 39.

FIG. 43 is a cross-sectional view showing the formation of gate structure of the MOS transistor.

During the process of forming gate structures, the resist pattern 268 is removed at first (step 61).

Through thermal oxidation, an oxide films 74 and 76 having a thickness of about 7.5 nm is formed on the surface of the high voltage MOS regions 56 and 60, whereas oxide films 70, 74, 236, and 238 having a thickness of about 3.0 nm is formed on the surface of the low voltage MOS regions 54, 58, 254, and 256 (step 62).

Subsequently, polysilicon is deposited on the oxide films 70, 72, 74, 76, 236, and 238, and the thus-deposited polysilicon is patterned, thereby the gate electrodes 78 are formed (step 63).

Figure 44A:
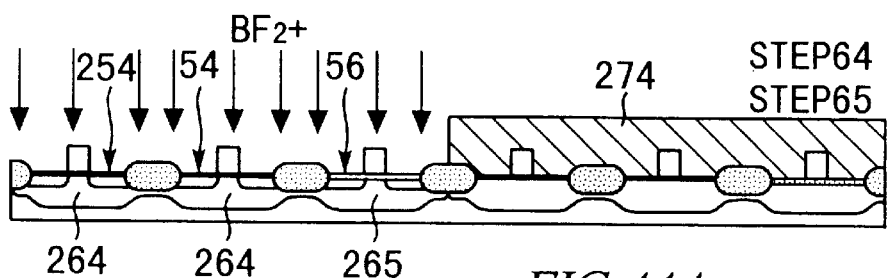
FIGS. 44A and 44B are sectional views for describing procedures of steps 64 through 66 for manufacturing the semiconductor device shown in FIG. 39.
Figure 44B:
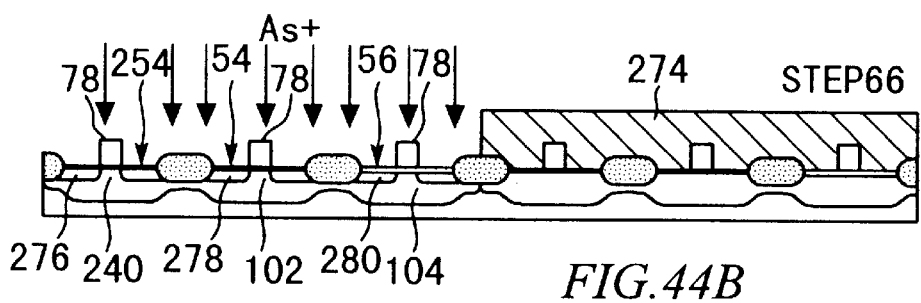

FIGS. 44A and 44B are cross-sectional views for describing formation of LDD regions in the P-type islands 263, 264, and 265 within the NMOS regions 254, 54, and 56.

As shown in FIG. 44A, during the process of forming LDD regions in the NMOS regions, a resist pattern 274 is formed on the substrate 252 in such a way that an opening of the resist pattern 274 is situated on the NMOS regions 254, 54, and 56 (step 64).

While the resist pattern 274 is used as a mask, "B" ions are simultaneously implanted into all the NMOS regions 254, 54, and 56 at an angle of 45° relative to an imaginary line perpendicular to the substrate 252 at an energy of 14 keV and a dose of $2 \times 10^3 ions/cm^2$ (step 65).

Subsequently, as shown in FIG. 44B, during the process of forming an LDD region in the NMOS region, As ions are simultaneously implanted into all the NMOS regions 254, 54, and 56 at an energy of 10 keV and a dose of $5 \times 10^4 ions/cm^2$ (step 66).

Through the foregoing processing, the channel region 240, which has an impurity profile identical to that of the P-type island 263, is formed below the gate electrode 78 of the NMOS region 254; the channel region 102, which has an impurity profile identical to that of the P-type island 264, is formed below the gate electrode 78 of the NMOS region 54; and the channel region 104, which has an impurity profile identical to that of the P-type island 265, is formed below the gate electrode 78 of the NMOS region 56. Through the foregoing processing LDD regions 276, 278, and 280 are also formed respectively across the channel region 240, 102, and 104. The threshold voltage of the NMOS transistor becomes greater as impurity concentrations of the channel region increase. The foregoing processing imparts a higher impurity concentration to the channel regions 240 and 246 of the low voltage MOS transistors 232 and 234 than that of the channel regions 102 and 110 of the other low voltage MOS transistors 12 and 16. The fifth embodiment, therefore, enables the threshold voltage Vta of the low voltage NMOS transistor 232 to be set so as to be greater than the threshold voltage Vtb of the low voltage NMOS transistor 12.

Figure 45A:
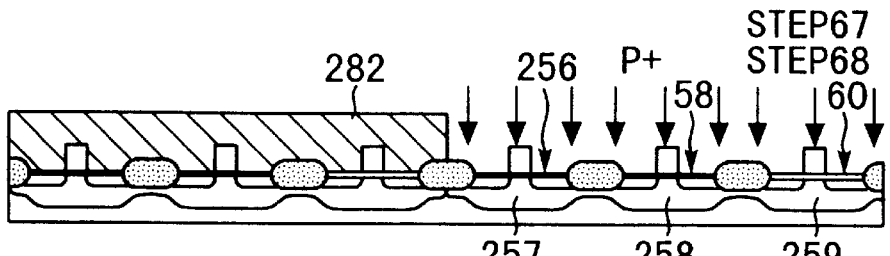
FIGS. 45A and 45B are sectional views for describing rocedures of steps 67 through 69 for manufacturing the semiconductor device shown in FIG. 39.
Figure 45B:
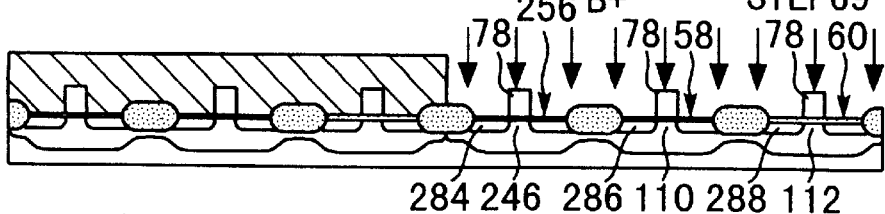
Figure 46A:
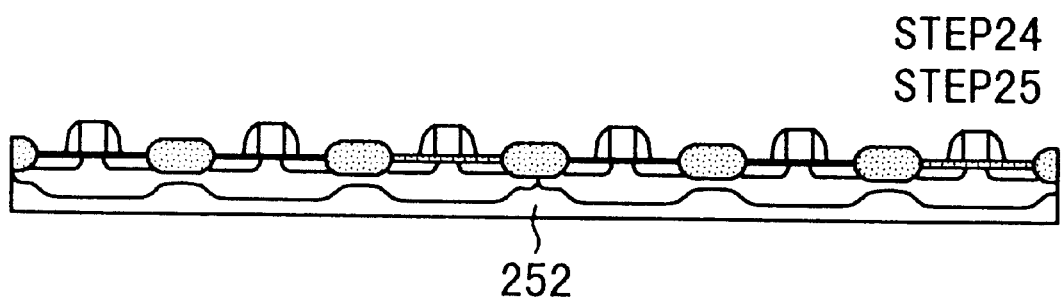
FIGS. 46A and 46C are sectional views for describing procedures of steps 24 through 29 for manufacturing the semiconductor device shown in FIG. 39.
Figure 46B:
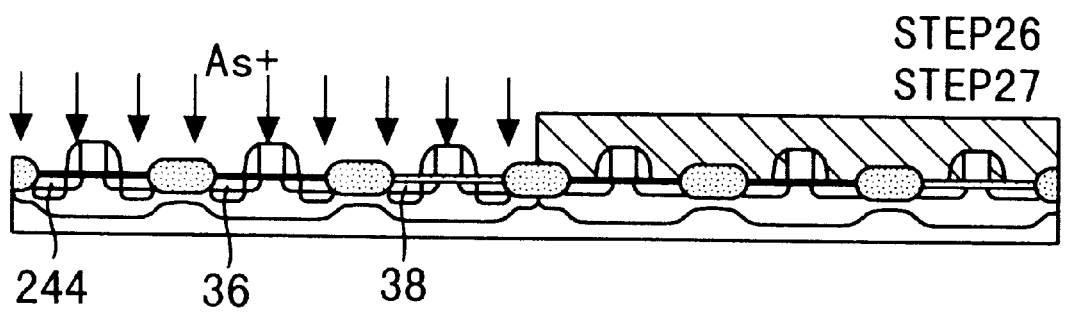
Figure 46C:
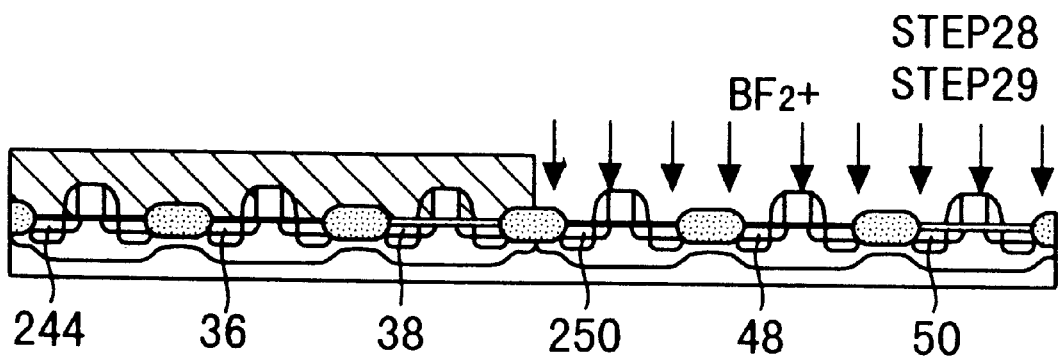
Figure 47A:
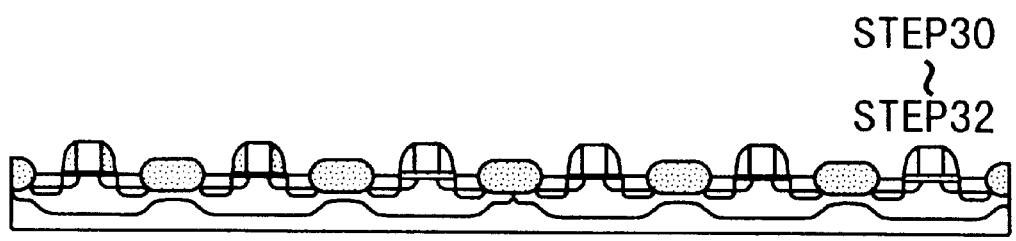
FIGS. 47A through 47D are sectional views for describing procedures of steps 30 through 35 for manufacturing the semiconductor device shown in FIG. 39.
Figure 47B:
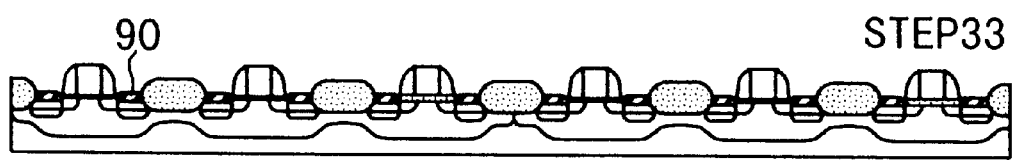
Figure 47C:
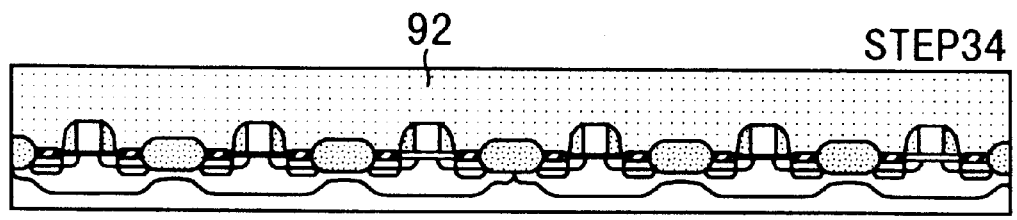
Figure 47D:
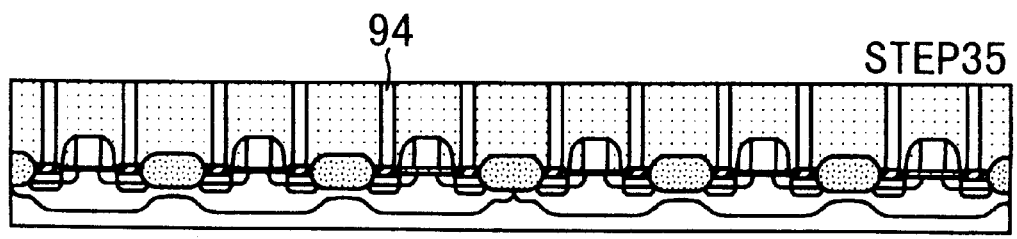

FIGS. 45A and 45B are cross-sectional views for describing formation of LDD regions in the N-type islands 257, 258, and 259 within the PMOS regions 256, 58, and 60.

As shown in FIG. 45A, during the process of forming LDD regions in the PMOS regions, a resist pattern 282 is formed on the substrate 252 in such a way that an opening of the resist pattern 282 is situated on the PMOS regions 256, 58, and 60 (step 67).

While the resist pattern 282 is used as a mask, "As" ions are simultaneously implanted into all the PMOS regions 256, 58, and 60 at an angle of 45° relative to an imaginary line normal to the substrate 252 at an energy of 100 keV and a dose of $2 \times 10^{13} ions/cm^2$ (step 68).

Subsequently, as shown in FIG. 45B, during the process of forming LDD regions in the PMOS regions, "$BF_2$" ions are simultaneously implanted into all the PMOS regions 256, 58, and 60 at an energy of 10 keV and a dose of $5 \times 10^{14} ions/cm^2$ (step 69).

Through the foregoing formation, the channel region 246, which has an impurity profile identical to that of the N-type island 257, is formed within the PMOS region 256; the channel region 110, which has an impurity profile identical to that of the N-type island 258, is formed within the PMOS region 58; and the channel region 112, which has an impurity profile identical to that of the N-type island 259, is formed within the PMOS region 60. Further, LDD regions 284, 286, and 288 are respectively formed across the channel regions 246, 110, and 112. Threshold voltage of a PMOS transistor becomes greater as impurity concentrations of the channel region increase. Through the foregoing processing, the channel region 246 of the low voltage PMOS transistor 234 is imparted with impurity concentrations which are larger than that of the channel region 110 of the low voltage PMOS transistor 16. The fifth embodiment, therefore, enables the threshold voltage Vtd of the low voltage PMOS transistor 234 to be set so as to be greater than the threshold voltage Vte of the low voltage PMOS transistor 16.

FIGS. 46A through 47D are cross-sectional views for describing the process of forming source/drain regions 244, 36, 38, 250, 48, and 50, a salicide film 90, an oxide film 92, and contact holes 94 on the substrate 252 of the semiconductor device 220. As shown in FIGS. 46A through 47D, these constituent elements are formed through processing in steps 24 through 35 as in the case of the first embodiment (see FIGS. 8A to 8C and FIGS. 9A to 9D).

As mentioned above, the manufacturing method according to the fifth embodiment enables imparting of the low voltage MOS transistors 12 and 16 with a threshold voltage differing from that imparted to the low voltage MOS transistors 232 and 234. Accordingly, compared with the former semiconductor devices 100, 160, 170, and 220, the semiconductor device 230 manufactured by the fifth embodiment can perform superior functions.

In the fifth embodiment, all the LDD regions of the NMOS transistors are imparted with impurities under identical condition, as well as all the LDD regions of the PMOS transistors are imparted with impurities under identical condition. However, the present invention is not limited to such an embodiment. Impurities may be implanted into the LDD regions of the high voltage MOS transistors under conditions which are independent of those under which impurities are implanted into the LDD regions of the low voltage MOS transistors. With such settings, as in the case of the first through fourth embodiments, hot carriers can be effectively prevented from arising in both the high voltage MOS transistors and the low voltage MOS transistors, as well as being capable of formation of low voltage MOS transistors having different threshold voltages within the semiconductor device 230.

Sixth Embodiment

A sixth embodiment of the present invention will now be described by reference to FIG. 48 through 56D.

Figure 48:
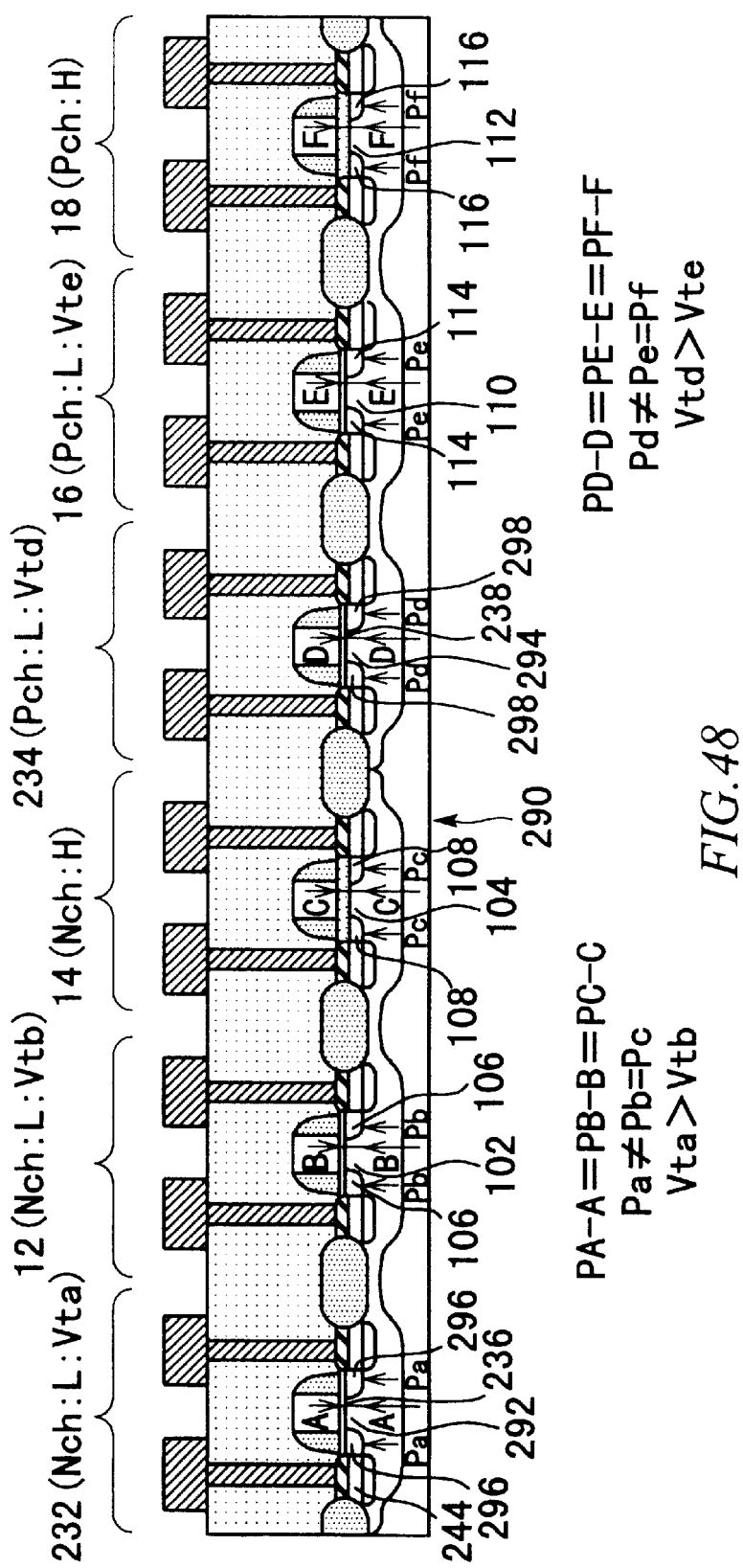
FIG. 48 is a sectional view of a semiconductor device practiced as a sixth embodiment of the present invention.

FIG. 48 is a cross-sectional view showing a semiconductor device 290 according to the sixth embodiment. As in the case of the semiconductor device 230 according to the fifth embodiment, the semiconductor device 290 comprises in a single chip a low voltage NMOS transistor 12, a high voltage NMOS transistor 14, a low voltage PMOS transistor 16, a high voltage PMOS transistor 18, a low voltage NMOS transistor 232, and a low voltage PMOS transistor 234.

The low voltage NMOS transistor 232 and 234 have channel regions 292 and 294 formed below the gate electrodes 78 respectively. According to the sixth embodiment, the channel region 292 of the low voltage NMOS transistor 232 is imparted with an impurity profile equal to that of the channel regions 102 and 104 of the NMOS transistor 12 and 14 (i.e., PA-A=PBB=PC-C). Likewise, the channel region 294 of the low voltage PMOS transistor 234 is imparted with an impurity profile equal to that of the channel regions 110 and 112 of the PMOS transistors 16 and 18 (i.e., PD-D=PE-E=PF-F).

In the low voltage NMOS transistor 232, an LDDEX region 296 is formed across the channel region 292. Similarly, in the low voltage PMOS transistor 234, an LDDEX region 298 is formed across the channel region 294. According to the sixth embodiment, the LDDEX region 296 of the low voltage NMOS transistor 232 is imparted with an impurity profile differing from that of the LDDEX regions 106 and 108 of other NMOS transistors 12 and 14 (i.e., Pa Pb=Pc). Further, the LDDEX region 298 of the low voltage PMOS transistor 234 is imparted with an impurity profile differing from that of the LDDEX regions 110 of other PMOS transistors 16 and 18 (i.e., Pd Pe=Pf).

More specifically, in the semiconductor device 290 according to the sixth embodiment, the impurity profile of the LDDEX region 296 of the low voltage NMOS transistor 232 is set such that the threshold voltage Vta of the same becomes greater than the threshold voltage Vtb of the other low voltage NMOS transistor 12. Similarly, the impurity profile of the LDDEX region 298 of the low voltage PMOS transistor 234 is set such that the threshold voltage Vtd of the same becomes greater than the threshold voltage Vte of the other low voltage PMOS transistor 16. As a result, two types of circuits capable of operation at different threshold voltages can be fabricated in the semiconductor device 290.

A method of manufacturing the semiconductor device 290 according to the sixth embodiment of the present invention will now be described by reference to FIGS. 49 through 56D.

Figure 49:
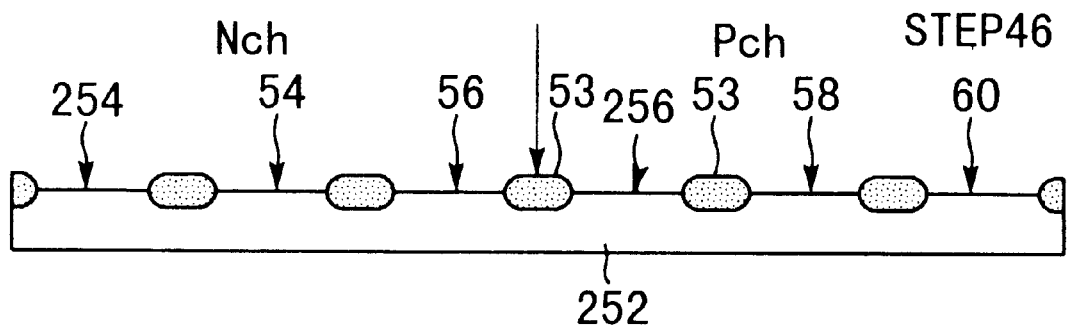
FIG. 49 is a sectional view for describing a procedure of step 46 for manufacturing the semiconductor device shown in FIG. 48.

FIG. 49 is a cross-sectional view for describing formation of an isolation film 53 on the substrate 252 of the semiconductor device 290. As shown in FIG. 49, as in the case of the fifth embodiment, the isolation oxide film 53 is formed through the processing in step 46 (see FIG. 40).

Figure 50A:
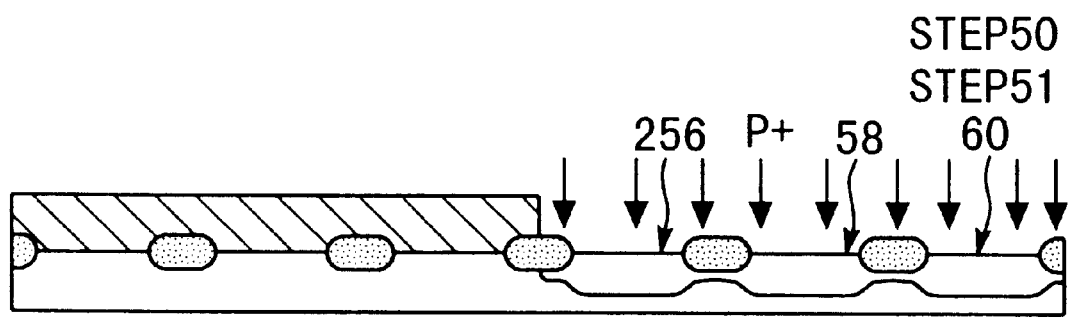
FIGS. 50A and 50B are sectional views for describing procedures of steps 50 through 52 for manufacturing the semiconductor device shown in FIG. 48.
Figure 50B:
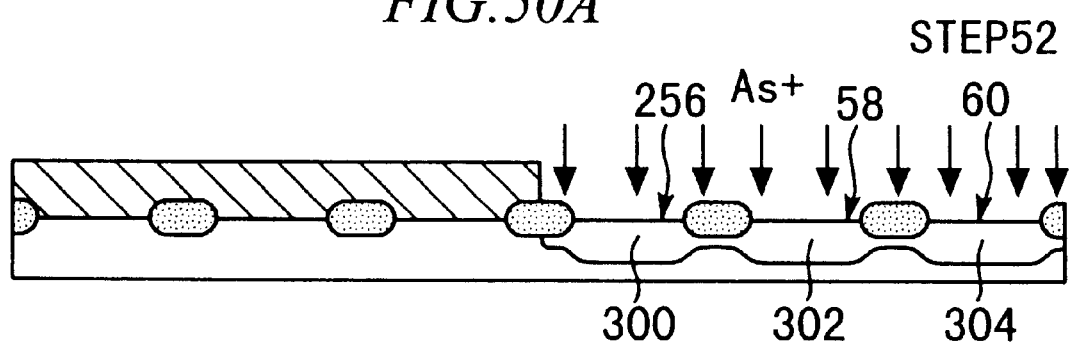

FIGS. 50A and 50B are cross-sectional views for describing formation of N-type islands 300, 302, and 304 in the PMOS regions 256, 58, and 60. As shown in FIGS. 50A and 50B, the N-type islands 300, 302, and 304 are formed through the foregoing processing in steps 50 to 52 (see FIGS. 41C and 41D). Through the processing, the N-type islands 300, 302, and 304, which have identical impurity profiles, are formed within the respective PMOS regions 256, 58, and 60.

Figure 51A:
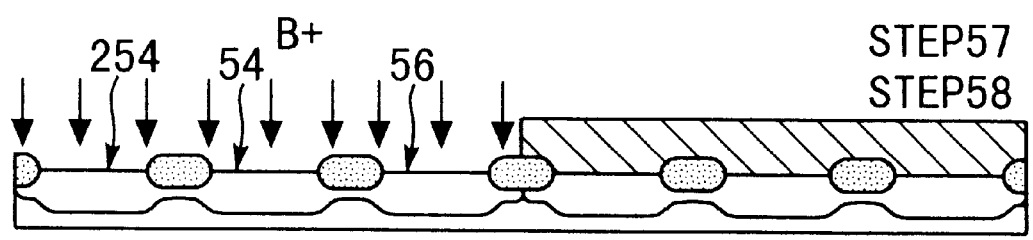
FIGS. 51A through 51C are sectional views for describing procedures of steps 57 through 60 for manufacturing the semiconductor device shown in FIG. 48.
Figure 51B:
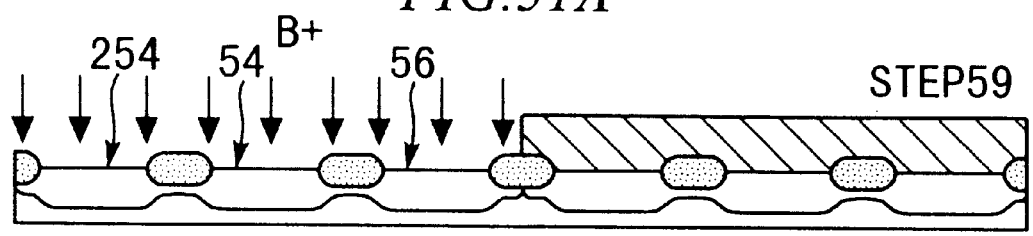
Figure 51C:
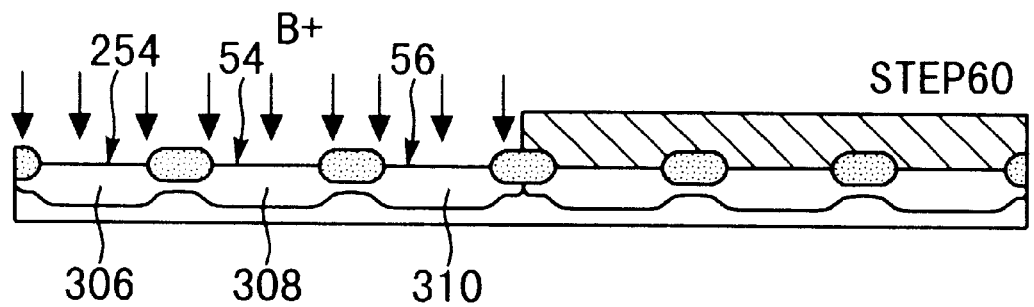

FIGS. 51A to 51C are cross-sectional views for describing formation of P-type islands 306, 308, and 310 in the NMOS regions 254, 54, and 56. As shown in FIGS. 51A to 51C, the P-type islands 306, 308, and 310 are formed through the processing in steps 57 to 60 (see FIGS. 42D to 42F). Through the processing, the P-type islands 306, 308, and 310, which have identical impurity profiles, are formed within the respective NMOS regions 254, 54, and 56.

Figure 52:
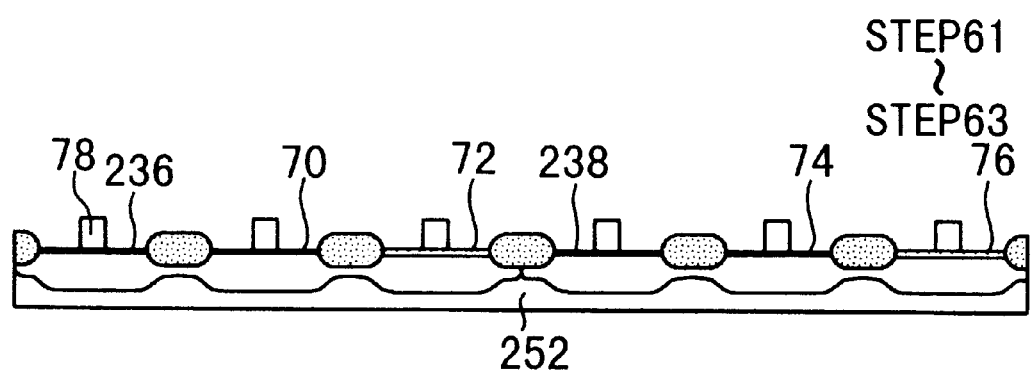
FIG. 52 is a sectional view for describing procedures of step 61 through 63 for manufacturing the semiconductor device shown in FIG. 48.

FIG. 52 is a cross-sectional view for describing formation of gate structures on the substrate 252. As shown in FIG. 52, the manufacturing method according to the sixth embodiment enables formation of the gate structures through the processing in steps 61 through 63, as in the case of the fifth embodiment (see FIG. 43).

FIGS. 53A to 53D are cross-sectional views for describing formation of LDD regions in the P-type islands 306, 308, and 310 within the NMOS regions 254, 54, and 56.

Figure 53A:
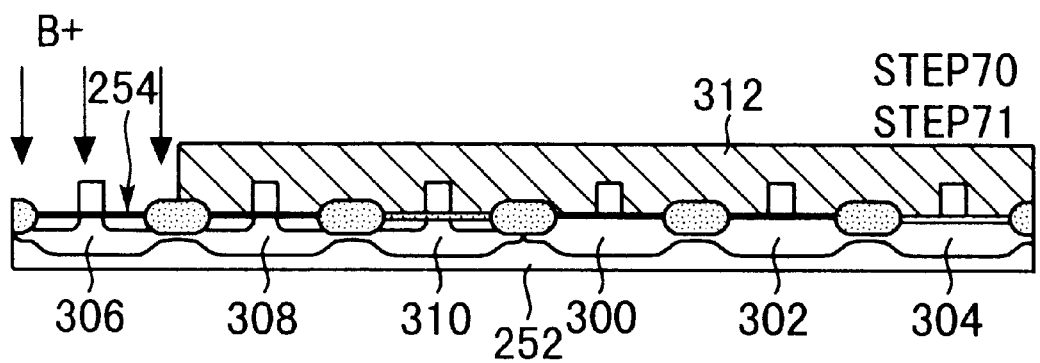
FIGS. 53A through 53D are sectional views for describing procedures of steps 70 through 75 for manufacturing the semiconductor device shown in FIG. 48.

As shown in FIG. 53A, during the process of forming an LDD region in the NMOS region, a resist pattern 312 is formed on the substrate 252 by means of photolithography in such a way that an opening of the resist pattern 312 is situated on the low voltage NMOS region 254 (step 70).

While the resist pattern 312 is used as a mask, "B" ions are implanted into the low voltage NMOS region 254 at an angle of 45° relative to an imaginary line parpendicular to the substrate 252 at an energy of 14 keV and a dose of $2 \times 10^{13}$ ions/cm$^2$ (step 71).

Figure 53B:
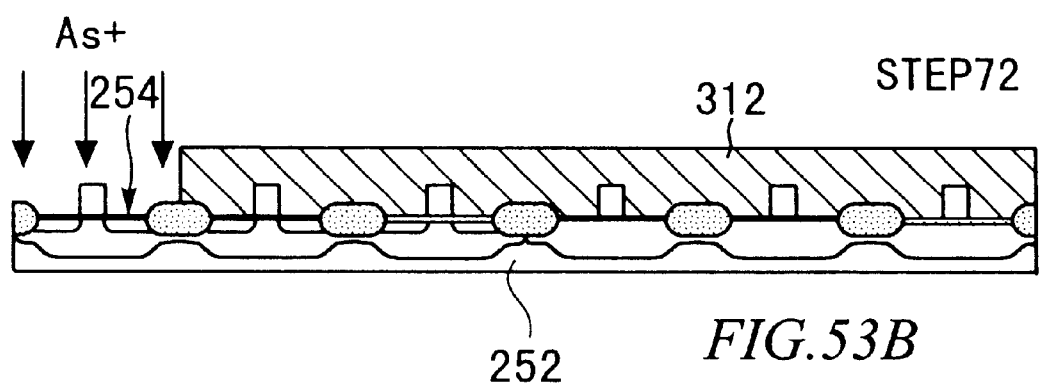

Subsequently, as shown in FIG. 53B, "As" ions are implanted into the low voltage NMOS region 54 at an energy of 10 keV and a dose of $3 \times 10^{14}$ ions/cm$^2$ (step 72).

Figure 53C:
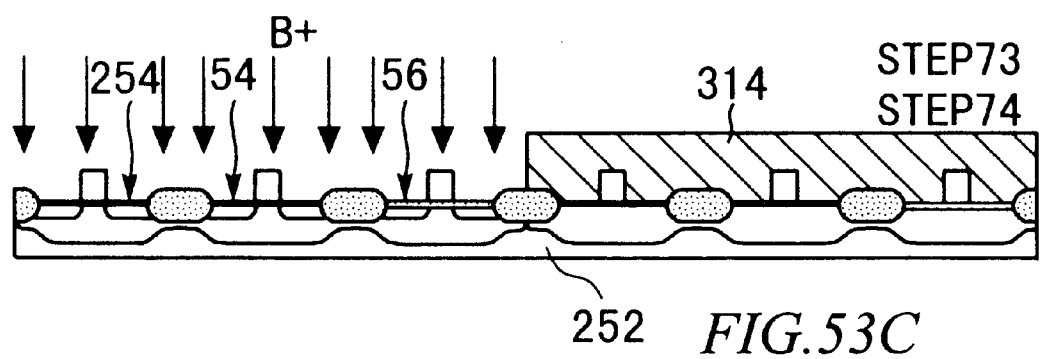

As shown in FIG. 53C, during the process of forming an LDD region in the NMOS region, a resist pattern 314 is formed on the substrate 252 in such a way that an opening of the resist pattern 314 is situated on the NMOS regions 254, 54, and 56 (step 73).

While the resist pattern 314 is used as a mask, "B" ions are implanted into all the NMOS regions 254, 54, and 56 at an angle of 45° relative to an imaginary line perpendicular to the substrate 252 at an energy of 14 keV and a dose of $3 \times 10^{3}$ ions/cm$^2$ (step 74).

Figure 53D:
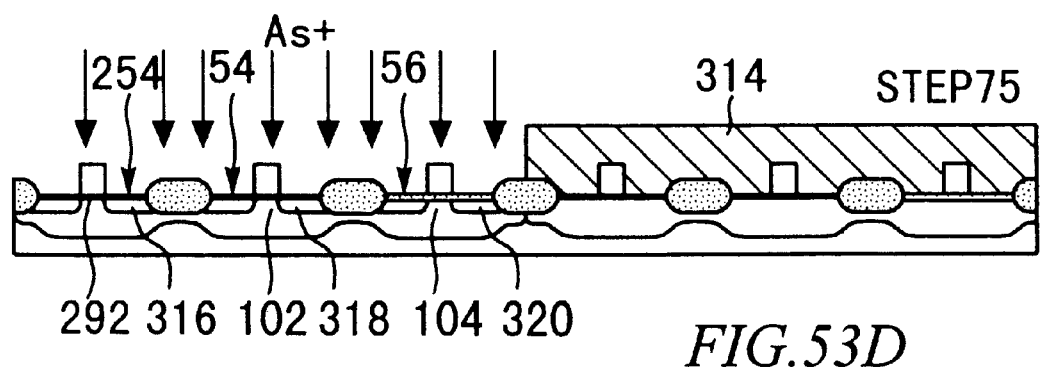

Subsequently, as shown in FIG. 53D, As ions are implanted into all the NMOS regions 254, 54, and 56 at an energy of 10 keV and a dose of $5 \times 10^{4}$ ions/cm$^2$ (step 75).

Through the foregoing processing, the channel regions 292, 102, and 104 having an identical impurity profile are formed within the respective NMOS regions 254, 54, and 56. As a result of the foregoing processing, an LDD region 316 formed across the channel region 292 is imparted with an impurity profile differing from that of LDD regions 318 and 320 respectively formed across the channel regions 102 and 104.

As mentioned above, the sixth embodiment implants impurities into the LDD region 316 of the low voltage NMOS region 254 under conditions differing from those under which impurities are implanted into the LDD regions 318 and 320 of the NMOS regions 54 and 56. The sixth embodiment, therefore, enable to impart desired impurity profiles to the LDD region 316 of the low voltage NMOS region 254 and other LDD regions 318 and 320 independently each other. Under the foregoing conditions, the PN junction is formed to a depth of 1 $\mu$m or less in all of the LDD regions 316, 318, and 320.

FIGS. 54A to 54D are cross-sectional views for describing formation of LDD regions in the N-type islands 300, 302, and 304 in the PMOS regions 256, 58, and 60.

Figure 54A:
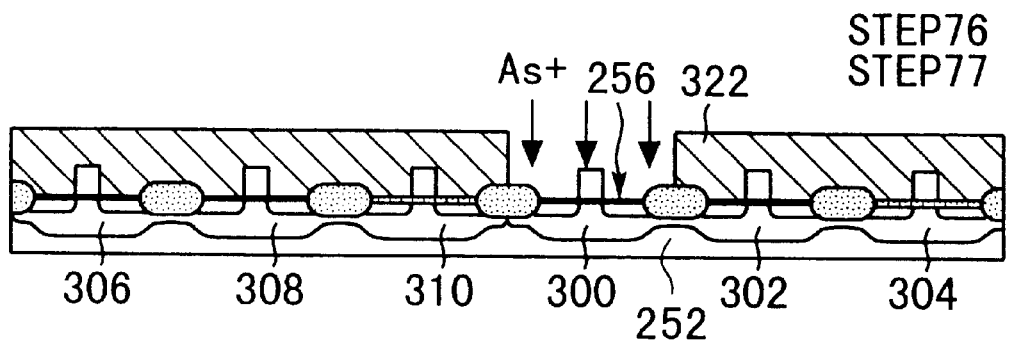
FIGS. 54A through 54D are sectional views for describing procedures of steps 76 through 81 for manufacturing the semiconductor device shown in FIG. 48.

As shown in FIG. 54A, during the process of forming LDD regions in the PMOS regions, a resist pattern 322 is formed on the substrate 252 by means of photolithography in such a way that an opening of the resist pattern 322 is situated on the low-voltage PMOS region 256 (step 76).

While the resist pattern 322 is used as a mask, "B" ions are implanted into all the NMOS regions 254, 54, and 56 at an angle of 45° relative to an imaginary line perpendicular to the substrate 252 at an energy of 100 keV and a dose of $2 \times 10^{13}$ ions/cm$^2$ (step 77).

Figure 54B:
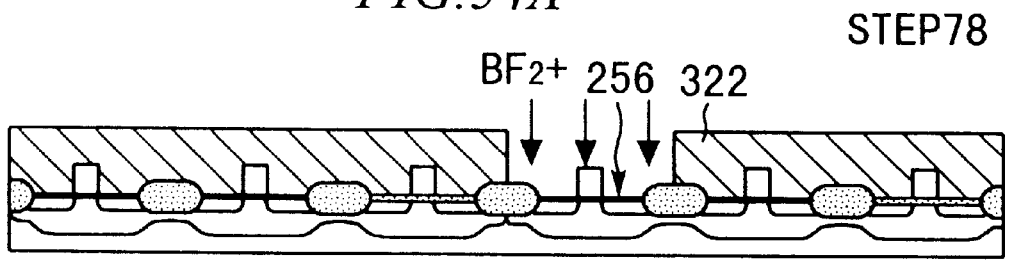

Subsequently, as shown in FIG. 54B, "BF$_2$" ions are implanted into the PMOS region 256 at an energy of 10 keV and a dose of $2 \times 10^{14}$ ions/cm$^2$ (step 78).

Figure 54C:
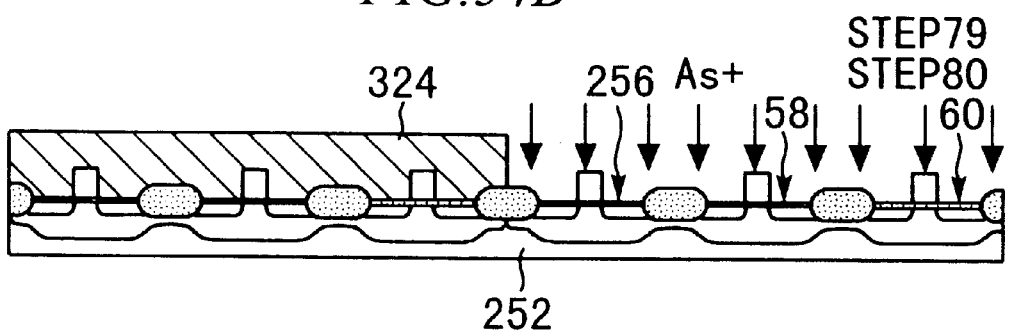

As shown in FIG. 54C, during the process of forming an LDD region in the PMOS region, a resist pattern 324 is formed on the substrate 252 by means of photolithography in such a way that an opening of the resist pattern 324 is situated on the PMOS regions 256, 58, and 60 (step 79).

While the resist pattern 324 is used as a mask, "As" ions are implanted into all the PMOS regions 256, 58, and 60 at an angle of 45° relative to an imaginary line perpendicular to the substrate 252 at an energy of 100 keV and a dose of $3 \times 10^{13}$ ions/cm$^2$ (step 80).

Figure 54D:
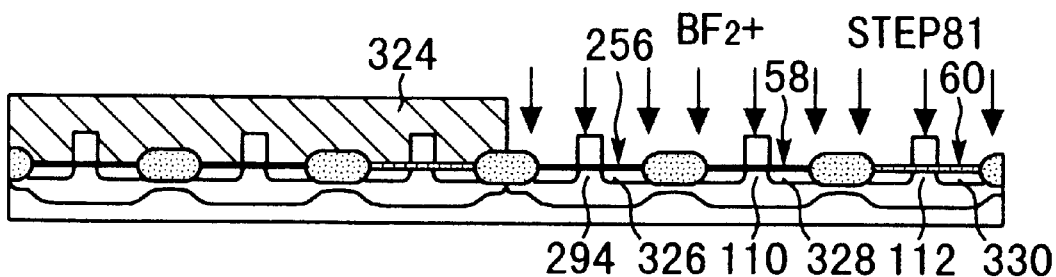

Subsequently, as shown in FIG. 54D, "BF$_2$" ions are implanted into the PMOS regions 256, 58, and 60 at an energy of 10 keV and a dose of $4 \times 10^{14}$ ions/cm$^2$ (step 81).

Through the foregoing processing, the channel region 294, which has an impurity profile identical to that of the N-type island 300, is formed below the gate electrode 78 of the PMOS region 256; the channel region 110, which has an impurity profile identical to that of the N-type island 302, is formed below the gate electrode 78 of the PMOS region 58; and the channel region 112, which has an impurity profile identical to that of the N-type island 304, is formed below the gate electrode 78 of the PMOS region 60. As a result of the foregoing processing, an LDD region 326 formed across the channel region 294 is imparted with an impurity profile differing from that of LDD regions 328 and 330 respectively formed across the channel regions 110 and 112.

As mentioned above, impurities can be implanted into the LDD region 326 of the low voltage PMOS region 256 under conditions differing from those under which impurities are implanted into the LDD regions 328 and 330 of the PMOS regions 58 and 60. The sixth embodiment, therefore, enable to impart desired impurity profiles to the LDD region 326 of the low voltage PMOS region 256 and other LDD regions 328 and 330 independently each other. Under the foregoing conditions, the PN junction is formed to a depth of 1 μm or less in all of the LDD regions 326, 328, and 330.

Figure 55A:
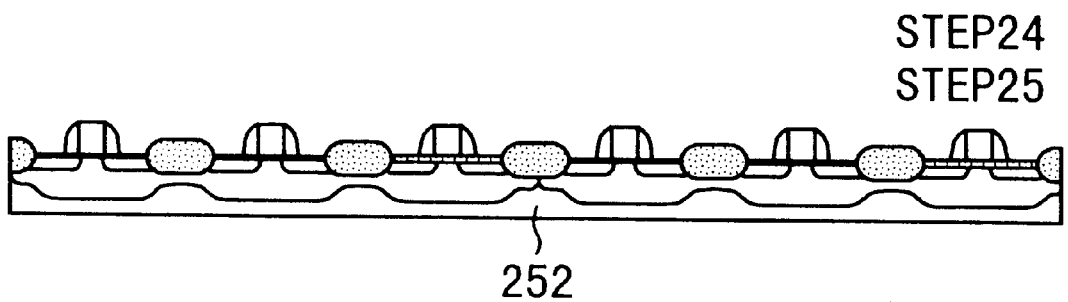
FIGS. 55A and 55C are sectional views for describing procedures of steps 24 through 29 for manufacturing the semiconductor device shown in FIG. 48.
Figure 55B:
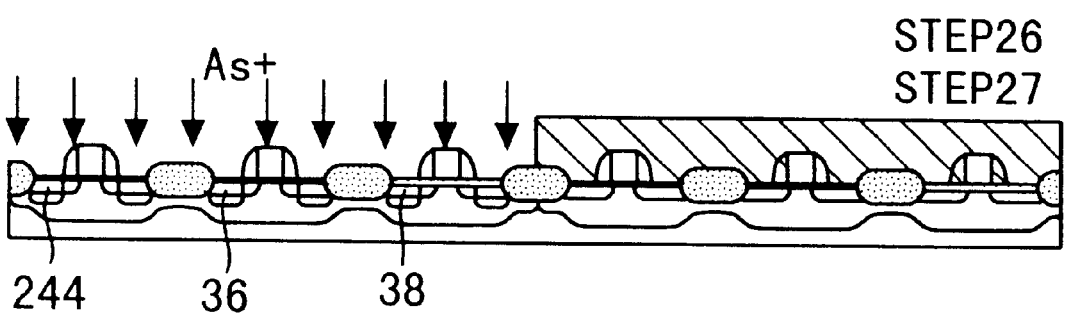
Figure 55C:
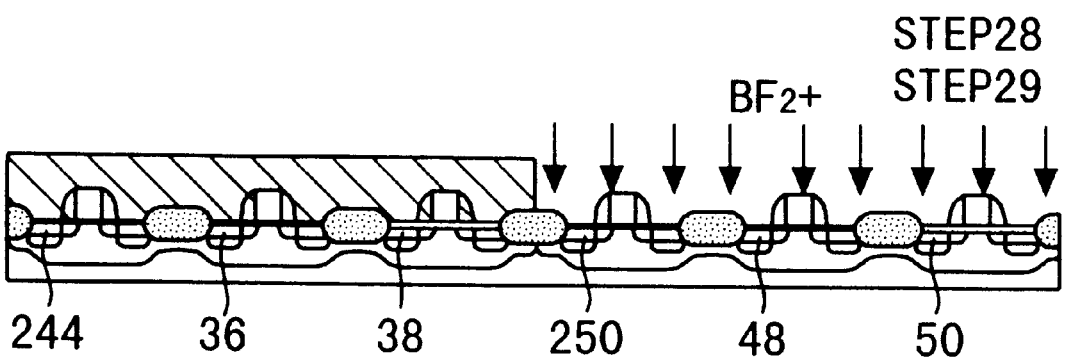
Figure 56A:
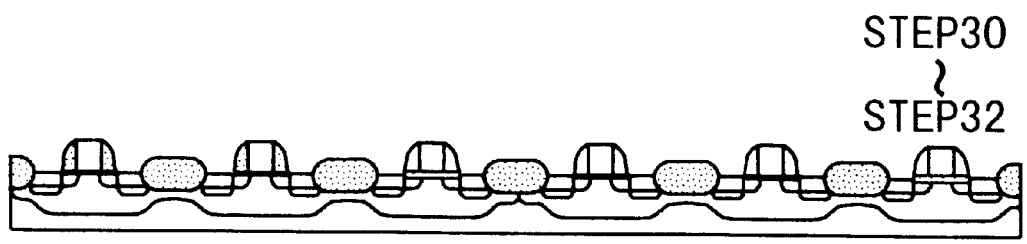
FIGS. 56A through 56D are sectional views for describing procedures of steps 30 through 35 for manufacturing the semiconductor device shown in FIG. 48.
Figure 56B:
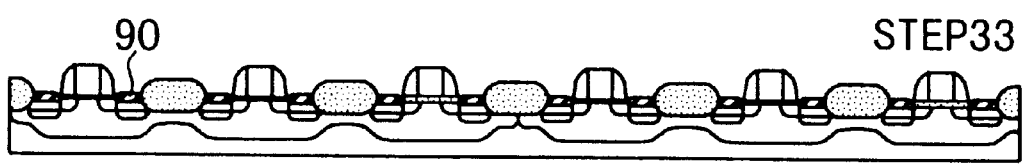
Figure 56C:
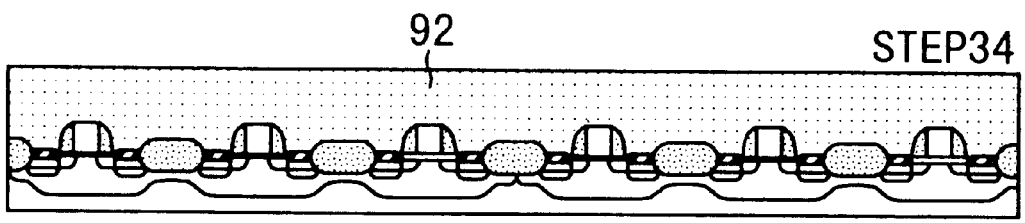
Figure 56D:
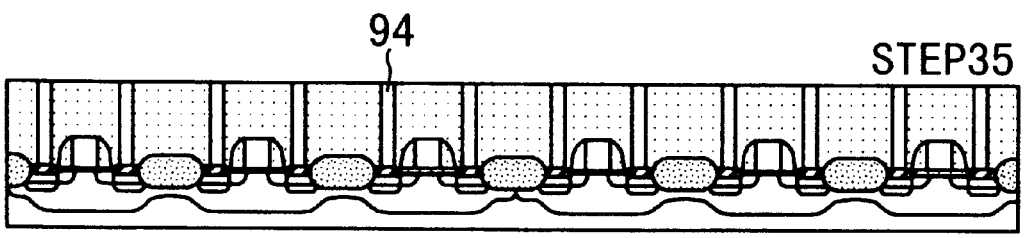
Figure 57:
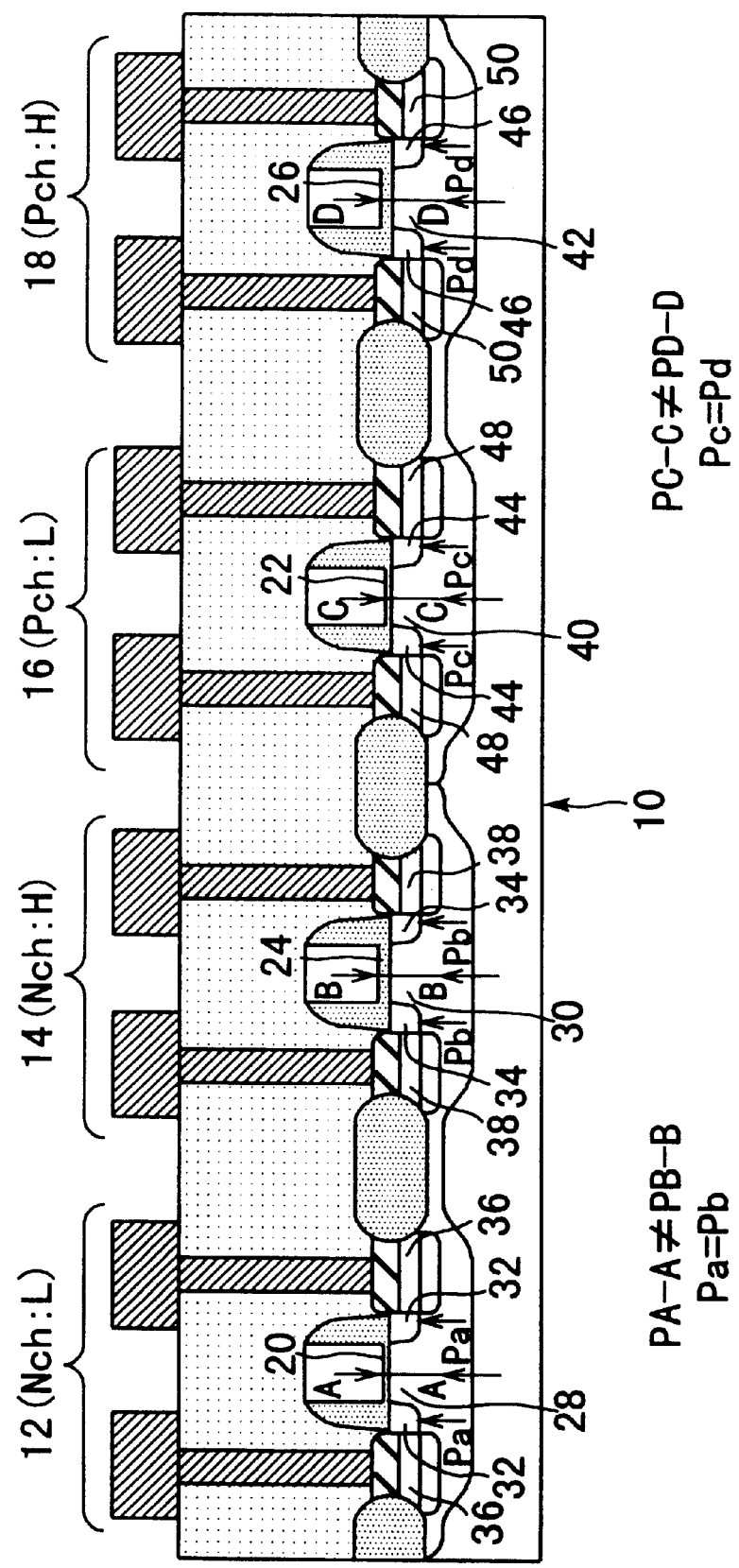
FIG. 57 is a sectional view of a former semiconductor device.
Figure 58:
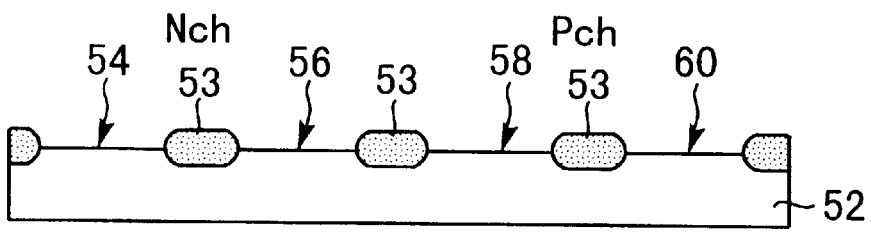
FIGS. 58 is a sectional view showing a substrate of the former semiconductor device shown in FIG. 57.
Figure 59A:
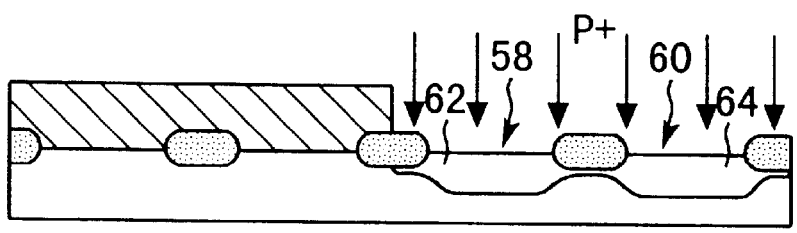
FIGS. 59A through 59D are sectional views for describing formation of N-type islands of the former semiconductor device shown in FIG. 57.
Figure 59B:
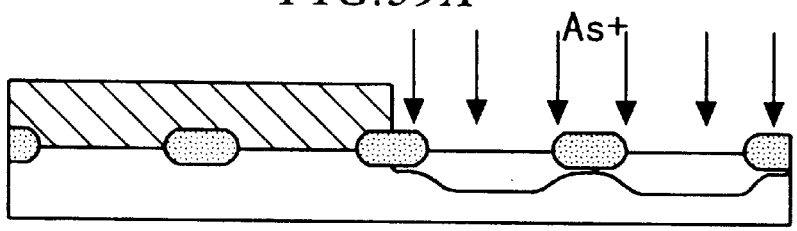
Figure 59C:
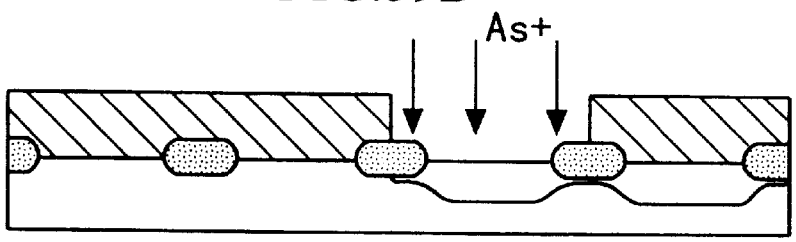
Figure 59D:
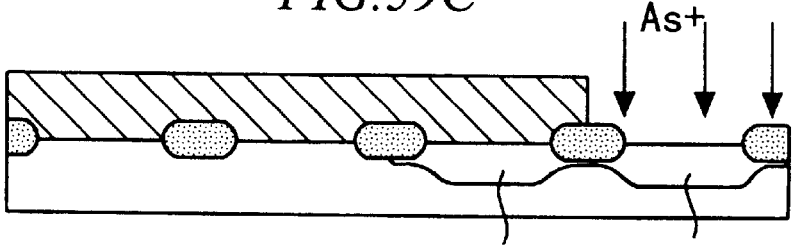
Figure 60A:
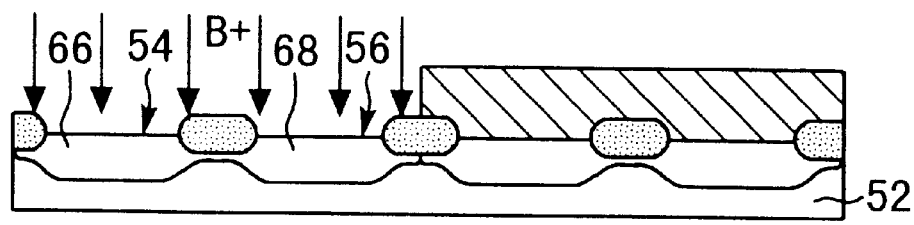
FIGS. 60A through 60D are sectional views for describing formation of P-type islands of the former semiconductor device shown in FIG. 57.
Figure 60B:
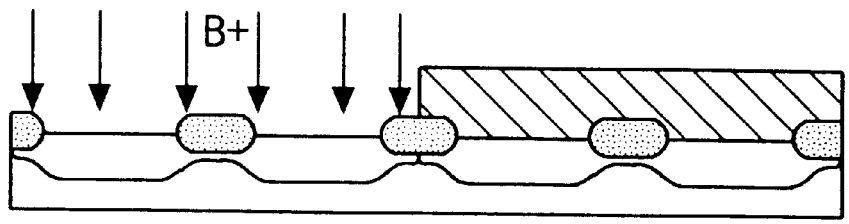
Figure 60C:
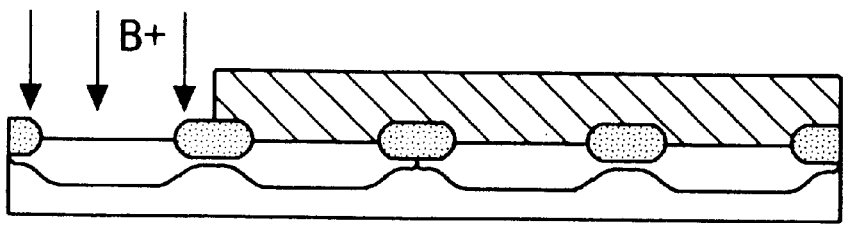
Figure 60D:
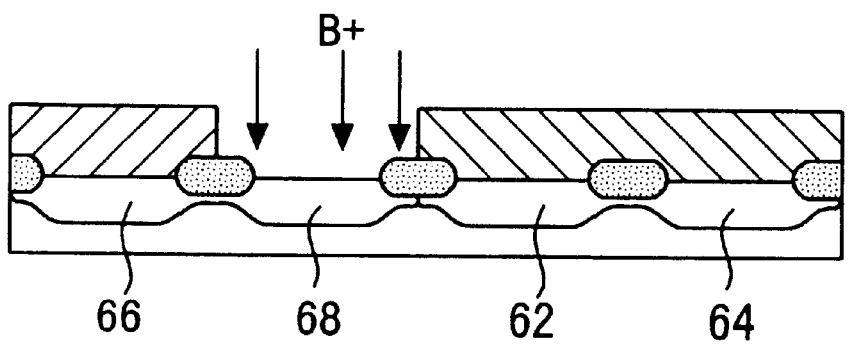
Figure 61A:
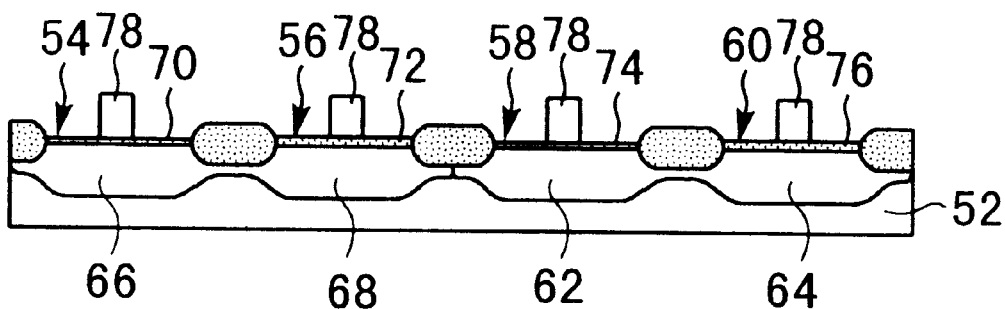
FIGS. 61A through 61C are sectional views for describing formation of LDDEX regions on both the P-type islands and the N-type islands of the former semiconductor device shown in FIG. 57.
Figure 61B:
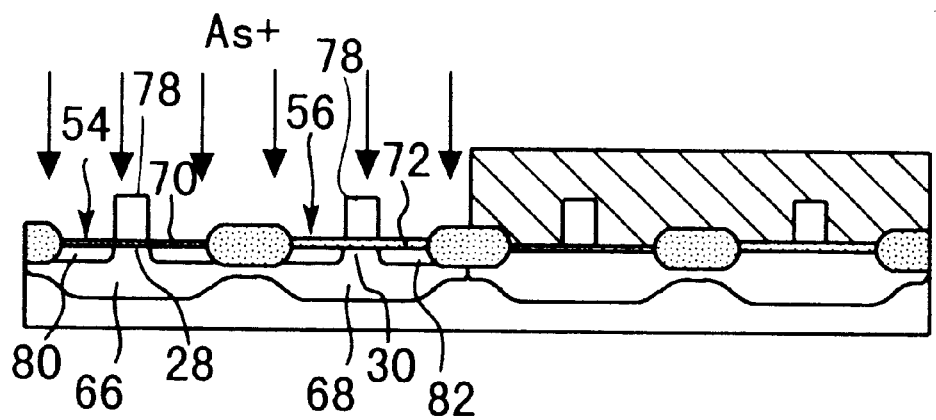
Figure 61C:
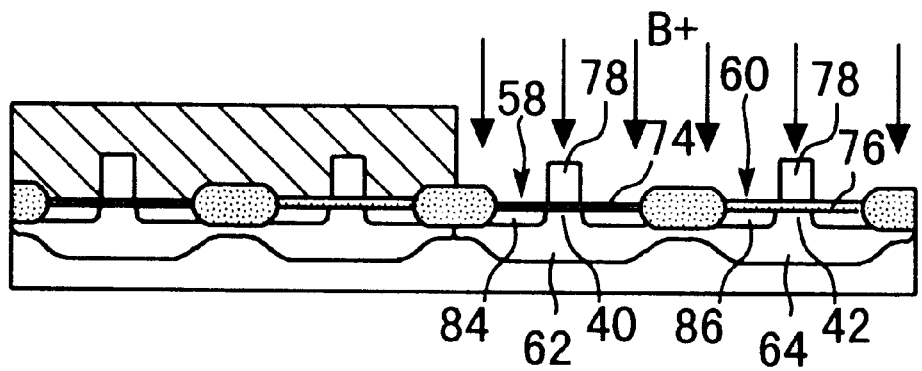
Figure 62A:
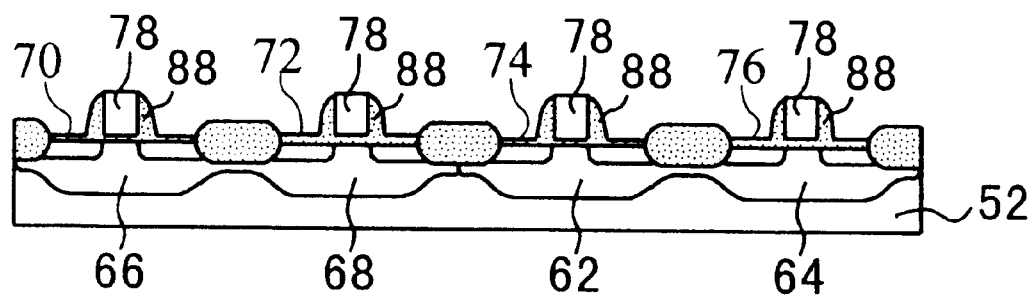
FIGS. 62A through 62C are sectional views for describing formation of LDD regions and source/drain regions of the former semiconductor device shown in FIG. 57.
Figure 62B:
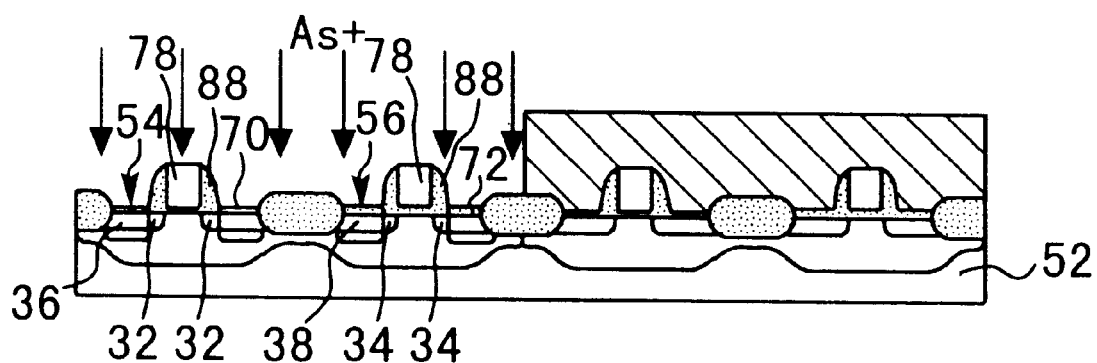
Figure 62C:
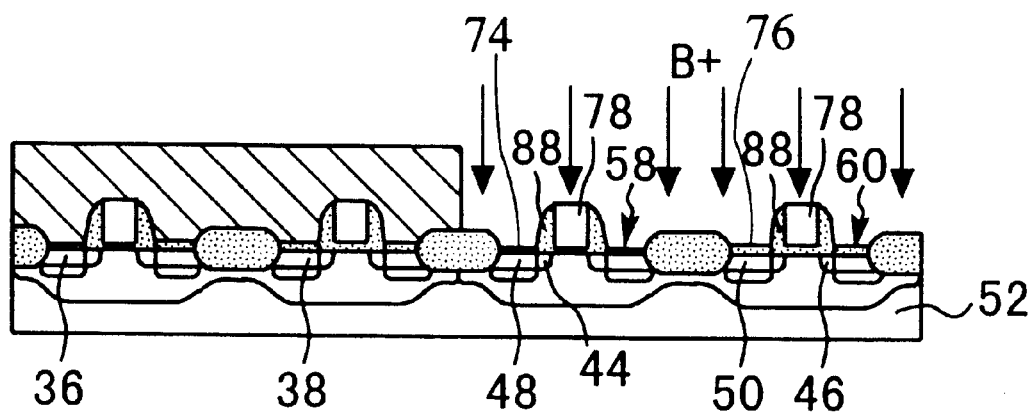
Figure 63A:
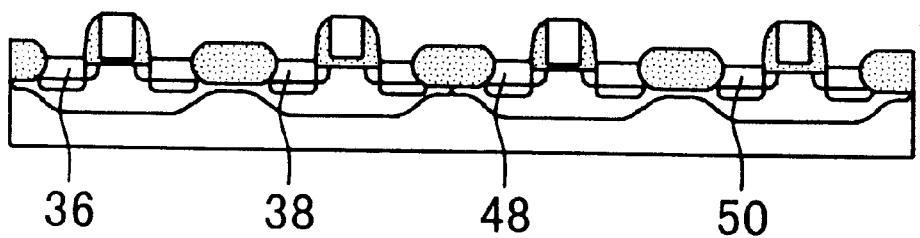
FIGS. 63A through 63D are sectional views for describing the details of another processing operation performed during the course of manufacturing the former semiconductor device shown in FIG. 57.
Figure 63B:
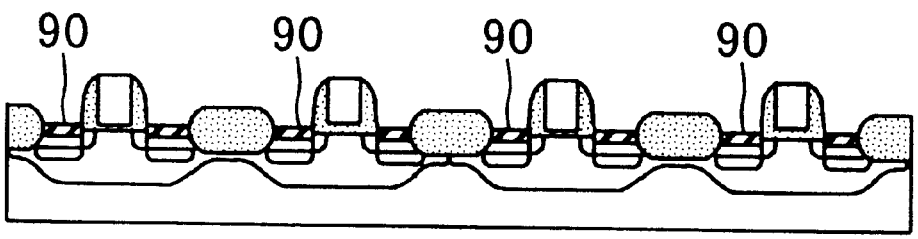
Figure 63C:
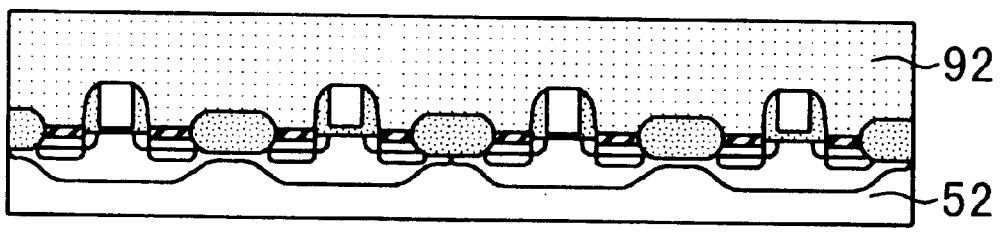
Figure 63D:
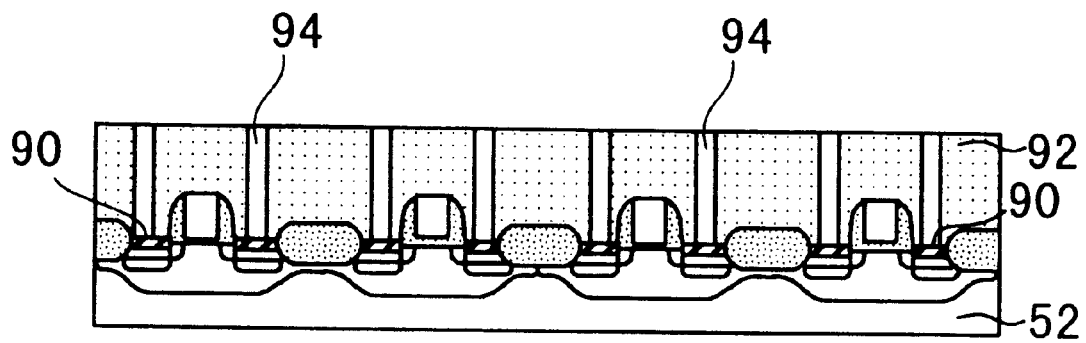

FIGS. 55A to 55C and FIGS. 56A to 56D are cross-sectional views for describing the process of forming source/drain regions 244, 250, 36, 38, 48, and 50, a salicide film 90, an oxide film 92, and contact holes 94 on the substrate 252 of the semiconductor device 290. As shown in FIGS. 55A to 55C, these constituent elements are formed through processing in steps 24 through 35 (see FIGS. 8A to 8C and FIGS. 9A to 9D), as in the case of the first embodiment.

As mentioned above, the manufacturing method according to the sixth embodiment enables independent control of the impurity profile of the LDDEX regions 296 and 298 of the low voltage MOS 232 and 234 and the impurity profile of the LDDEX regions 106 and 114 of the low voltage MOS transistors 12 and 16. The threshold voltage of the MOS transistor changes according to the impurity profile of the LDDEX region. Therefore, with the manufacturing method according to the sixth embodiment, the low voltage MOS transistors 232 and 234 can be imparted with the threshold voltage which is different from that imparted to the low voltage MOS transistors 12 and 16, as well as a characteristic suitable for retarding hot carriers can be imparted to the MOS transistors.

According to the sixth embodiment, impurities are implanted into the LDD regions 318 and 328 of the low voltage MOS transistor 12 and 16 under identical conditions as those under which impurities are implanted into the LDD regions 320 and 330 of the high voltage MOS transistors 14 and 18. However, the present invention is not limited to such an embodiment. Impurities may be implanted into the LDD regions of MOS transistors under differing conditions. With such settings, low voltage MOS transistors having different threshold voltages can be formed within the semiconductor device 290. Further, as in the case of the first through fourth embodiments, hot carriers can be effectively prevented from arising in both the high voltage MOS transistors and the low voltage MOS transistors.

The major benefits of the present invention described above are summarized as follows:

According to a first aspect of the present invention, an impurity profile imparted to the end of a source/drain region of a low voltage MOS transistor differs from that imparted to the end of a source/drain region of a high voltage MOS transistor. More specifically, in the present invention, the impurity profile formed at the end of the source/drain region of the low voltage MOS transistor is set so as to be optimum for the low voltage MOS transistor. Further, the impurity profile formed at the end of the source/drain region of the high voltage MOS transistor is set so as to be optimum for the high voltage MOS transistor. Therefore, in the semiconductor device according to the present invention, two types of transistors having different withstanding voltages can be operated at optimum threshold voltages. Further, according to the present invention, the PN junction located at the end of the source/drain region of the low voltage MOS transistor and the PN junction located at the end of the source/drain region of the high voltage MOS transistor are formed toadepth of 1 μm or less. Consequently, according to the present invention, miniaturization of a semiconductor device can be enhanced further while a stable operating characteristic of the semiconductor device is maintained.

According to a second aspect of the present invention, an identical impurity profile is imparted to the channel region of the low voltage MOS transistor and the channel region of the high voltage MOS transistor. As a result, the semiconductor device according to the present invention can yield high productivity.

According to a third aspect of the present invention, an impurity profile is imparted to the channel region of the low voltage MOS transistor, and a different impurity profile is imparted to the channel region of the high voltage MOS transistor. As a result, the semiconductor device according to the present invention ensures a high degree of freedom with regard to the setting of characteristic of the low voltage MOS transistor, as well as with regard to the setting of characteristic of the high voltage MOS transistor.

According to a fourth aspect of the present invention, two MOS transistors having identical withstanding voltages include the channel regions having different impurity profiles and thereby have different threshold voltages. Hence, the present invention enables circuits operating at different threshold voltages to be formed within a single semiconductor device.

According to a fifth aspect of the present invention, two MOS transistors, which have identical withstanding voltages, include source/drain regions having different impurity profiles and hence have different threshold voltages. Therefore, the present invention enables formation, in a single semiconductor device, of circuits operating at different threshold voltages.

According to a sixth aspect of the present invention, impurities can be implanted into the end of the source/drain region of the low voltage MOS transistor and into the end of the source/drain region of the high withstand MOS transistor under different conditions respectively. Consequently, according to the present invention, a relevant threshold voltage and a characteristic suitable for retarding hot carriers can be readily imparted to the low and high withstanding voltage MOS transistors. Further, the present invention forms the PN junctions of the source/drain regions to a depth of 1 μm or less with regard to both the low and high withstanding voltage MOS transistors. Therefore, the present invention enables manufacture of a semiconductor device which is sufficiently miniaturized and has superior operation stability.

According to a seventh aspect of the present invention, impurities are implanted into the channel region of the low voltage MOS transistor, as well as into the channel region of the high voltage MOS transistor, under identical conditions. Thus, the present invention enables high-yield manufacture of a semiconductor device.

According to an eighth aspect of the present invention, impurities are implanted into the channel region of the low voltage MOS transistor and the channel region of the high voltage MOS transistor under differing conditions. Therefore, the present invention enables independent control of characteristic of the low voltage MOS transistor and the high voltage MOS transistor with a high degree of freedom.

Further, the present invention is not limited to these embodiments, but variations and modifications may be made without departing from the scope of the present invention.

The entire disclosure of Japanese Patent Application No. Hei 10-239189 filed on Aug. 25, 1998 including specification, claims, drawings and summary are incorporated herein by reference in its entirety.

What is claimed is:

1. A semiconductor device containing in a single chip a low withstanding voltage MOS transistor and a high withstanding voltage MOS transistor, wherein:

the low withstanding voltage MOS transistor comprising
a first gate oxide film having a first thickness,
a first channel region formed below the first gate oxide film, and
a first source/drain region formed across the first channel region, the first source/drain region including lightly doped drain extensions;

the high withstanding voltage MOS transistor comprising
a second gate oxide film having a second thickness which is greater than the first thickness,
a second channel region formed below the second gate oxide film, and
a second source/drain region formed across the second channel region, the second source/drain region including lightly doped drain extensions;

the first channel region side end of the first source/drain region has an impurity profile differing from that of the second channel region side end of the second source/drain region;

the first channel region side end of the first source/drain region has a junction depth of 1 $\mu$m or less; and the second channel region side end of the second source/drain region have a junction end of 1 $\mu$m or less, wherein the lightly doped drain extensions of the first source/drain region include the first channel region side end of the first source/drain region, and the lightly doped drain extensions of the second source/drain region include the second channel region side end of the second source/drain region.

2. The semiconductor device according to claim 1, wherein the first channel region and the second channel region have identical impurity profiles.

3. The semiconductor device according to claim 1, wherein the first channel region has an impurity profile differing from that of the second channel region.

4. The semiconductor device according to claim 1, further comprising a second low withstanding voltage MOS transistors herein:

the low withstanding voltage MOS transistor is brought into operation while being given a first threshold voltage;

the second withstanding voltage MOS transistor is brought into operation while being given a second threshold voltage which differs from the first threshold voltage;

the first channel region has an impurity profile for achieving the first threshold voltage;

the second low withstanding voltage MOS transistor includes a third channel region having an impurity profile for achieving the second threshold voltage; and the second channel region of the high withstanding voltage MOS transistor has an impurity profile which is identical with that of either the first channel region or the third channel region.

5. The semiconductor device according to claim 1, further comprising a second low withstanding voltage MOS transistors wherein:

the low withstanding voltage MOS transistor is brought into operation while being given a first threshold voltage;

the second withstanding voltage MOS transistor is brought into operation while being given a second threshold voltage which differs from the first threshold voltage;

the second withstanding voltage MOS transistor includes a third channel region and a third source/drain region;

the first, second, and third channel regions have an identical impurity profile;

the first channel region side end of the first source/drain region has an impurity profile for achieving the first threshold voltage;

the third channel region side end of the third source/drain region has an impurity profile for achieving the second threshold voltage; and the second channel region side end of the second source/drain region has an impurity profile which is identical with that of the third channel region side end of the third source/drain region.

* * * * *